US012791115B2

(12) United States Patent
Chang et al.

(10) Patent No.: US 12,791,115 B2
(45) Date of Patent: Nov. 10, 2026

(54) PIEZOELECTRIC VALVE AND METHODS OF FORMATION

(71) Applicant: Taiwan Semiconductor Manufacturing Company, Ltd., Hsinchu (TW)

(72) Inventors: Yi-Hsien Chang, Shetou Township (TW); Fu-Chun Huang, Zhubei City (TW); Po-Chen Yeh, New Taipei City (TW); Chao-Hung Chu, Keelung City (TW); Ching-Hui Lin, Taichung City (TW); Chun-Ren Cheng, Hsin-Chu City (TW); Shih-Fen Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 300 days.

(21) Appl. No.: 18/453,463

(22) Filed: Aug. 22, 2023

(65) Prior Publication Data

US 2024/0401714 A1 Dec. 5, 2024

Related U.S. Application Data

(60) Provisional application No. 63/505,213, filed on May 31, 2023.

(51) Int. Cl.

| | |
|---|---|
| ***F16K 31/00*** | (2006.01) |
| ***H10N 30/00*** | (2023.01) |
| ***H10N 30/03*** | (2023.01) |
| ***H10N 30/06*** | (2023.01) |
| ***H10N 30/078*** | (2023.01) |
| ***H10N 30/20*** | (2023.01) |

(52) U.S. Cl.
CPC ........... *F16K 31/005* (2013.01); *H10N 30/03* (2023.02); *H10N 30/06* (2023.02); *H10N 30/078* (2023.02); *H10N 30/204* (2023.02); *H10N 30/704* (2024.05)

(58) Field of Classification Search
CPC ...... F16K 31/005; H10N 30/03; H10N 30/06; H10N 30/078; H10N 30/204; H10N 30/704
See application file for complete search history.

(56) References Cited

U.S. PATENT DOCUMENTS 4,857,887 A * 8/1989 Iten .................... H03K 17/9643 200/512
5,539,965 A * 7/1996 Safari .................. H10N 30/092 29/25.35
5,656,882 A * 8/1997 Lazarus ................. H10N 30/88 310/330
5,779,218 A * 7/1998 Kowanz .................. F15B 5/003 251/129.06

(Continued)

*Primary Examiner* — Craig M Schneider
*Assistant Examiner* — Christopher D Ballman
(74) *Attorney, Agent, or Firm* — Harrity & Harrity, LLP

(57) ABSTRACT

A piezoelectric valve is formed using semiconductor processing techniques such that the piezoelectric valve is biased in a normally closed configuration. Actuation of the piezoelectric valve is achieved through the use of a piezoelectric-based actuation layer of the piezoelectric valve. The normally closed configuration of the piezoelectric valve enables the piezoelectric valve to operate as a normally closed valve with reduced power consumption.

16 Claims, 43 Drawing Sheets

(56) References Cited

U.S. PATENT DOCUMENTS

| | | | | | |
|---|---|---|---|---|---|
| 5,860,202 | A * | 1/1999 | Okawa | H10N 30/053 | 451/36 |
| 6,088,894 | A * | 7/2000 | Oakley | B06B 1/064 | 29/25.35 |
| 6,329,741 | B1 * | 12/2001 | Vartuli | H10N 30/2042 | 310/330 |
| 6,404,107 | B1 * | 6/2002 | Lazarus | H10N 30/2044 | 310/330 |
| 6,629,341 | B2 * | 10/2003 | Wilkie | H10N 30/87 | 29/609.1 |
| 6,930,439 | B2 * | 8/2005 | Wierach | H10N 30/88 | 310/330 |
| 9,132,263 | B2 * | 9/2015 | Ko | A61M 37/0092 | |
| 9,423,044 | B2 * | 8/2016 | Im | F16K 31/006 | |
| 9,502,638 | B2 * | 11/2016 | McAlpine | H10N 30/074 | |
| 10,580,962 | B2 * | 3/2020 | Iwamoto | H03H 3/08 | |
| 2004/0164650 | A1 * | 8/2004 | Xu | B41J 2/1634 | 310/328 |
| 2004/0201324 | A1 | 10/2004 | Takeuchi et al. | | |
| 2007/0273251 | A1 | 11/2007 | Okamura et al. | | |
| 2011/0107962 | A1 | 5/2011 | Chen et al. | | |
| 2023/0013976 | A1 * | 1/2023 | Kämpfe | H10N 30/306 | |

* cited by examiner

PIEZOELECTRIC VALVE AND METHODS OF FORMATION

CROSS-REFERENCE TO RELATED APPLICATION

This Patent Application claims priority to U.S. Provisional Patent Application No. 63/505,213, filed on May 31, 2023, and entitled "PIEZOELECTRIC VALVE AND METHODS OF FORMATION." The disclosure of the prior Application is considered part of and is incorporated by reference into this Patent Application.

BACKGROUND

Integrated circuits may be fabricated on a semiconductor wafer. Semiconductor wafers can be stacked or bonded on top of each other to form what is referred to as a three-dimensional integrated circuit. Some semiconductor wafers include micro-electromechanical-system (MEMS) devices, which involve the process of forming micro-structures and nano-structures. Typically, MEMS devices are built on silicon wafers and realized in thin films of materials. MEMS applications include inertial sensor applications (e.g., motion sensors, accelerometers, gyroscopes), pressure sensors, microfluidic devices (e.g., valves, pumps), movable mirrors, and imaging devices (e.g., micromachined ultrasonic transducers), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
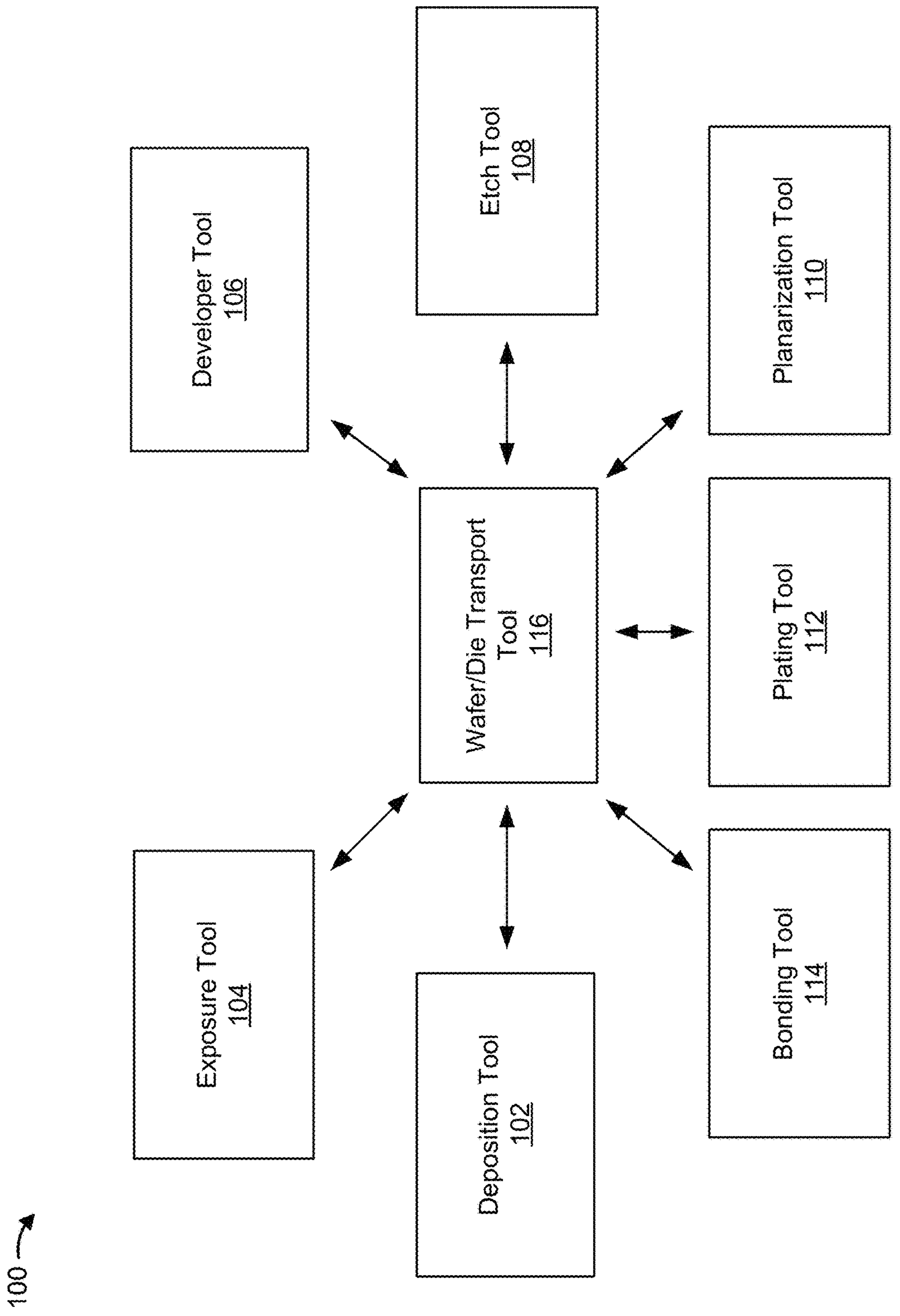
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microvalve is a type of valve that is configured to control the flow of a fluid, such as a gas or a liquid. A microvalve may be selectively operated in a closed configuration (in which fluid is prevented or restricted from flowing through the microvalve) or an open configuration (in which fluid is permitted to flow through the microvalve by selectively applying a voltage or another power input to the microvalve. In some cases, a microvalve may consume large amounts of electrical power and/or may be prone to leakage or diffusion due to the need to constantly apply a voltage or another input to the microvalve to configure the microvalve in the closed configuration. For portable and/or wearable device application, this may result in poor operating efficiency and/or additional power consumption from the microvalve, and may result in the microvalve being unsuitable for small form factor implementations such as in-ear headphones or microfluidics (e.g., lab-on-a-chip) operation.

Some implementations described herein provide example implementations of piezoelectric valves and methods of formation. A piezoelectric valve described herein is a type of micro-electro-mechanical system (MEMS) valve that can be used for microfluidic control. The piezoelectric valve may be biased in a normally closed configuration, and actuation of the piezoelectric valve may be achieved through the use of a piezoelectric-based actuation layer of the piezoelectric valve. The piezoelectric valve may be implemented in various use cases, such as a dispensing valve for precise drug delivery, a relief valve to reduce the occlusion effect in speaker-based devices (e.g., in-ear headphones), a pressure control valve, and/or another type of valve that is configured for microfluidic control, among other examples.

The piezoelectric valve may be formed using semiconductor processing techniques described herein such that the piezoelectric valve is biased in the normally closed configuration without the use of an external power source. Without the external power source applied, the piezoelectric-based actuation layer biases a valve vane of the piezoelectric valve closed. An external power source may be applied to the piezoelectric-based actuation layer to overcome the compressive film stress in the piezoelectric-based actuation layer to open the valve vane from the normally closed configuration.

In this way, the normally closed configuration of the piezoelectric valves described herein enable the piezoelectric valves to each operate as a normally closed valve with reduced power consumption (e.g., relative to a normally closed valve for which a normally closed configuration is achieved through the use of an external power source). The piezoelectric valves being biased in the normally closed configuration may reduce leakage and/or diffusion for the piezoelectric valves in that the piezoelectric-based actuation layer of the piezoelectric valves may be formed to retain a compressive film stress, which biases the piezoelectric valves closed, thereby reducing the likelihood of leakage and/or diffusion.

FIG. 1 is a diagram of an example environment 100 in which systems and/or methods described herein may be implemented. As shown in FIG. 1, the example environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, a bonding tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of deposition tools 102 and/or a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool. In some implementations, the example environment 100 includes a plurality of exposure tools 104 and/or a plurality of types of exposure tools 104.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer. In some implementations, the example environment 100 includes a plurality of developer tools 106 and/or a plurality of types of developer tools 106.

The etch tool 108 is a semiconductor processing tool that is capable of etching various types of materials of a substrate, wafer, or semiconductor device. For example, the etch tool 108 may include a wet etch tool, a dry etch tool, an ion beam etch tool and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions. In some implementations, an ion beam is used to etch the substrate. In some implementations, a wet chemical etchant is used to etch the substrate. In some implementations, the example environment 100 includes a plurality of etch tool 108 and/or a plurality of types of etch tools 108.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar. In some implementations, the planarization tool 110 includes a wafer grinding tool that is configured to perform a wafer grinding operation to mechanically grind material away from a substrate. The wafer grinding tool may include a grinding wheel that rotates and uses an abrasive on the grinding wheel to grind the material away from the substrate while the grinding wheel rotates. In some implementations, the example environment 100 includes a plurality of planarization tools 110 and/or a plurality of types of planarization tools 110.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials. In some implementations, the example environment 100 includes a plurality of plating tools 112 and/or a plurality of types of plating tools 112.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the example environment 100 includes a plurality of wafer/die transport tools 116 and/or a plurality of types of wafer/die transport tools 116.

For example, the wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of a deposition tool 102 without breaking or removing a vacuum (or an at least partial vacuum) between the processing chambers and/or between processing operations in the deposition tool 102, as described herein.

In some implementations, one or more of the semiconductor processing tools 102-114 may perform one or more semiconductor processing operations described herein. For example, one or more of the semiconductor processing tools 102-114 may perform other semiconductor processing operations described herein, such as in connection with FIGS. 4A-4F, 5A-5D, 6A-6F, 12, and/or 13A-13J, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
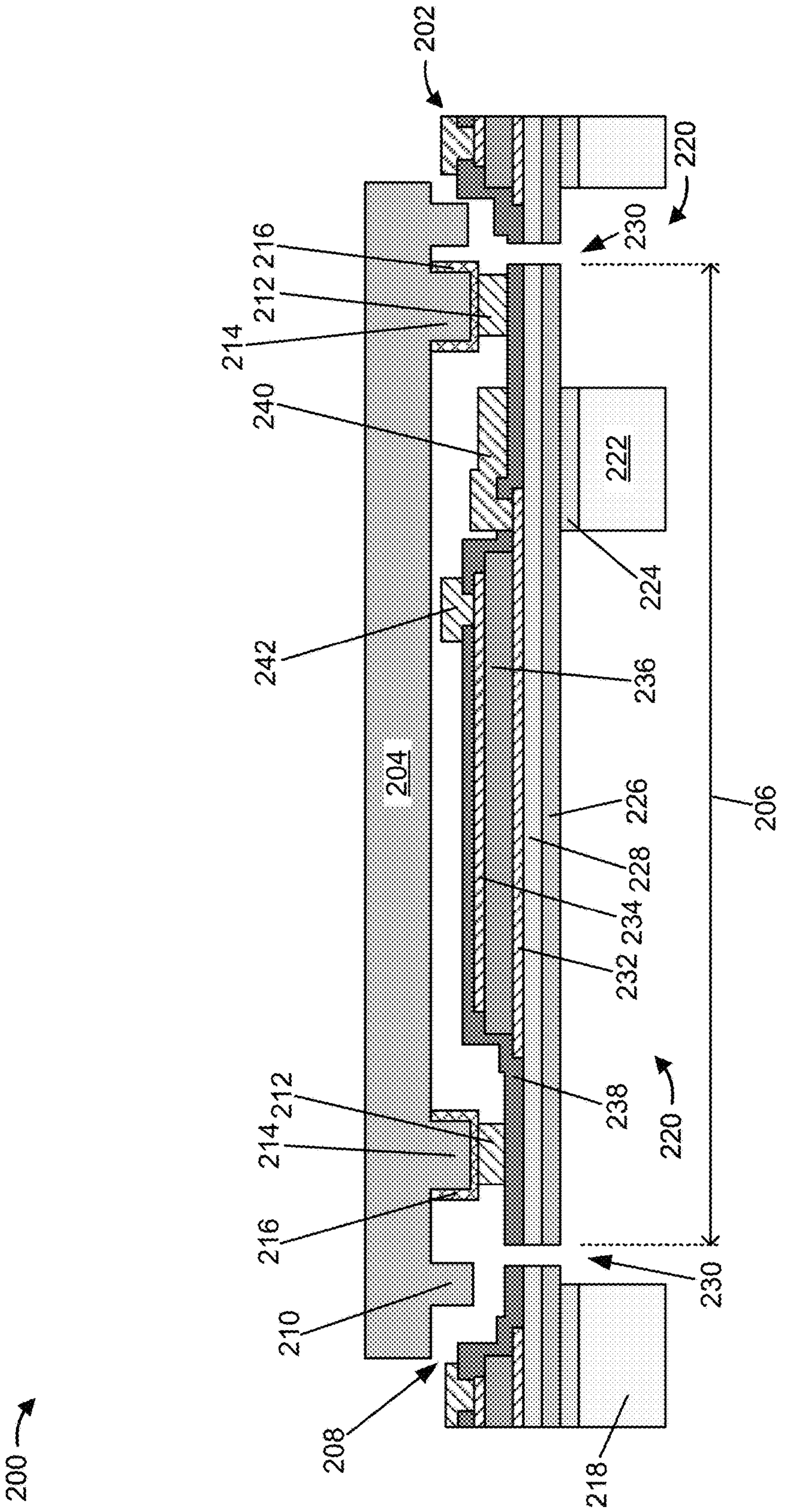
FIGS. 2A and 2B are diagrams of an example piezoelectric valve described herein.
Figure 2B:
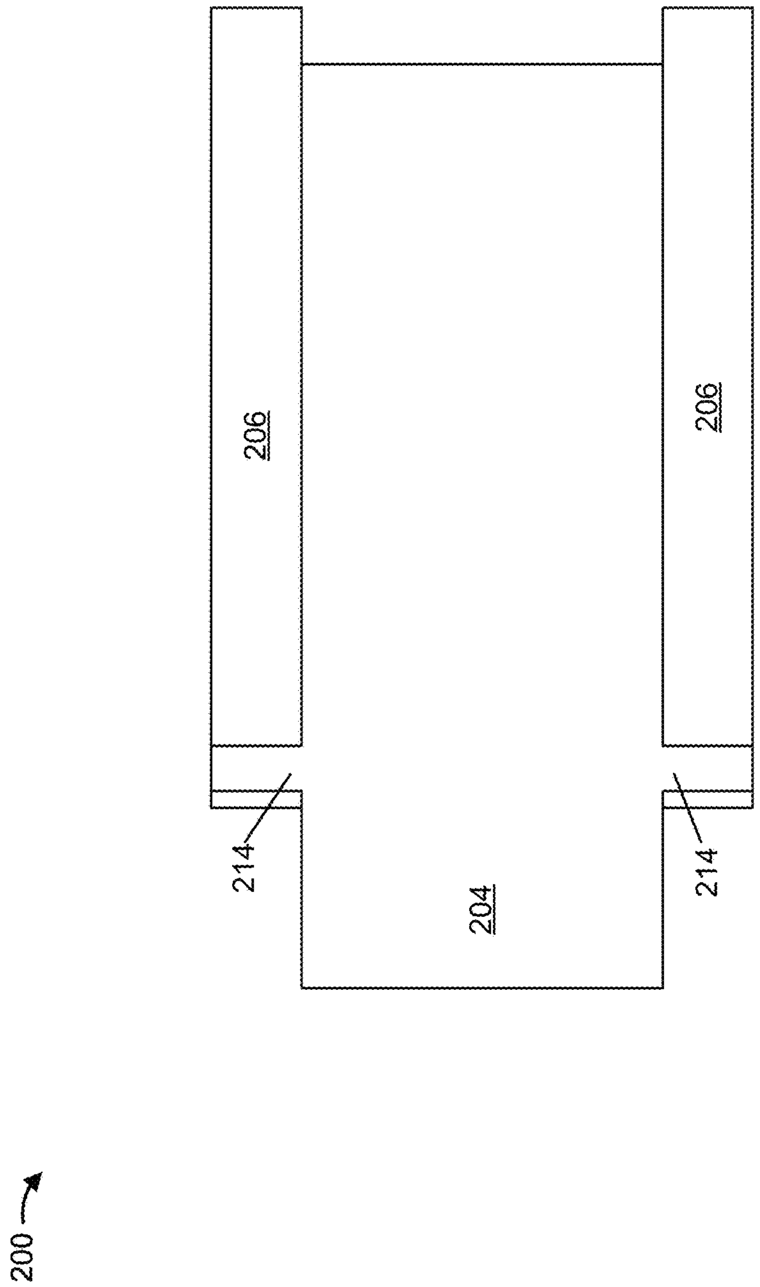

FIGS. 2A and 2B are diagrams of an example piezoelectric valve 200 described herein. The piezoelectric valve 200 may be a MEMS device that may be manufactured using semiconductor processing techniques and operations described herein. The piezoelectric valve 200 may be used as a dispensing valve for precise drug delivery, a relief valve to reduce the occlusion effect in speaker-based devices (e.g., in-ear headphones), a pressure control valve, and/or another type of valve that is configured for microfluidic control, among other examples.

FIG. 2A illustrates a cross-section view of the piezoelectric valve 200. As shown in FIG. 2A, the piezoelectric valve 200 may include a valve body 202 and a valve vane 204 coupled with the valve body 202. The valve vane 204 may be configured to be selectively pressed against the valve body 202 to selectively open and close the piezoelectric valve 200. For example, the piezoelectric valve 200 is in a closed configuration when the valve vane 204 is pressed against the valve body 202, and the piezoelectric valve 200 is in an open configuration when the valve vane 204 is actuated away from the valve body 202.

The valve body 202 may include a valve actuator 206 that is configured to actuate the valve vane 204 to selectively open and close a valve port 208 of the piezoelectric valve 200. The valve actuator 206 may include an actuation lever, an actuation spring, an actuation beam, and/or another type of valve actuator device. The valve vane 204 may be configured to be selectively pressed against the valve body 202 to selectively open and close the valve port 208 of the piezoelectric valve 200. The valve vane 204 may include a valve stopper 210 that closes the valve port 208 when the valve stopper 210 is pressed against the valve body 202 by the valve actuator 206, and that opens the valve port 208 when the valve stopper 210 is moved away from the valve body 202 by the valve actuator 206.

Bonding pads 212 may be included on the valve actuator 206 and may function as bonding locations for bonding the valve vane 204 to the valve body 202. The valve vane 204 may include standoff pads 214 that interface with the bonding pads 212. In other words, the valve vane 204 may be bonded to the bonding pads 212 of the valve body 202 at the standoff pads 214 of the valve vane 204. Bonding layers 216 may be included on the standoff pads 214 to facilitate and/or promote bonding of the bonding pads 212 and the standoff pads 214.

The bonding pads 212 may include one or more types of materials, such as silver (Ag), gold (Au), aluminum (Al), an aluminum-copper (AlCu) alloy, a silicon oxide ($SiO_x$ such as $SiO_2$), tin (Sn), and/or another material, among other examples. The standoff pads 214 may include one or more types of materials, such as silver (Ag), gold (Au), aluminum (Al), germanium (Ge), and/or silicon (Si), among other examples. In some implementations, the bonding pads 212 include gold (Au) and the bonding layers 216 include gold (Au). In some implementations, the bonding pads 212 include germanium (Ge) and the bonding layers 216 include an aluminum-copper (AlCu) alloy. In some implementations, the bonding pads 212 include gold (Au) and the bonding layers 216 include an aluminum-copper (AlCu) alloy. In some implementations, the bonding pads 212 include silicon (Si) and the bonding layers 216 include an aluminum-copper (AlCu) alloy. In some implementations, the bonding pads 212 include silicon (Si) and the bonding layers 216 include a silicon oxide ($SiO_x$ such as $SiO_2$). In some implementations, the bonding pads 212 include gold (Au) and the bonding layers 216 include tin (Sn). However, other combinations of materials for the bonding pads 212 and the bonding layers 216 are within the scope of the present disclosure.

The valve body 202 may include a substrate 218 on which the valve actuator 206 is supported. The substrate 218 may include a silicon (Si) substrate, a substrate formed of a material including silicon, a III-V compound semiconductor material substrate such as gallium arsenide (GaAs), a germanium (Ge) substrate, a silicon germanium (SiGe) substrate, or another type of semiconductor substrate.

Backside cavities 220 may be included in the substrate 218 to facilitate actuation of the valve actuator 206. The backside cavities 220 may further extend into buried oxide layer 224 (e.g., to reduce the overall stiffness of the valve actuator 206). A fulcrum structure 222 may be included in the substrate 218, and the valve actuator 206 may be coupled with the fulcrum structure 222 at an end of the valve actuator 206 to enable the valve actuator 206 to actuate the valve vane 204 to selectively open and close the valve port 208. The valve vane 204 may be coupled with the valve body 202 at a first standoff pad 214 located at a first end of a valve actuator 206 of the valve body 202, and at a second standoff pad 214 located at a second end of a valve actuator 206 opposing the first end, where the first standoff pad 214 and the second standoff pad 214 are located on opposing sides of the fulcrum structure 222.

The valve body 202 (and the valve actuator 206) may further include a buried oxide layer 224 above the substrate 218, a semiconductor layer 226 over and/or on the buried oxide layer 224, and an isolation layer 228 over and/or on the semiconductor layer 226. Slits 230 may be formed through the semiconductor layer 226 and through the isolation layer 228 to separate portions of the semiconductor layer 226 and portions of the isolation layer 228 included in the valve actuator 206 from the portions of the semiconductor layer 226 and portions of the isolation layer 228 included in the rest of the valve body 202. The slits 230 enable the valve actuator 206 to freely actuate relative to the valve body 202.

The buried oxide layer 224 may include an oxide-containing material, such as a silicon oxide ($SiO_x$), a silicon oxynitride (SiON), tetraethyl orthosilicate oxide, carbon doped silicon oxide, and/or another oxide-containing material. The semiconductor layer 226 may include silicon (Si), a III-V compound semiconductor material such as gallium arsenide (GaAs), germanium (Ge), silicon germanium (SiGe), and/or another type of semiconductor substrate. The isolation layer 228 may include one or more dielectric materials, such as a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, and/or another dielectric material.

The valve actuator 206 of the valve body 202 may include a bottom electrode 232 and a top electrode 234. The bottom electrode 232 may be included over and/or on the isolation layer 228, and the top electrode 234 may be included above the bottom electrode 232. The bottom electrode 232 and the top electrode 234 may each include one or more electrically conductive materials, such as silver (Ag), gold (Au), aluminum (Al), a copper (Cu), tin (Sn), cobalt (Co), ruthenium (Ru), platinum (Pt), tungsten (W), molybdenum (Mo), titanium (Ti), titanium nitride (TiN), tantalum nitride (TaN), an electrically conductive metallic material, an electrically conductive ceramic material, a metal alloy material, another electrically conductive material, or a combination thereof.

The valve actuator 206 of the valve body 202 may include a piezoelectric-based actuation layer 236 between the bottom electrode 232 and the top electrode 234. The piezoelectric-based actuation layer 236 may provide the actuation mechanism of the valve actuator 206. The actuation mechanism of the piezoelectric-based actuation layer 236 may be based on the inverse piezoelectric effect. For example, an electrical input (e.g., a voltage, an electrical current) may be provided to the piezoelectric-based actuation layer 236 through the bottom electrode 232 and/or the top electrode 234. The electrical input may cause an electric field to be generated in the piezoelectric-based actuation layer 236, which causes the piezoelectric-based actuation layer 236 to bend, deflect, and/or to otherwise deform relative an initial position of the piezoelectric-based actuation layer 236. The deformation may be in a direction that is approximately orthogonal to the top surface of the piezoelectric-based actuation layer 236. This causes the rest of the valve actuator 206 to bend, deflect, expand, extend, and/or to otherwise deform, which causes the valve actuator 206 to actuate relative to the fulcrum structure 222. When the electrical input is removed or is not applied to the piezoelectric-based actuation layer 236, the piezoelectric-based actuation layer 236 (and the valve actuator 206) may return to the initial position.

The piezoelectric-based actuation layer 236 may include lead zirconate titanate (PZT) and/or another piezoelectric material. Additionally and/or alternatively, the piezoelectric-based actuation layer 236 may include aluminum nitride (AlN), gallium orthophosphate ($GaPO_4$), langasite ($La_3Ga_5SiO_{14}$), barium titanate ($BaTiO_3$), potassium niobate ($KNbO_3$), lithium niobate ($LiNbO_3$), lithium tantalate ($LiTaO_3$), sodium tungstate ($Na_2WO_3$), zinc oxide (ZnO), or a combination thereof.

An intermetal dielectric (IMD) layer 238 may be included over the valve body 202 and over the valve actuator 206. The IMD layer 238 may be included to provide electrical isolation for one or more layers and/or structures of the valve body 202 and/or of the valve actuator 206. The IMD layer 238 may include one or more dielectric materials, such as a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, and/or another dielectric material. In some implementations, the bonding pads 212 may be included over and/or on the IMD layer 238.

The bottom electrode 232 may be electrically coupled and/or physically coupled with bottom contact structure 240, and the top electrode 234 may be electrically coupled and/or physically coupled with a top contact structure 242. The bottom contact structure 240 may electrically couple the bottom electrode 232 with an electrical source (e.g., a voltage source, a current source), and the top contact structure 242 may electrically couple the top electrode 234 with the electrical source. The bottom contact structure 240 and the top contact structure 242 may each include a via, a trench, a pillar, a columnar structure, a metallization layer, a conductive trace, a dual damascene structure, and/or another type of conductive structure. The bottom contact structure 240 and the top contact structure 242 may each include one or more electrically conductive materials, such as silver (Ag), gold (Au), aluminum (Al), a copper (Cu), tin (Sn), cobalt (Co), ruthenium (Ru), platinum (Pt), tungsten (W), molybdenum (Mo), titanium (Ti), titanium nitride (TiN), tantalum nitride (TaN), an electrically conductive metallic material, an electrically conductive ceramic material, a metal alloy material, another electrically conductive material, or a combination thereof.

FIG. 2B illustrates a top-down view of the piezoelectric valve 200. As shown in FIG. 2B, the valve vane 204 may include an approximate rectangular shape in the top-down view of the piezoelectric valve 200. In other implementations, the valve vane 204 may include another shape, such as an approximate square shape, an approximate circular shape, an approximate spiral shape, an approximate ring shape, an irregular shape, and/or another shape. The standoff pads 214 may extend laterally outward from sides of the valve vane 204 and over one or more valve actuators 206. In some implementations, the piezoelectric valve 200 includes a plurality of valve actuators 206. For example, the piezoelectric valve 200 may include a first valve actuator 206 that is coupled with one or more first standoff pads 214 at a first side of the valve vane 204, and a second valve actuator 206 that is coupled with one or more second standoff pads 214 at a second side of the valve vane 204 opposing the first side. The valve actuator(s) 206 may include elongated structures that extend approximately parallel with the valve vane 204.

As indicated above, FIGS. 2A and 2B are provided as examples. Other examples may differ from what is described with regard to FIGS. 2A and 2B.

Figure 3A:
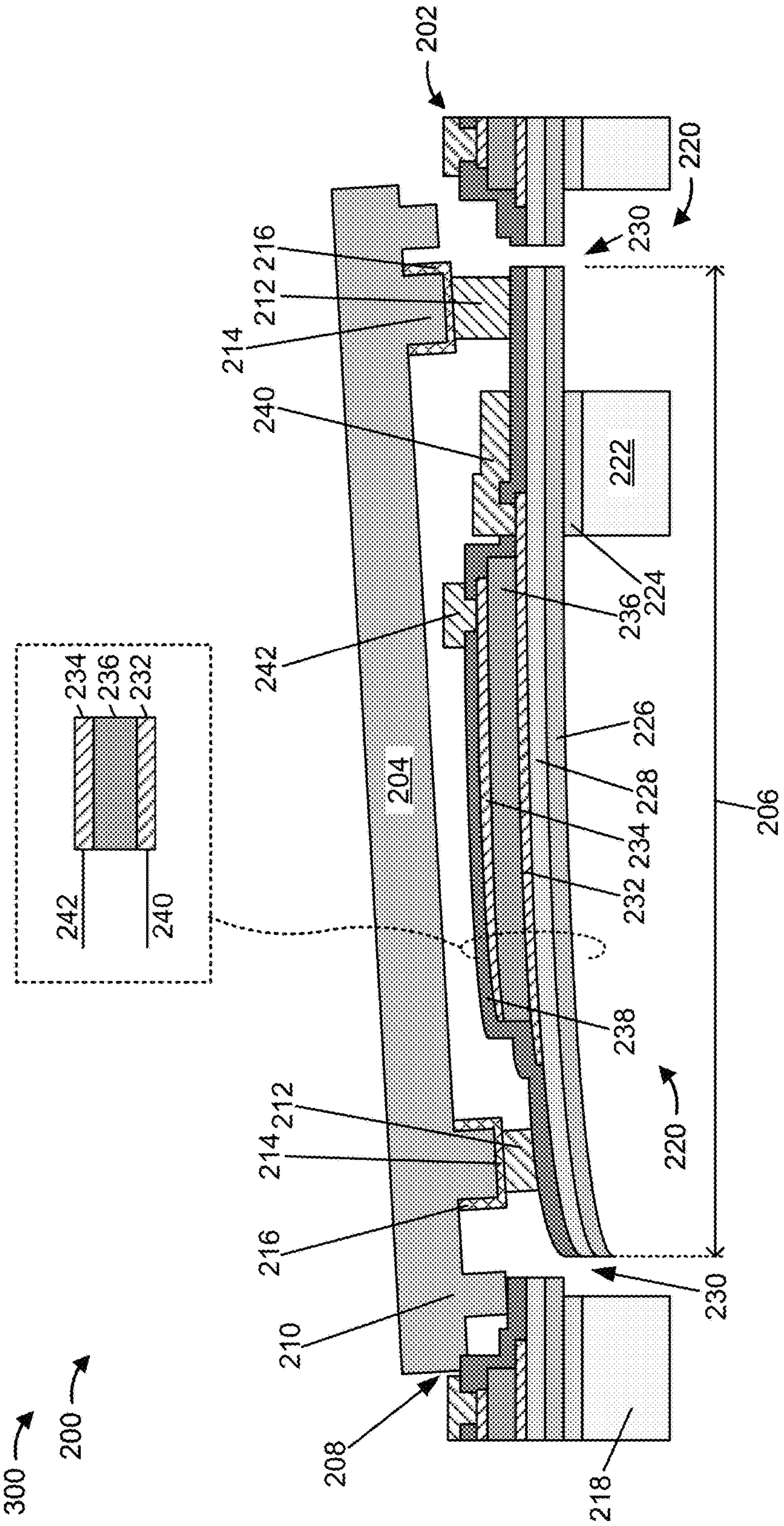
FIGS. 3A and 3B are diagrams of example configurations of a piezoelectric valve described herein.
Figure 3B:
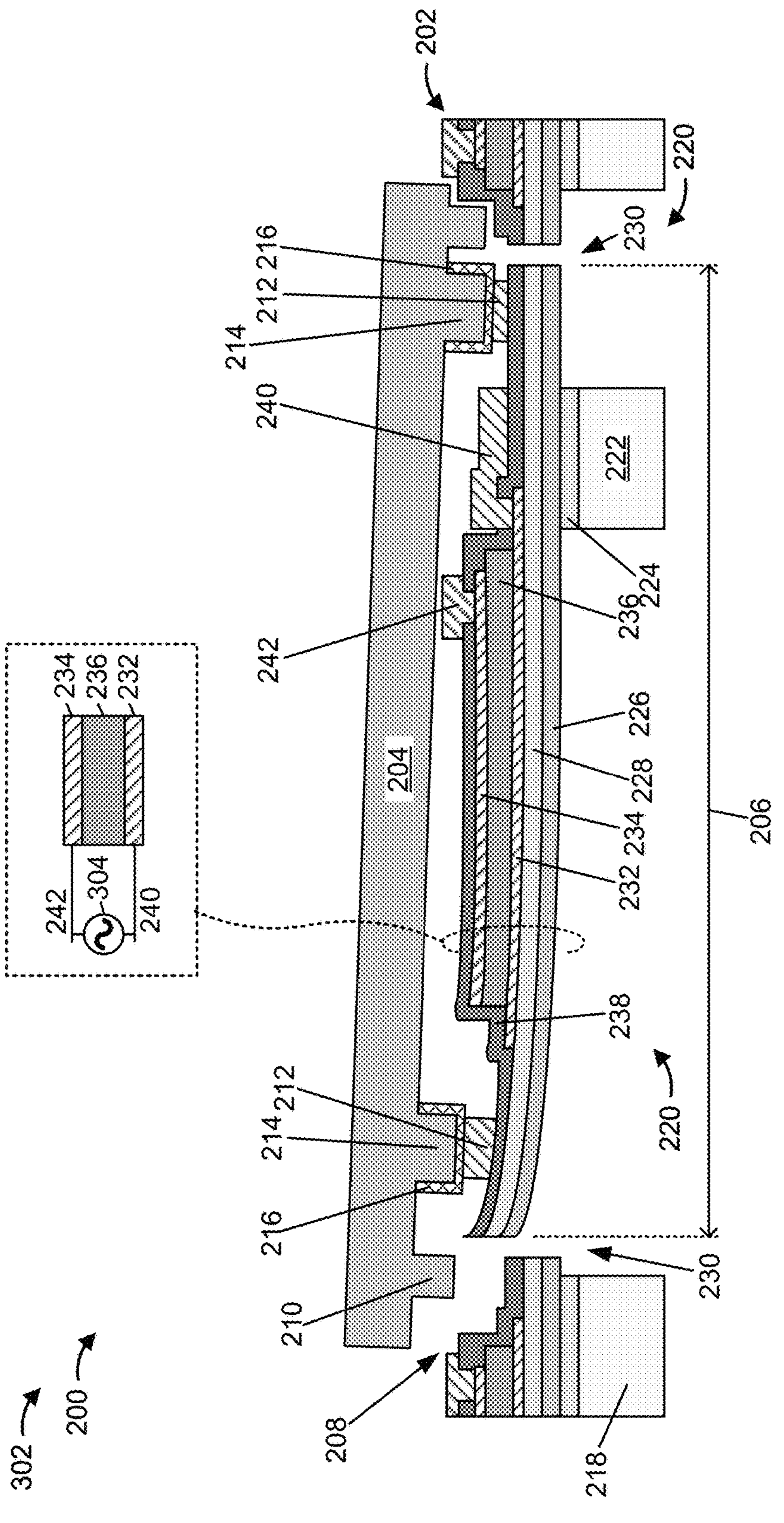

FIGS. 3A and 3B are diagrams of example configurations of the piezoelectric valve 200 described herein. FIG. 3A illustrates a closed configuration 300 and FIG. 3B illustrates an opened configuration 302.

As shown in FIG. 3A, in the closed configuration 300 the valve stopper 210 of the valve vane 204 is pressed against the valve body 202 such that the valve port 208 is closed. In the closed configuration 300, fluid (e.g., a gas, a liquid) is prevented from flowing through the valve port 208. The piezoelectric valve 200 may be manufactured such that the piezoelectric valve 200 is a normally closed piezoelectric valve. In these implementations, the closed configuration 300 is a normally closed configuration in which the valve vane 204 is biased against the valve body 202 without an electrical input applied to the valve actuator 206. An electrical input may be applied to the valve actuator 206 (e.g., to the piezoelectric-based actuation layer 236 through the bottom electrode 232 and/or through the top electrode 234) to overcome the bias and to open the valve port 208 by moving the valve stopper 210 of the valve vane 204 away from the valve body 202.

The bias of the valve vane 204 against the valve body 202 may be achieved through manufacturing the valve actuator 206 to include a mechanical bias that holds the valve vane 204 against the valve body 202 without the use of an electrical input. For example, and as shown in the example in FIG. 3A, the valve actuator 206 may be an actuation lever that includes a bend or deflection that biases the valve vane 204 against the valve body 202 without an electrical input applied to the valve actuator 206. The valve actuator 206 may be deflected downward from the fulcrum structure 222 as a result of compressive stresses in one or more of the layers of the valve body 202 and/or valve actuator 206. For example, a compressive film stress in the isolation layer 228, a compressive film stress in the piezoelectric-based actuation layer 236, and/or a compressive film in the IMD layer 238 may cause an end of the valve actuator 206 (e.g., a distal end of the valve actuator 206 from the fulcrum structure 222) to be deflected downward from the fulcrum structure 222. The compressive stresses in the one or more layers may result in a combined overall compressive stress in the valve actuator 206, which results in the downward deflection of the valve actuator 206 toward a backside cavity 220.

The compressive film stresses in the layers described above may be achieved by forming the layers such that the layers are interfaced with other layers having different coefficients of thermal expansion (CTE). For example, the compressive film stress in the isolation layer 228 may result from a CTE mismatch (e.g., a difference in CTE) between a CTE of the isolation layer 228 and a CTE of the semiconductor layer 226, and/or may result from a CTE mismatch between the CTE of the isolation layer 228 and a CTE of the bottom electrode 232. The CTE of the isolation layer 228 (which may be silicon dioxide ($SiO_2$), for example, having a CTE of approximately $5.6\times10^{-6}$ $K^{-1}$ may be greater than the CTE of the semiconductor layer 226 (which may be silicon (Si), for example, having a CTE of approximately $2.5\times10^{-6}$ $K^{-1}$), whereas the CTE of the isolation layer 228 may be less than the CTE of the bottom electrode 232 (which may be platinum (Pt), for example, having a CTE of approximately $9\times10^{-6}$ $K^{-1}$).

As another example, the compressive film stress in the piezoelectric-based actuation layer 236 may result from a CTE mismatch between a CTE of the piezoelectric-based actuation layer 236 and the CTE of the bottom electrode 232, and/or may result from a CTE mismatch between the CTE of the piezoelectric-based actuation layer 236 and a CTE of the top electrode 234. The CTE of the piezoelectric-based actuation layer 236 (which may be PZT, for example, having a CTE of approximately $6.7\times10^{-6}$ $K^{-1}$) may be less than the CTE of the bottom electrode 232. The CTE of the piezoelectric-based actuation layer 236 may also be less than the CTE of the top electrode 234 (which may be platinum (Pt), for example, having a CTE of approximately $9\times10^{-6}$ $K^{-1}$).

As another example, the compressive film stress in the IMD layer 238 may result from a CTE mismatch between a CTE of the IMD layer 238 and the CTE of the top electrode 234. The CTE of the IMD layer 238 (which may be silicon dioxide ($SiO_2$), for example, having a CTE of approximately $5.6\times10^{-6}$ $K^{-1}$) may be less than the CTE of the top electrode 234.

As shown in FIG. 3B, in the opened configuration 302 the valve stopper 210 of the valve vane 204 is spaced apart from the valve body 202 such that the valve port 208 is opened. In the opened configuration 302, fluid (e.g., a gas, a liquid) is permitted to flow through the valve port 208.

As further shown in FIG. 3B, the opened configuration 302 may be achieved by applying an electrical input 304 to the piezoelectric-based actuation layer 236 through the bottom electrode 232 and/or through the top electrode 234. The electrical input 304 may include a voltage, an electrical current, and/or another type of electrical input. The electrical input 304 causes the piezoelectric-based actuation layer 236 to transition from compression to tension, which enables the valve actuator 206 to overcome the compressive film stress(es) in the valve actuator 206. In this way, the valve actuator 206 transitions from downward deflection (e.g., deflection toward the backside cavity 220) to being deflected or bent upward, which lifts the valve stopper 210 away from the valve body 202 and opens the valve port 208.

In this way, the piezoelectric valve 200 may include a valve body 202 and a valve vane 204 coupled with the valve body 202, where a compressive film stress in one or more layers (e.g., the isolation layer 228, the piezoelectric-based actuation layer 236, the IMD layer 238) of the valve body 202 biases the valve vane 204 against the valve body 202 in a normally closed configuration (e.g., the closed configuration 300).

In some alternative implementations, the piezoelectric valve 200 may be manufactured such that the piezoelectric valve 200 is a normally closed piezoelectric valve. In these implementations, the opened configuration 302 is a normally opened configuration in which the valve vane 204 is spaced apart from the valve body 202 without an electrical input applied to the valve actuator 206 as a result of tensile film stresses in one or more layers in the valve actuator 206. An electrical input may be applied to the valve actuator 206 (e.g., to the piezoelectric-based actuation layer 236 through the bottom electrode 232 and/or through the top electrode 234) to overcome the bias and to close the valve port 208 by moving the valve stopper 210 of the valve vane 204 against the valve body 202 into the closed configuration 300.

As indicated above, FIGS. 3A and 3B are provided as examples. Other examples may differ from what is described with regard to FIGS. 3A and 3B.

FIGS. 4A-4F illustrate an example implementation 400 of forming a valve body 202 described herein. In some implementations, one or more of the semiconductor processing operations described in connection with FIGS. 4A-4F are performed using one or more of the semiconductor devices 102-114. In some implementations, one or more of the semiconductor processing operations described in connection with FIGS. 4A-4F are performed by another semiconductor processing tool.

Figure 4A:
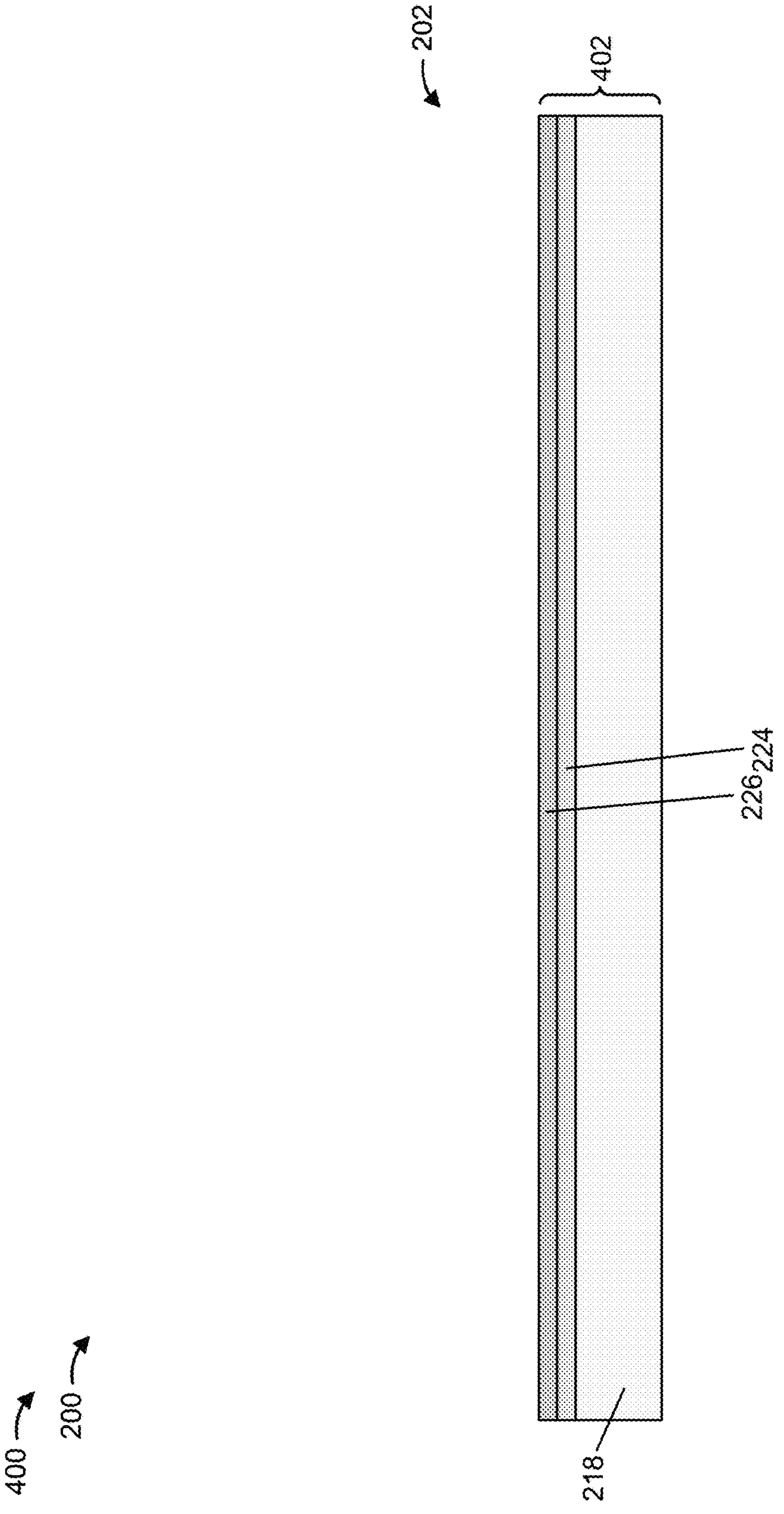
FIGS. 4A-4F illustrate an example implementation of forming a valve body described herein.

Turning to FIG. 4A, a silicon on insulator (SOI) wafer 402 may be provided. The SOI wafer 402 may include the substrate 218, the buried oxide layer 224, and the semiconductor layer 226. The SOI wafer 402 may be a round/circular wafer having an approximately 200 mm diameter, an approximately 300 mm diameter, or another diameter, such as 450 mm, among other examples. The SOI wafer 402 may alternatively be any square, rectangular, curved, or otherwise non-circular workpiece, such as a polygonal substrate.

In some implementations, a thickness of the substrate 218 may be included in a range of approximately 200 microns to approximately 1000 microns. If the thickness of the substrate 218 is less than approximately 200 microns, the substrate 218 may have insufficient rigidity for forming the valve body 202, whereas the substrate 218 may have sufficient rigidity if the thickness of the substrate 218 is at least approximately 200 microns. If the thickness of the substrate 218 is greater than approximately 1000 microns, the valve body 202 may be unnecessarily thick and may result in inefficient processing of the valve body 202, such as during a subsequent thinning operation for the substrate 218. However, other values for the thickness of the substrate 218 and ranges other than approximately 200 microns to approximately 1000 microns are within the scope of the present disclosure.

In some implementations, a thickness of the buried oxide layer 224 may be included in a range of approximately 1000 angstroms to approximately 5 microns. If the thickness of the buried oxide layer 224 is less than approximately 1000 angstroms, the buried oxide layer 224 may not provide a sufficient etch stop barrier for forming the backside cavities 220 in the substrate 218, whereas the buried oxide layer 224 may provide a sufficient etch stop barrier for forming the backside cavities 220 in the substrate 218. If the thickness of the buried oxide layer 224 is greater than approximately 5 microns, the SOI wafer 402 may be unnecessarily thick and may result in inefficient processing of the valve body 202. However, other values for the thickness of the buried oxide layer 224 and ranges other than approximately 1000 angstroms to approximately 5 microns are within the scope of the present disclosure.

In some implementations, a thickness of the semiconductor layer 226 may be included in a range of approximately 1000 angstroms to approximately 50 microns. If the thickness of the semiconductor layer 226 is less than approximately 1000 angstroms, the semiconductor layer 226 may not provide sufficient stiffness for the valve actuator 206, whereas the semiconductor layer 226 may provide a sufficient stiffness for the valve actuator 206. If the thickness of the semiconductor layer 226 is greater than approximately 50 microns, the semiconductor layer 226 may be too stiff to allow the valve actuator 206 to open the valve port 208, whereas the valve actuator 206 may be able to open the valve port 208 if the thickness of the semiconductor layer 226 is less than or equal to approximately 50 microns. However, other values for the thickness of the semiconductor layer 226 and ranges other than approximately 1000 angstroms to approximately 50 microns are within the scope of the present disclosure.

Figure 4B:
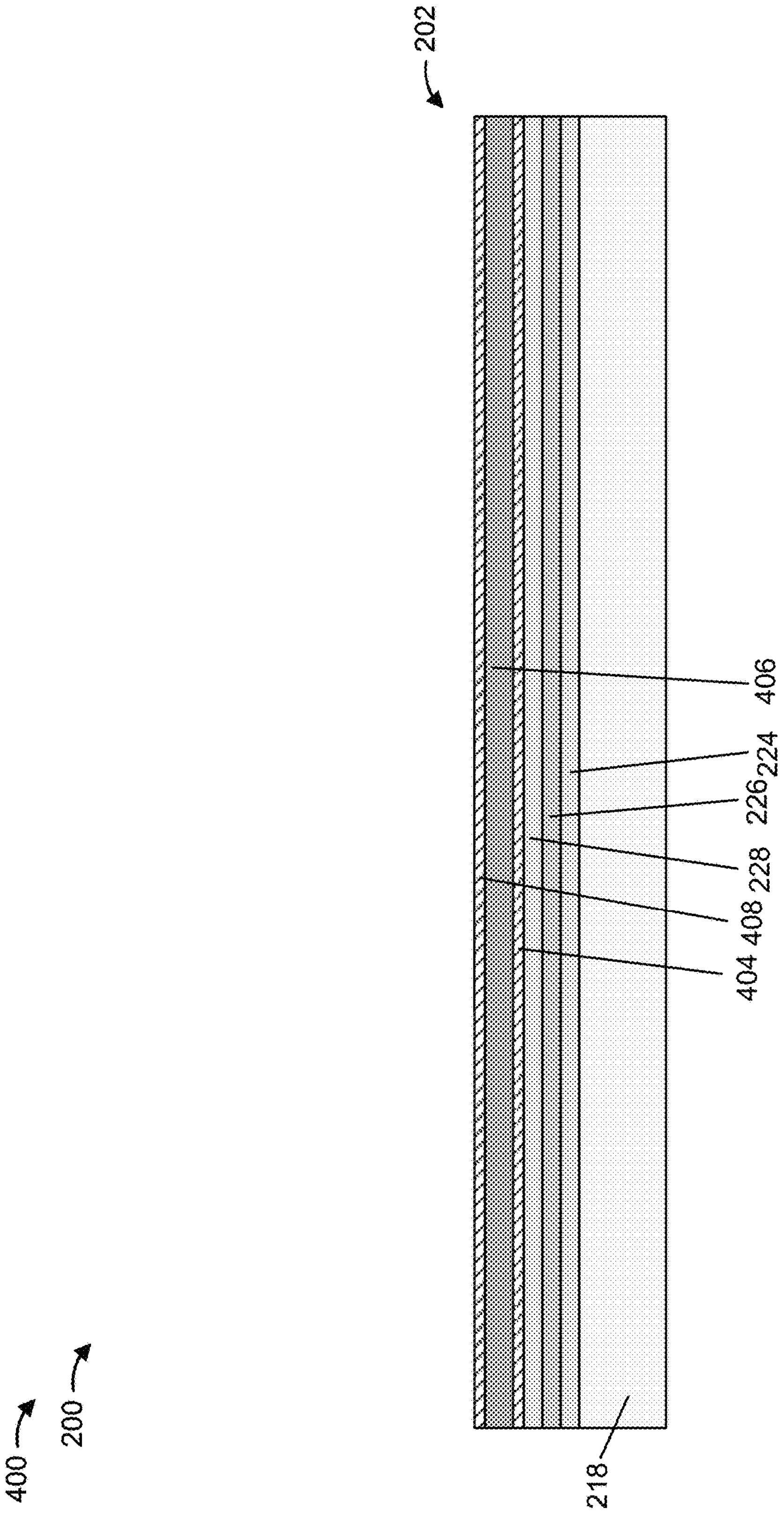

As shown in FIG. 4B, one or more layers may be formed over and/or on the SOI wafer 402. For example, the isolation layer 228 may be formed over and/or on the semiconductor layer 226 of the SOI wafer 402. As another example, a conductive layer 404 may be formed over and/or on the isolation layer 228. As another example, a piezoelectric layer 406 may be formed over and/or on the conductive layer 404. As another example, a conductive layer 408 may be formed over and/or on the piezoelectric layer 406.

In some implementations, a deposition tool 102 may be used to deposit the isolation layer 228 in a PVD operation, an ALD operation, a CVD operation, an epitaxy operation, an oxidation operation, another type of deposition operation described in connection with FIG. 1, and/or another suitable deposition operation. In some implementations, a planarization tool 110 may be used to planarize the isolation layer 228 after the isolation layer 228 is deposited.

In some implementations, a deposition tool 102 and/or a plating tool 112 may be used to deposit the conductive layer 404 in a CVD operation, a PVD operation, an ALD operation, an electroplating operation, another deposition operation described above in connection with FIG. 1, and/or another suitable deposition operation. In some implementations, a seed layer is first deposited, and the conductive layer 404 is deposited on the seed layer. In some implementations, a planarization tool 110 may be used to planarize the conductive layer 404 after the conductive layer 404 is deposited.

In some implementations, the piezoelectric layer 406 is formed by performing a PVD deposition operation using a deposition tool 102. In some implementations, the deposition tool 102 is used to perform a solution gelling (sol-gel) process to form the piezoelectric layer 406. The sol-gel process may include using a deposition tool 102 to deposit a piezoelectric material (e.g., PZT and/or another piezoelectric material) or the precursors that are used to form the piezoelectric material. The precursors may be deposited in a solution (the "sol") that also includes a solvent. The deposition tool 102 may use a spin-coating technique and/or another suitable technique to deposit the solution.

The deposition tool 102 may be used to perform a curing (or drying) operation in which the solution may then be cured for a time duration. The deposition tool 102 may be used to increase the temperature of the solution after the curing operation to perform a calcination operation. The calcination operation may be performed to initiate crystallization of the precursors into the piezoelectric material. The deposition tool 102 may be used to then further increase the temperature to perform a rapid thermal oxidation (RTO) operation to fully crystallize the piezoelectric material in a well-defined crystal orientation. The deposition tool 102 may be used to perform a plurality of curing-RTO cycles to form the piezoelectric layer 406. For example, the deposition tool 102 may be used to perform a first curing operation, followed by a first RTO operation, followed by a second curing operation, followed by a second RTO operation, and so on until a desired thickness is achieved for the piezoelectric layer 406. In some implementations, 4 curing-RTO cycles are performed (referred to as a 4C4R process) to form the piezoelectric layer 406. However, other quantities of curing-RTO cycles are within the scope of the present disclosure.

In some implementations, a deposition tool 102 and/or a plating tool 112 may be used to deposit the conductive layer 408 in a CVD operation, a PVD operation, an ALD operation, an electroplating operation, another deposition operation described above in connection with FIG. 1, and/or another suitable deposition operation. In some implementations, a seed layer is first deposited, and the conductive layer 408 is deposited on the seed layer. In some implementations, a planarization tool 110 may be used to planarize the conductive layer 404 after the conductive layer 408 is deposited.

In some implementations, a thickness of the isolation layer 228 is included in a range of approximately 1000 angstroms to approximately 10 microns. If the thickness of the isolation layer 228 is less than approximately 1000 angstroms, the compressive film stress in the isolation layer 228 may be insufficient to bias the valve vane 204 against the valve body, whereas the compressive film stress in the isolation layer 228 may enable the isolation layer 228 to bias the valve vane 204 against the valve body 202 and may enable the isolation layer 228 to resist electrical breakdown when the electrical input 304 is applied to open the valve port 208. If the thickness of the isolation layer 228 is greater than approximately 10 microns, the isolation layer 228 may be too stiff to allow the valve actuator 206 to open the valve port 208 and may suffer from film peeling. However, other values for the isolation layer 228 and ranges other than approximately 1000 angstroms to approximately 10 microns are within the scope of the present disclosure.

In some implementations, a thickness of the conductive layer 404 is included in a range of approximately 500 angstroms to approximately 1 micron. If the thickness of the conductive layer 404 is less than approximately 500 angstroms, voids may occur in the conductive layer 404 and/or higher power consumption may occur in the conductive layer 404 (which may result in an increased resistance-capacitance (RC) time constant for the valve actuator 206). If the thickness of the conductive layer 404 is at least approximately 500 angstroms, the likelihood of void formation in the conductive layer 404 may be decreased and/or minimized, and/or power consumption may be reduced. If the thickness of the conductive layer 404 is greater than approximately 1 micron, the cost of manufacturing the piezoelectric valve 200 may be unnecessarily high, and/or the valve actuator 206 may be unable to bias the valve vane 204 against the valve body 202. However, other values for the thickness of the conductive layer 404 and ranges other than approximately 500 angstroms to approximately 1 micron are within the scope of the present disclosure.

In some implementations, a thickness of the piezoelectric layer 406 may be included in a range of approximately 2000 angstroms to approximately 5 microns. If the thickness of the piezoelectric layer 406 is less than approximately 2000 angstroms, the grain size in the piezoelectric layer 406 may be too small and may result in reduced piezoelectric performance, whereas the piezoelectric performance may enable operation of the valve actuator 206 if the thickness of the piezoelectric layer 406 is at least 2000 angstroms. If the thickness of the piezoelectric layer 406 is greater than approximately 5 microns, the cost of manufacturing the piezoelectric valve 200 may be unnecessarily high. However, other values for the thickness of the piezoelectric layer 406 and ranges other than approximately 2000 angstroms to approximately 5 microns are within the scope of the present disclosure.

In some implementations, a thickness of the conductive layer 408 is included in a range of approximately 500 angstroms to approximately 1 micron. If the thickness of the conductive layer 408 is less than approximately 500 angstroms, voids may occur in the conductive layer 408 and/or higher power consumption may occur in the conductive layer 408 (which may result in an increased RC time constant for the valve actuator 206). If the thickness of the conductive layer 408 is at least approximately 500 angstroms, the likelihood of void formation in the conductive layer 408 may be decreased and/or minimized, and/or power consumption may be reduced. If the thickness of the conductive layer 408 is greater than approximately 1 micron, the cost of manufacturing the piezoelectric valve 200 may be unnecessarily high, and/or the valve actuator 206 may be unable to bias the valve vane 204 against the valve body 202. However, other values for the thickness of the conductive layer 408 and ranges other than approximately 500 angstroms to approximately 1 micron are within the scope of the present disclosure.

Figure 4C:
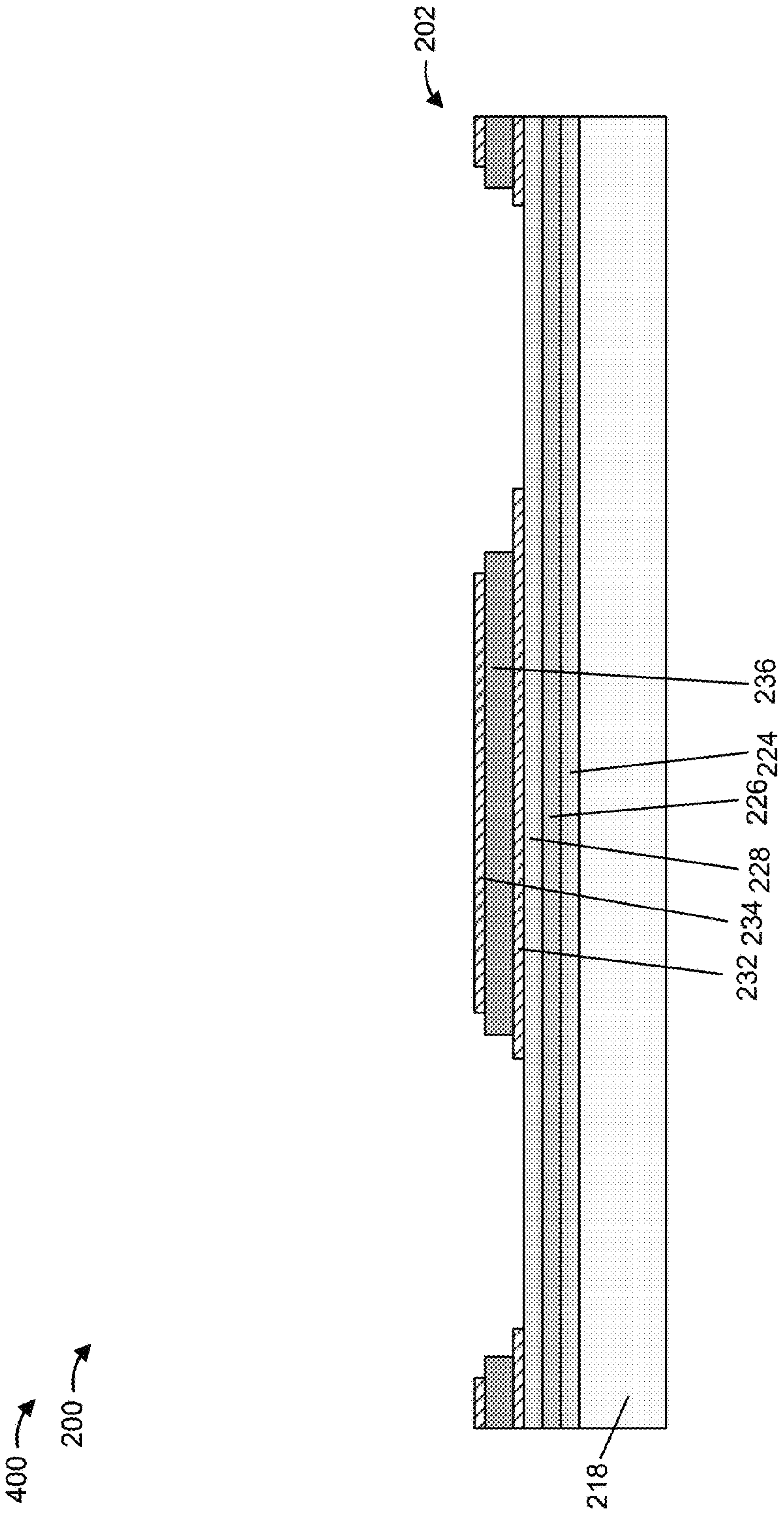

As shown in FIG. 4C, the conductive layer 404, the piezoelectric layer 406, and the conductive layer 408 may be etched to form the bottom electrode 232, the top electrode 234, and the piezoelectric-based actuation layer 236. In some implementations, a pattern in a photoresist layer is used to etch the conductive layer 404, the piezoelectric layer 406, and the conductive layer 408 to form the bottom electrode 232, the top electrode 234, and the piezoelectric-based actuation layer 236. In these implementations, the deposition tool 102 may be used to form the photoresist layer on the conductive layer 408. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the conductive layer 404, the piezoelectric layer 406, and the conductive layer 408 based on the pattern to form the bottom electrode 232, the top electrode 234, and the piezoelectric-based actuation layer 236. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the conductive layer 404, the piezoelectric layer 406, and the conductive layer 408 based on a pattern.

Figure 4D:
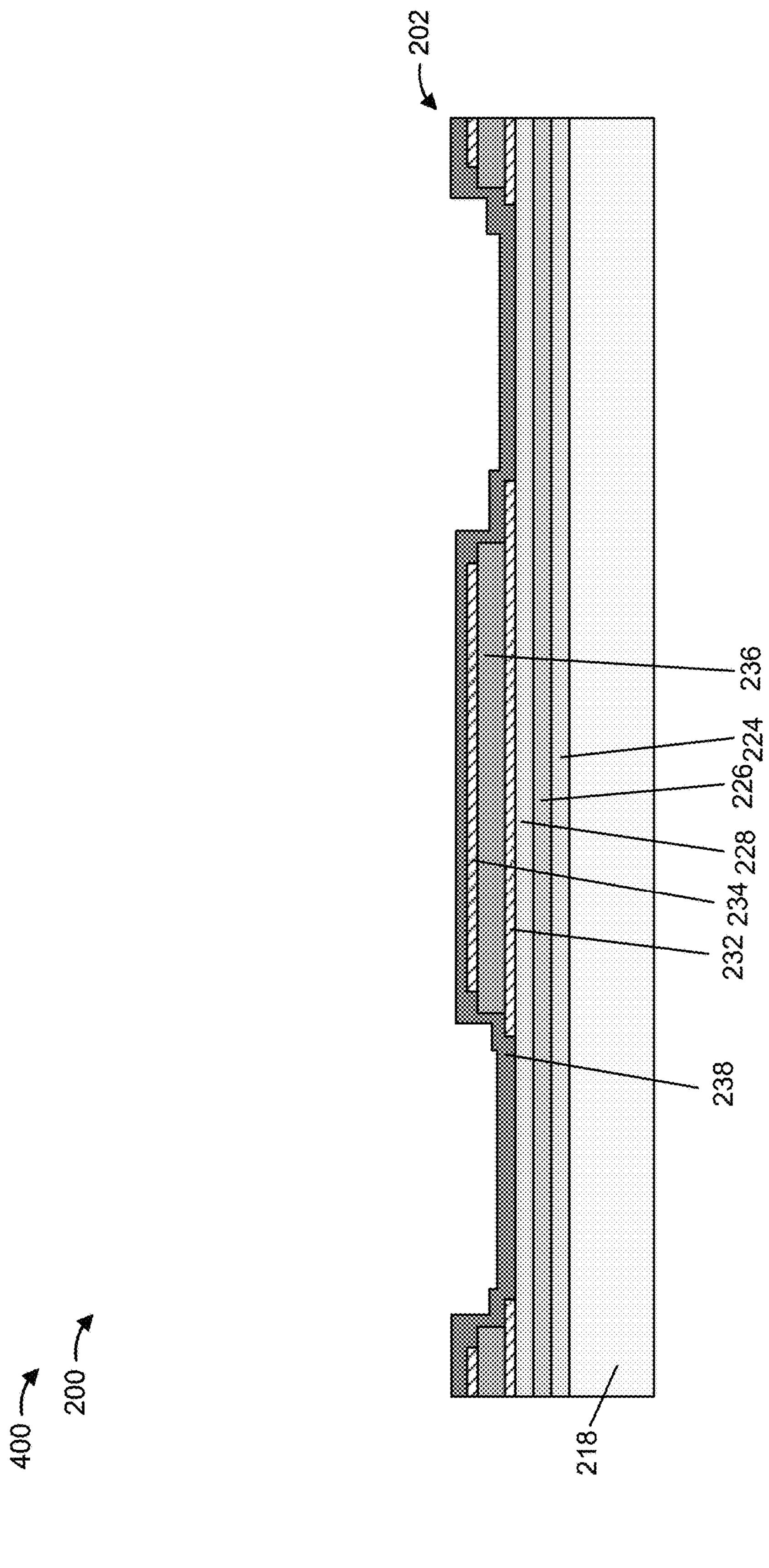

As shown in FIG. 4D, the IMD layer 238 may be formed on the valve body 202. For example, the IMD layer 238 may be deposited on portions of the isolation layer 228, portions of the bottom electrodes 232, portions of the top electrodes 234, and/or portions of the piezoelectric-based actuation layers 236. A deposition tool 102 may be used to deposit the IMD layer 238 in a PVD operation, an ALD operation, a CVD operation, an epitaxy operation, an oxidation operation, another type of deposition operation described in connection with FIG. 1, and/or another suitable deposition operation.

Figure 4E:
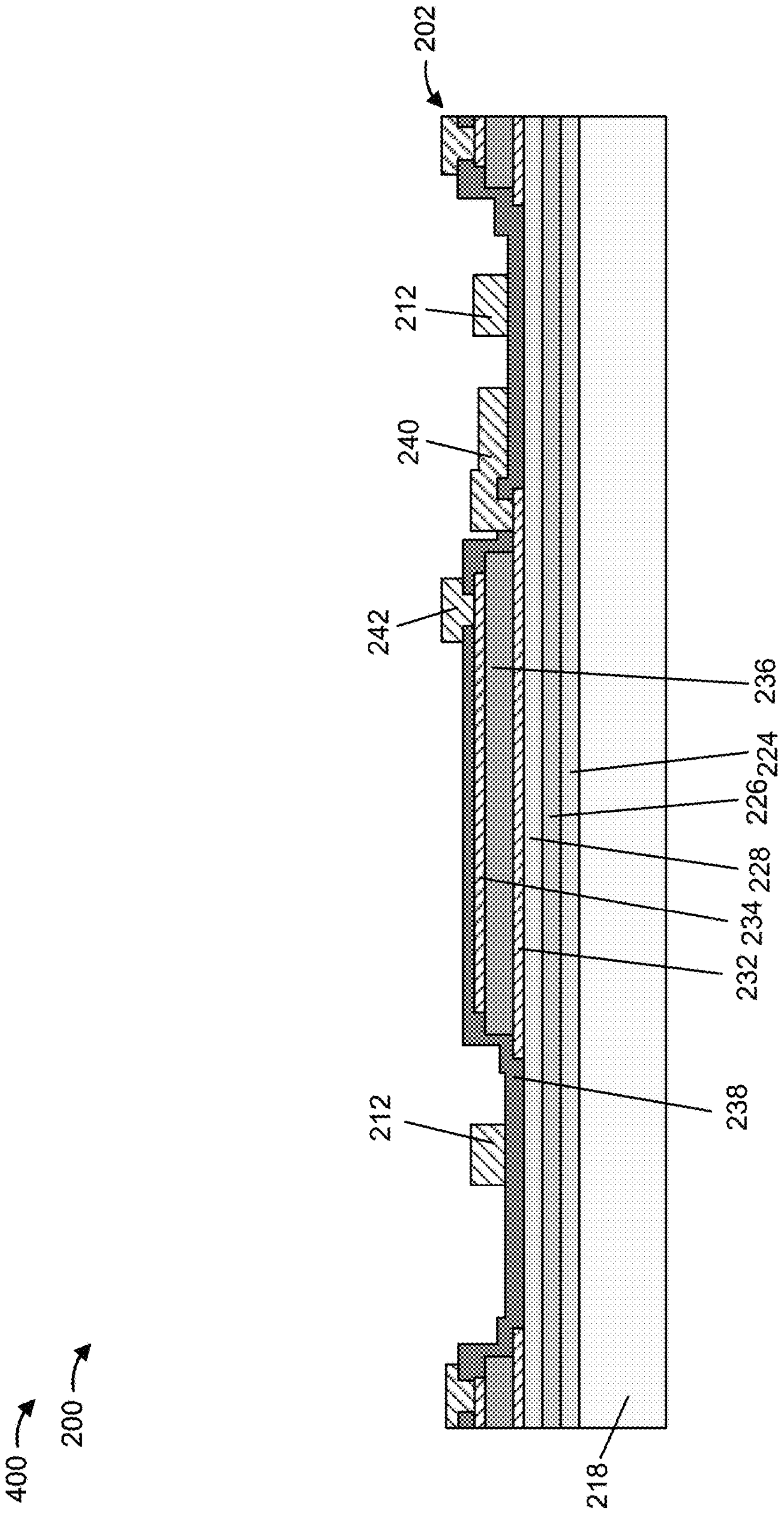

As shown in FIG. 4E, the bonding pads 212, the bottom contact structures 240, and the top contact structures 242 may be formed on the valve body 202. For example, the bonding pads may be formed on the IMD layer 238. As another example, a bottom contact structure 240 may be formed on a bottom electrode 232 (e.g., such that the bottom electrode 232 and the bottom contact structure 240 are physically coupled and/or electrically coupled) and on the IMD layer 238. As another example, a top contact structure 242 may be formed on a top electrode 234 (e.g., such that the top electrode 234 and the top contact structure 242 are physically coupled and/or electrically coupled) and on the IMD layer 238.

A deposition tool 102 and/or a plating tool 112 may be used to deposit the bonding pads 212, the bottom contact structures 240, and/or the top contact structures 242 in a CVD operation, a PVD operation, an ALD operation, an electroplating operation, another deposition operation described above in connection with FIG. 1, and/or another suitable deposition operation. In some implementations, a seed layer is first deposited, and the bonding pads 212, the bottom contact structures 240, and/or the top contact structures 242 are deposited on the seed layer.

In some implementations, an etch tool 108 is used to remove portions of the IMD layer 238 over the bottom electrode 232 and over the top electrode 234 to form openings in the IMD layer 238 over the bottom electrode 232 and over the top electrode 234. A deposition tool 102 and/or a plating tool 112 may be used to deposit the bottom contact structure 240 in the opening over the bottom electrode 232, and to deposit the top contact structure 242 in the opening over the top electrode 234.

Figure 4F:
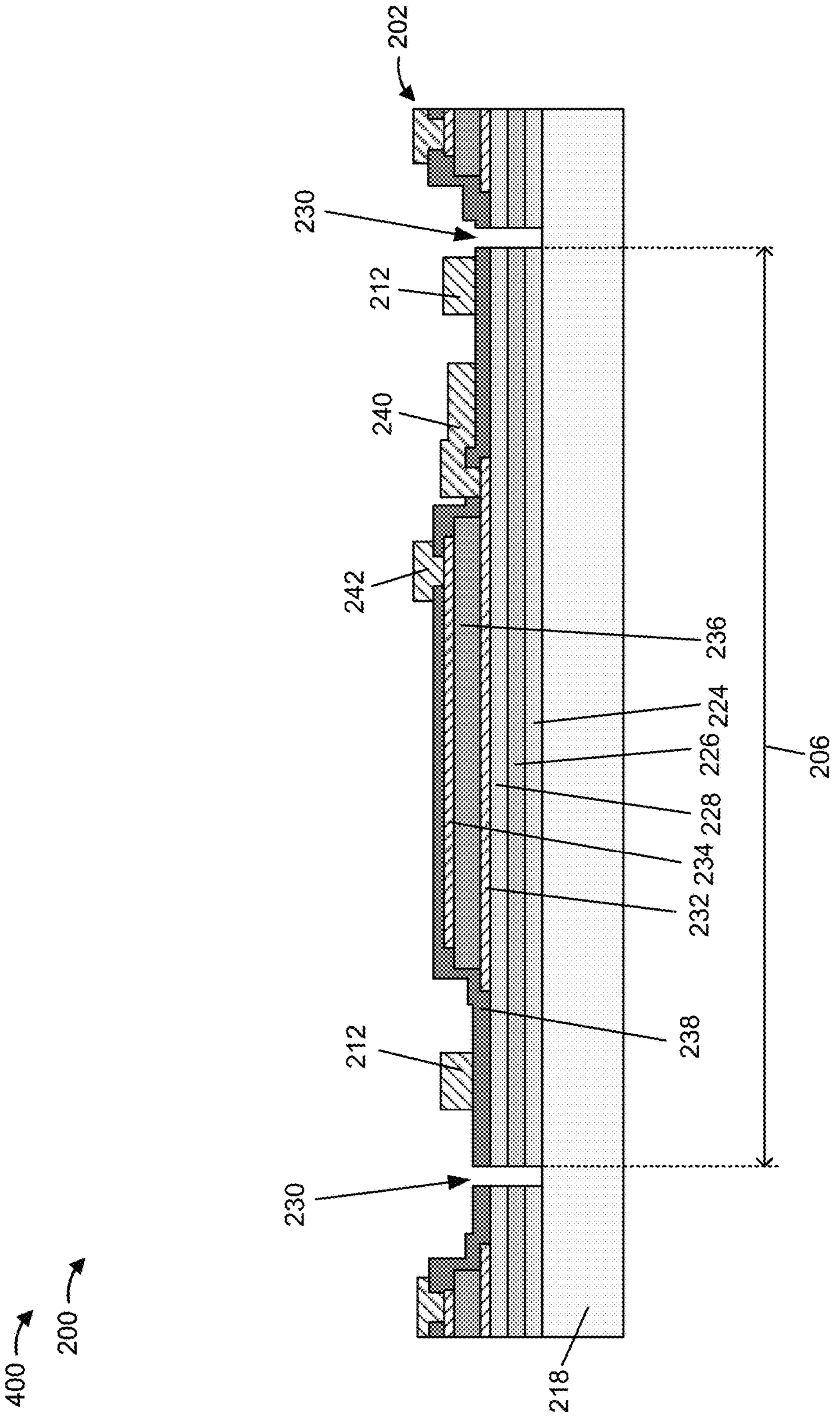

As shown in FIG. 4F, portions of the IMD layer 238, portions of the isolation layer 228, portions of the semiconductor layer 226, and/or portions of the buried oxide layer 224 may be removed to define the valve actuator 206 of the valve body 202. In some implementations, a pattern in a photoresist layer is used to etch the IMD layer 238, the isolation layer 228, the semiconductor layer 226, and/or the buried oxide layer 224 to form the slits 230 in the IMD layer 238, the isolation layer 228, the semiconductor layer 226, and/or the buried oxide layer 224 to define the valve actuator 206. In these implementations, a deposition tool 102 may be used to form the photoresist layer on the bonding pads 212, on the IMD layer 238, on the bottom contact structure 240, and/or on the top contact structure 242. An exposure tool 104 may be used to expose the photoresist layer to a radiation source to pattern the photoresist layer. The developer tool 106 may be used to develop and remove portions of the photoresist layer to expose the pattern. The etch tool 108 may be used to etch the IMD layer 238, the isolation layer 228, the semiconductor layer 226, and/or the buried oxide layer 224 based on the pattern to form the slits 230 in the IMD layer 238, the isolation layer 228, the semiconductor layer 226, and/or the buried oxide layer 224. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the IMD layer 238, the isolation layer 228, the semiconductor layer 226, and/or the buried oxide layer 224 based on a pattern.

As indicated above, FIGS. 4A-4F are provided as examples. Other examples may differ from what is described with regard to FIGS. 4A-4F.

FIGS. 5A-5D illustrate an example implementation 500 of forming a valve vane 204 described herein. In some implementations, one or more of the semiconductor processing operations described in connection with FIGS. 5A-5D are performed using one or more of the semiconductor devices 102-114. In some implementations, one or more of the semiconductor processing operations described in connection with FIGS. 5A-5D are performed by another semiconductor processing tool.

Figure 5A:
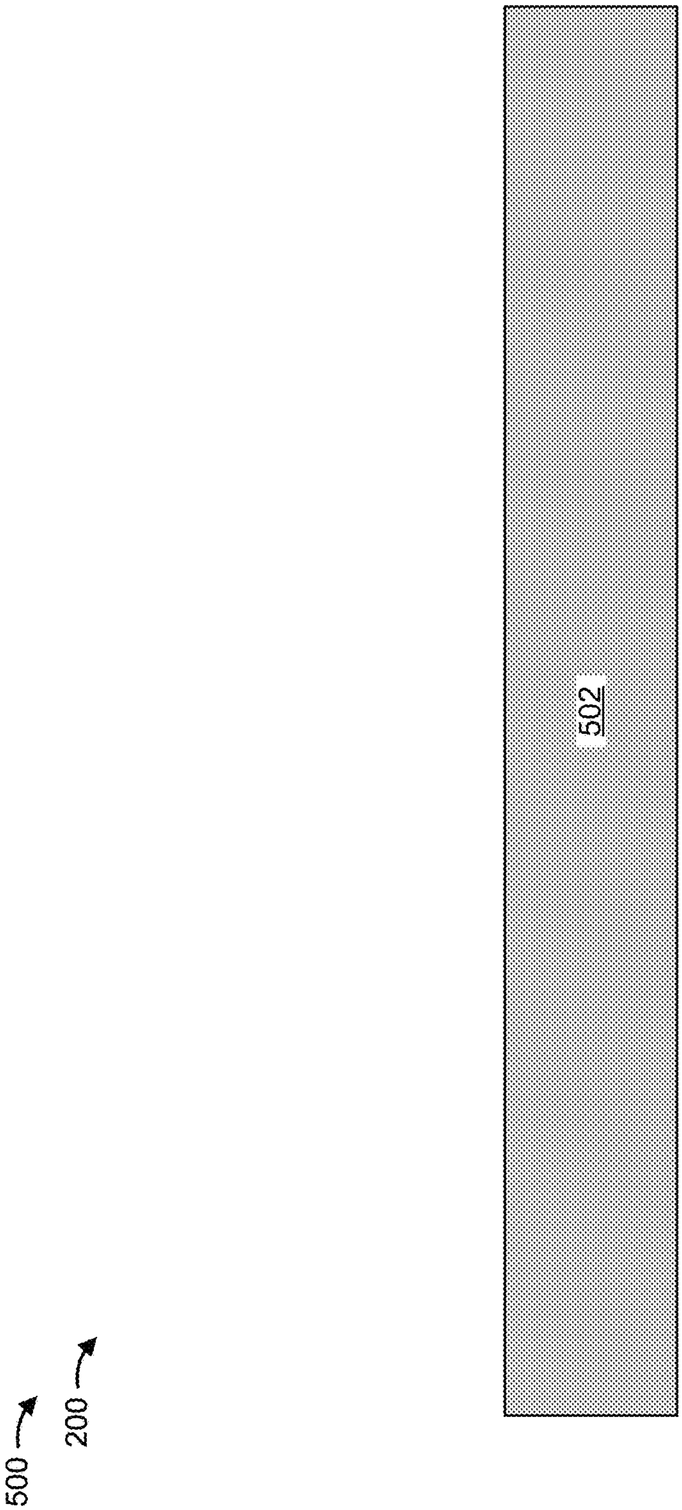
FIGS. 5A-5D illustrate an example implementation of forming a valve vane described herein.

Turning to FIG. 5A, the valve vane 204 may be formed from a substrate 502. The substrate 502 includes a silicon (Si) substrate, a substrate formed of a material including silicon, a III-V compound semiconductor material substrate such as gallium arsenide (GaAs), a germanium substrate (Ge), a silicon germanium (SiGe) substrate, or another type of semiconductor substrate. The substrate 502 may include a round/circular substrate having an approximately 200 mm diameter, an approximately 300 mm diameter, or another diameter, such as 450 mm, among other examples. The substrate 502 may alternatively be any square, rectangular, curved, or otherwise non-circular workpiece, such as a polygonal substrate.

Figure 5B:
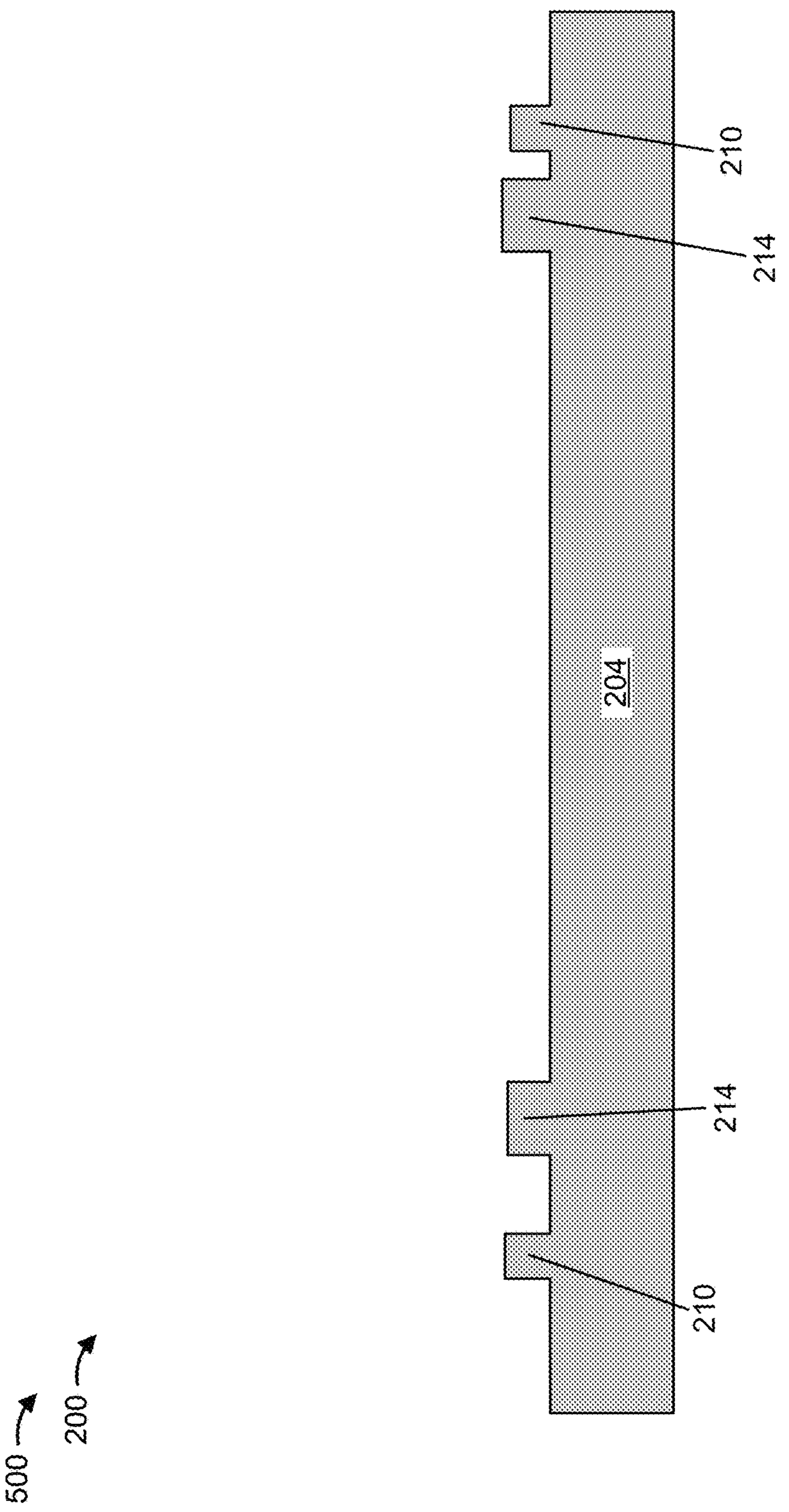

As shown in FIG. 5B, portions of the substrate 502 may be removed to form the valve vane 204 and to form the valve stopper(s) 210 and the standoff pads 214 that extend from the valve vane 204.

In some implementations, a pattern in a photoresist layer is used to etch the substrate 502 to form the valve vane 204, the valve stopper(s) 210, and the standoff pads 214. In these implementations, a deposition tool 102 may be used to form the photoresist layer on the substrate 502. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the substrate 502 based on the pattern to form the valve vane 204, the valve stopper(s) 210, and the standoff pads 214. In some implementations, the etch operation includes a plasma etch operation, a wet chemical etch operation, and/or another type of etch operation. In some implementations, the etch operation includes a dry reactive ion etch (DRIE) operation or a Bosh etch operation (e.g., an etch operation that includes a plurality of deposition and etch cycles). In some implementations, a photoresist removal tool may be used to remove the remaining portions of the photoresist layer (e.g., using a chemical stripper, plasma ashing, and/or another technique). In some implementations, a hard mask layer is used as an alternative technique for etching the substrate 502 based on a pattern.

In some implementations, a height of valve stopper 210 (e.g., a distance from the valve vane 204 to a top surface of the valve stopper 210) may be included in a range of approximately 700 microns to approximately 800 microns. However, other values for the range are within the scope of the present disclosure. In some implementations, a height of valve stopper 210 (e.g., a distance from the valve vane 204 to a top surface of the valve stopper 210) may be included in a range of approximately 700 microns to approximately 800 microns. However, other values for the range are within the scope of the present disclosure.

Figure 5C:
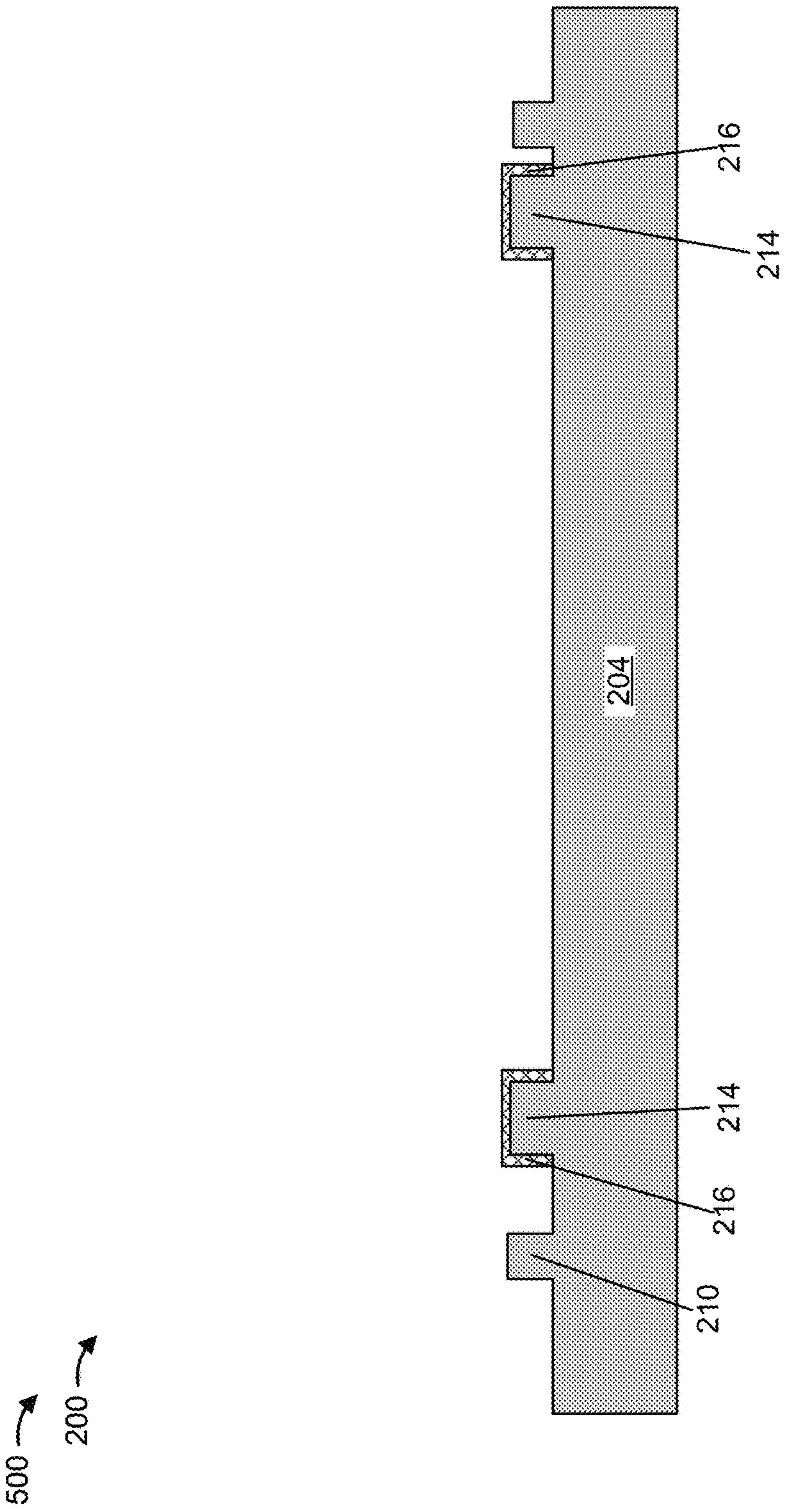

As shown in FIG. 5C, bonding layers 216 may be formed over and/or on the standoff pads 214. A deposition tool 102 and/or a plating tool 112 may be used to deposit the bonding layers 216 in a CVD operation, a PVD operation, an ALD operation, an electroplating operation, another deposition operation described above in connection with FIG. 1, and/or another suitable deposition operation. In some implementations, a seed layer is first deposited, and the bonding layers 216 are deposited on the seed layer. In some implementations, a blanket layer is deposited, and an etch tool 108 is used to etch the blanket layer to form the bonding layers 216.

Figure 5D:
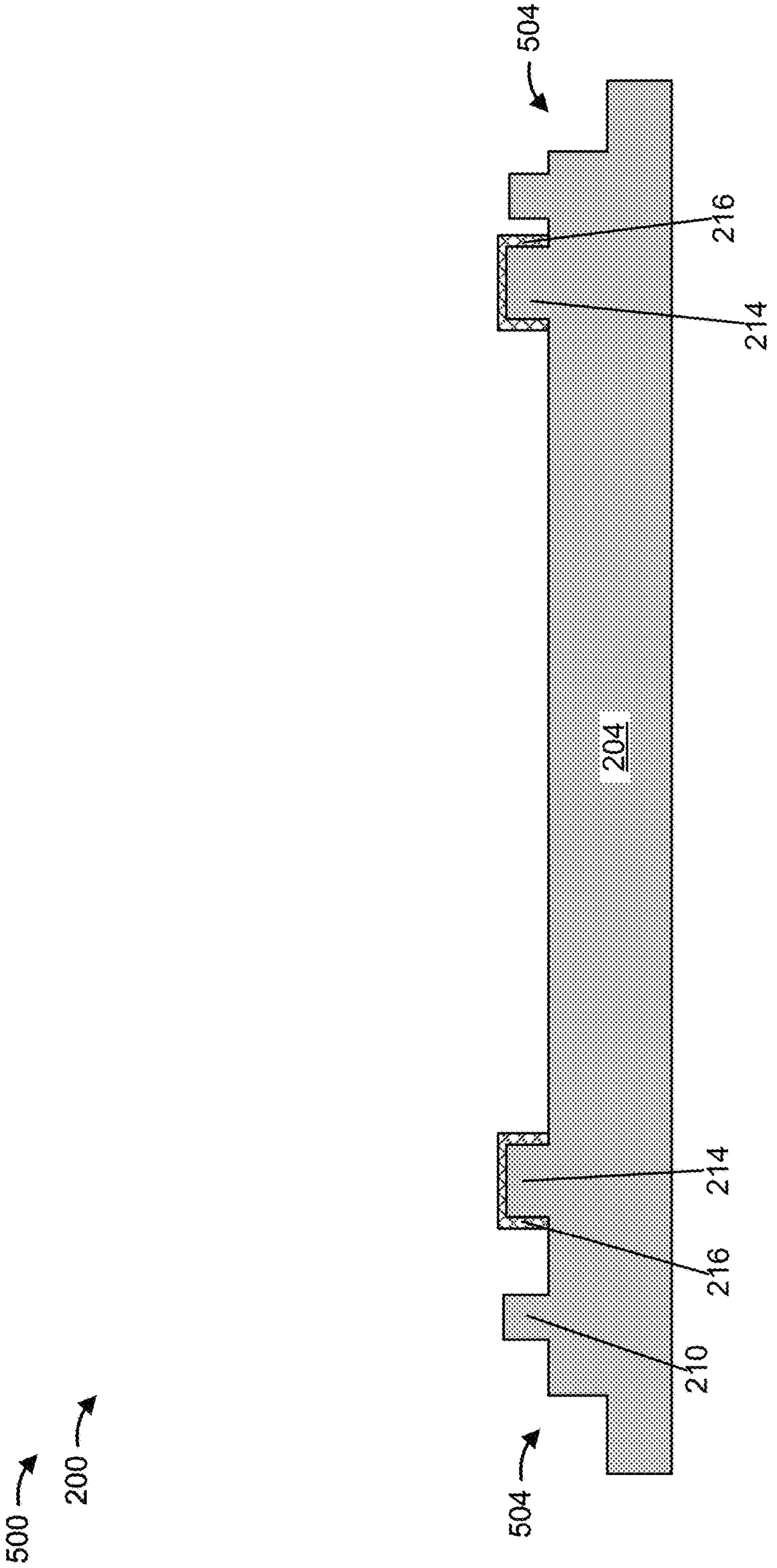

As shown in FIG. 5D, trenches 504 may be formed in the ends of the valve vane 204. The trenches 504 may enable the valve vane 204 to fit over the valve body 202 when the valve vane 204 is bonded to the valve body 202 to form the piezoelectric valve 200. In some implementations, a pattern in a photoresist layer is used to etch the valve vane 204 to form the trenches 504. In these implementations, a deposition tool 102 may be used to form the photoresist layer on the valve vane 204. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the valve vane 204 based on the pattern to form the trenches 504. In some implementations, the etch operation includes a plasma etch operation, a wet chemical etch operation, and/or another type of etch operation. In some implementations, the etch operation includes a DRIE operation or a Bosh etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the valve vane 204 based on a pattern. In some implementations, the trenches 504 may be formed to a depth of approximately 10 microns to approximately 300 microns. However, other values for the range are within the scope of the present disclosure.

As indicated above, FIGS. 5A-5D are provided as examples. Other examples may differ from what is described with regard to FIGS. 5A-5D.

FIGS. 6A-6F illustrate an example implementation 600 of forming a piezoelectric valve 200 described herein. In some implementations, one or more of the semiconductor processing operations described in connection with FIGS. 6A-6F are performed using one or more of the semiconductor devices 102-114. In some implementations, one or more of the semiconductor processing operations described in connection with FIGS. 6A-6F are performed by another semiconductor processing tool. In some implementations, one or more of the semiconductor operations described in connection with FIGS. 6A-6F are performed after one or more of the semiconductor processing operations described in connection with FIGS. 4A-4F and/or FIGS. 5A-5D.

Figure 6A:
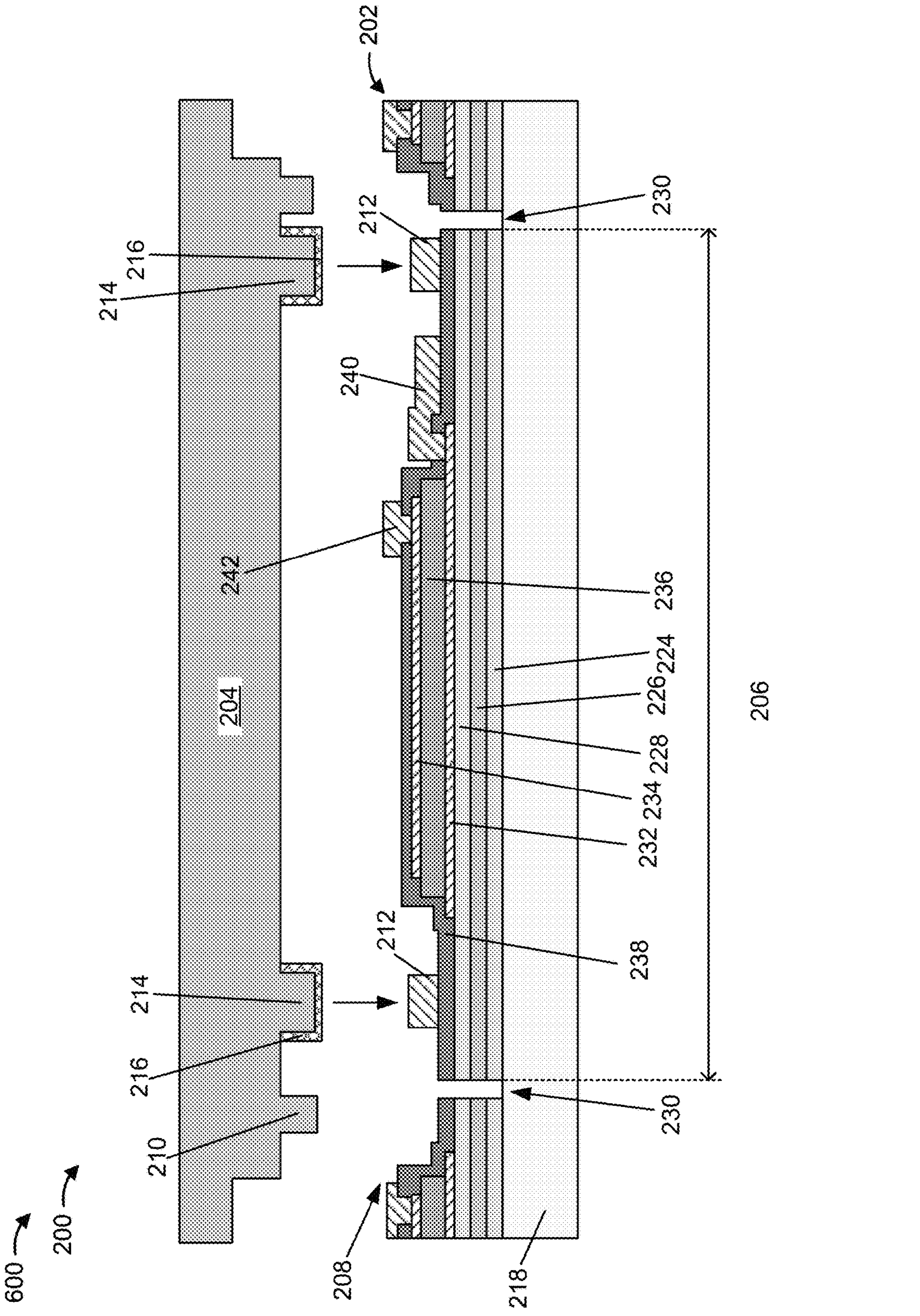
FIGS. 6A-6F illustrate an example implementation of forming a piezoelectric valve described herein.
Figure 6B:
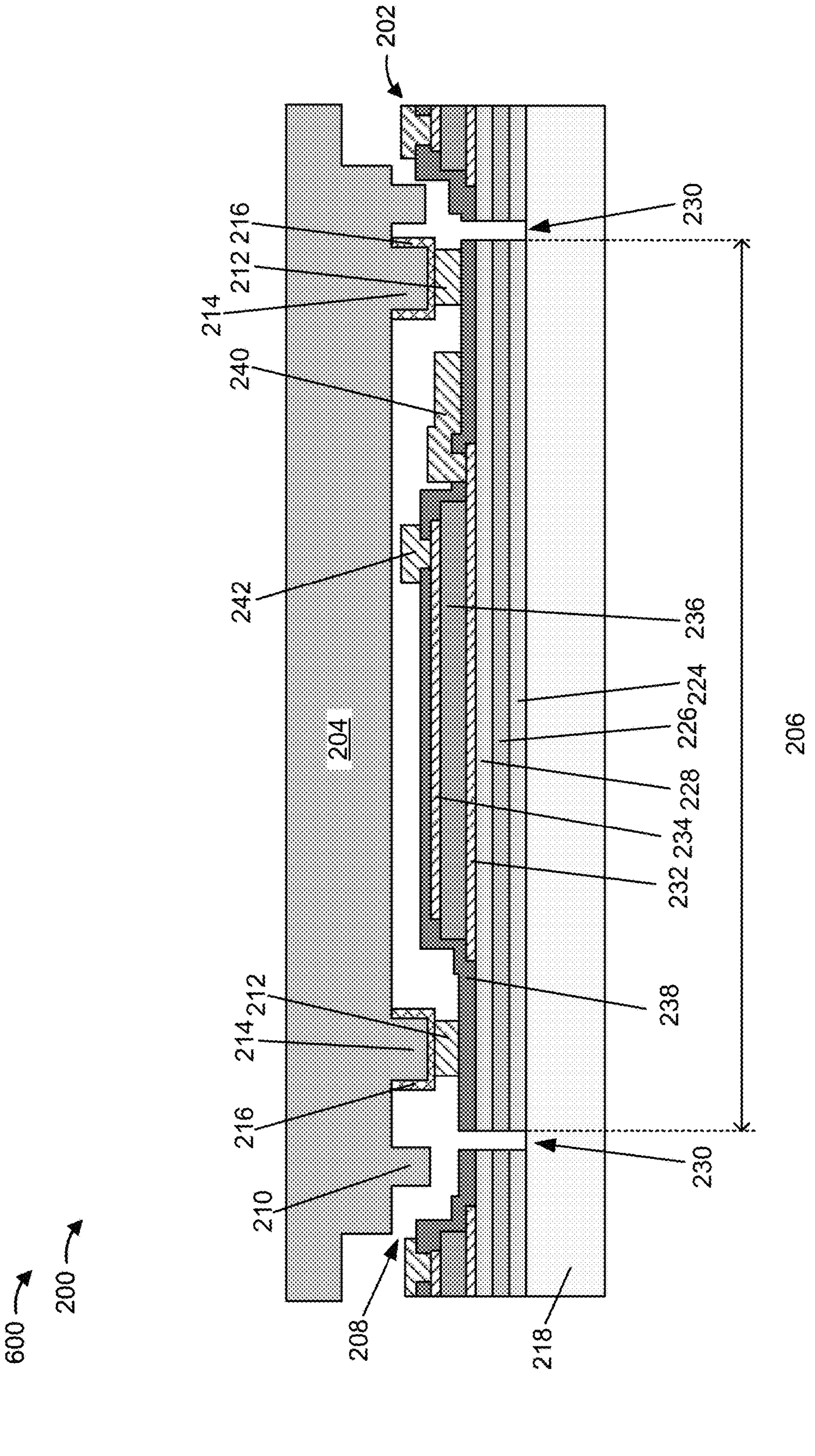

As shown in FIGS. 6A and 6B, the valve vane 204 may be attached to the valve body 202. In particular, the valve vane 204 may be bonded to the valve body 202. The valve vane 204 and the valve body 202 may be bonded at the bonding pads 212 on the valve body 202 and at the standoff pads 214 on the valve vane 204. The bonding layer 216 on the standoff pads 214 may facilitate and/or promote bonding of the bonding pads 212 and the standoff pads 214.

The bonding tool 114 may be used to bond the valve vane 204 and the valve body 202. The bonding tool 114 may perform a eutectic bonding operation, a metal-to-metal bonding operation, a dielectric-to-dielectric bonding operation, a hybrid bonding operation (which may include a combination of metal-to-metal bonding and dielectric-to-dielectric bonding), a fusion bonding operation (also referred to as direct bonding), and/or another type of bonding operation to bond the valve vane 204 and the valve body 202.

Figure 6C:
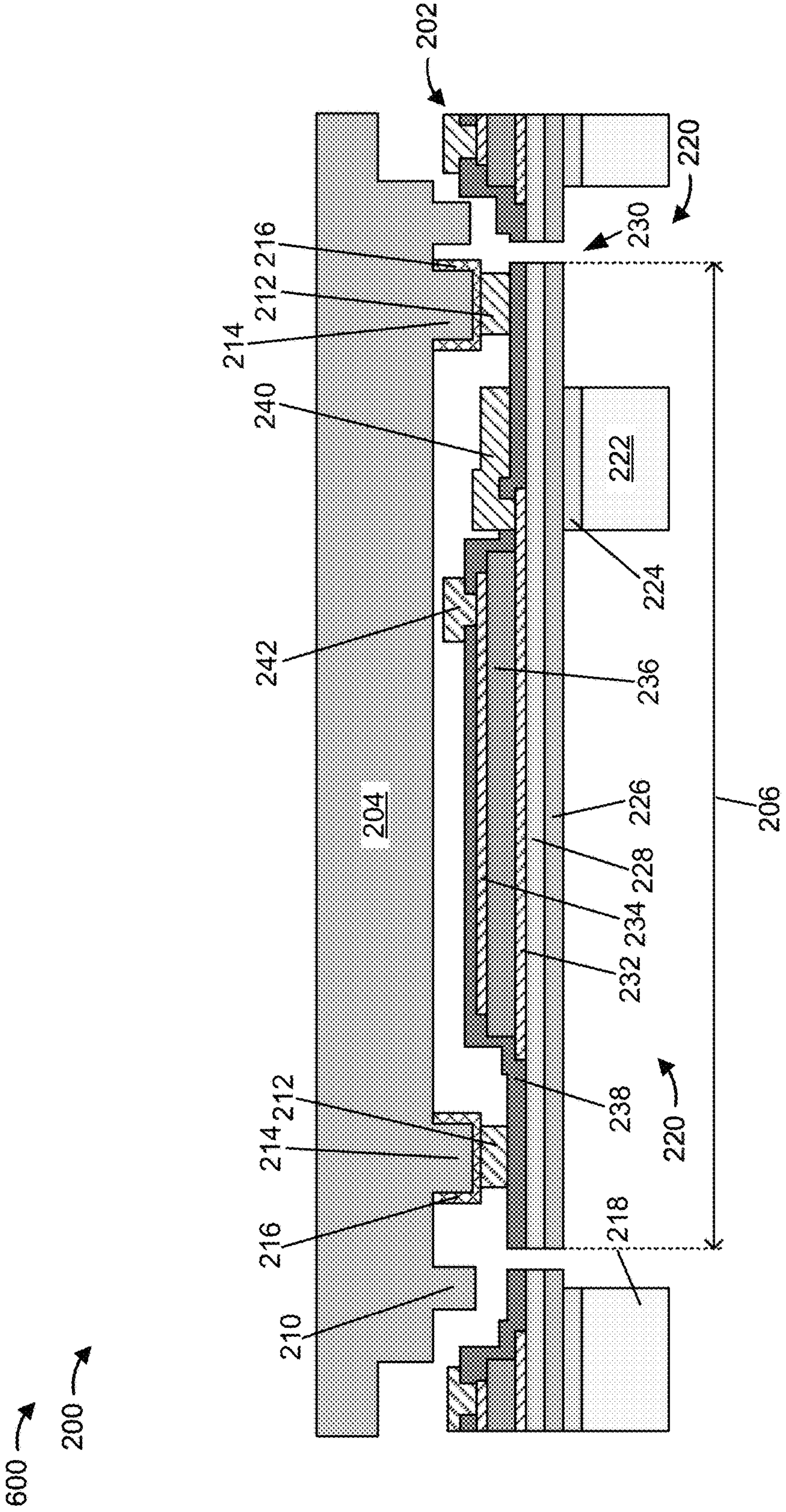

As shown in FIG. 6C, portions of the substrate 218 and portions of the buried oxide layer 226 may be removed to form the backside cavity 220 and the fulcrum structure 222 in the substrate 218. The portions of the substrate 218 and portions of the buried oxide layer 226 may be removed from the backside of the substrate 218, which releases the valve actuator 206 from the substrate 218. In some implementations, a pattern in a photoresist layer is used to etch the substrate 218 and the buried oxide layer 226 to remove the portions of the substrate 218 and portions of the buried oxide layer 226. In these implementations, a deposition tool 102 may be used to form the photoresist layer on the backside of the substrate 218. An exposure tool 104 may be used to expose the photoresist layer to a radiation source to pattern the photoresist layer. A developer tool 106 may be used to develop and remove portions of the photoresist layer to expose the pattern. The etch tool 108 may be used to etch the substrate 218 and the buried oxide layer 226 based on the pattern to remove the portions of the substrate 218. In some implementations, the etch operation includes a plasma etch operation, a wet chemical etch operation, and/or another type of etch operation. In some implementations, the etch operation includes a DRIE operation or a Bosh etch operation (e.g., an etch operation that includes a plurality of deposition and etch cycles). In some implementations, a photoresist removal tool may be used to remove the remaining portions of the photoresist layer (e.g., using a chemical stripper, plasma ashing, and/or another technique). In some implementations, a hard mask layer is used as an alternative technique for etching the substrate 218 and the buried oxide layer 226 based on a pattern.

Prior to removing the portions of the substrate 218, a wafer grinding operation may be performed to thin the substrate 218 (e.g., to reduce the thickness of the substrate 218). The substrate 218 may be thinned to reduce the processing time and/or etchant consumption of the etch operation to remove the portions of the substrate 218. A planarization tool 110 (e.g., a grinding tool) may perform a wafer grinding operation to mechanically grind silicon material away from the substrate 218.

Figure 6D:
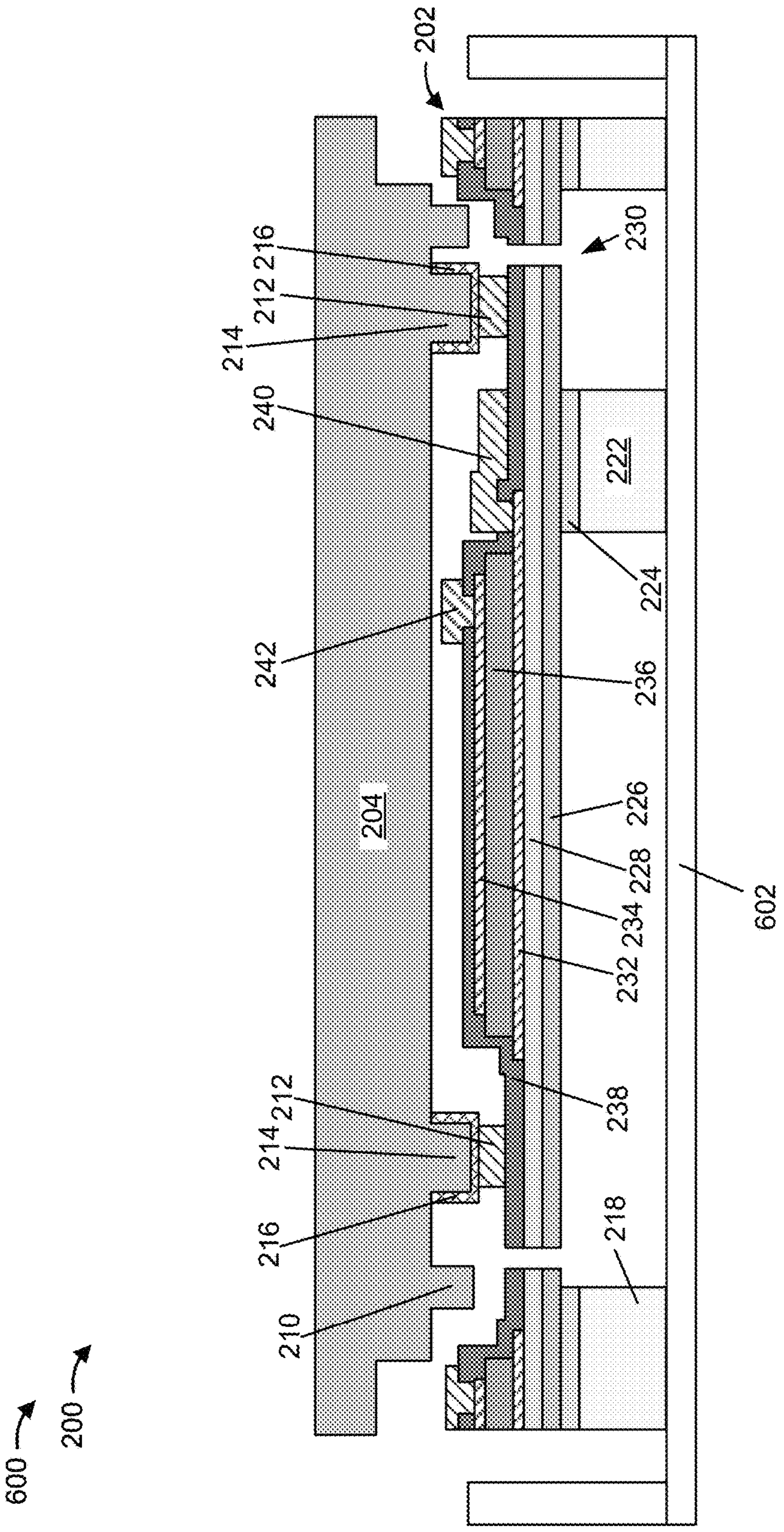

As shown in FIG. 6D, the piezoelectric valve 200 may be positioned on a frame 602 for further processing. The frame 602 may support the piezoelectric valve 200 during subsequent semiconductor processing operations.

Figure 6E:
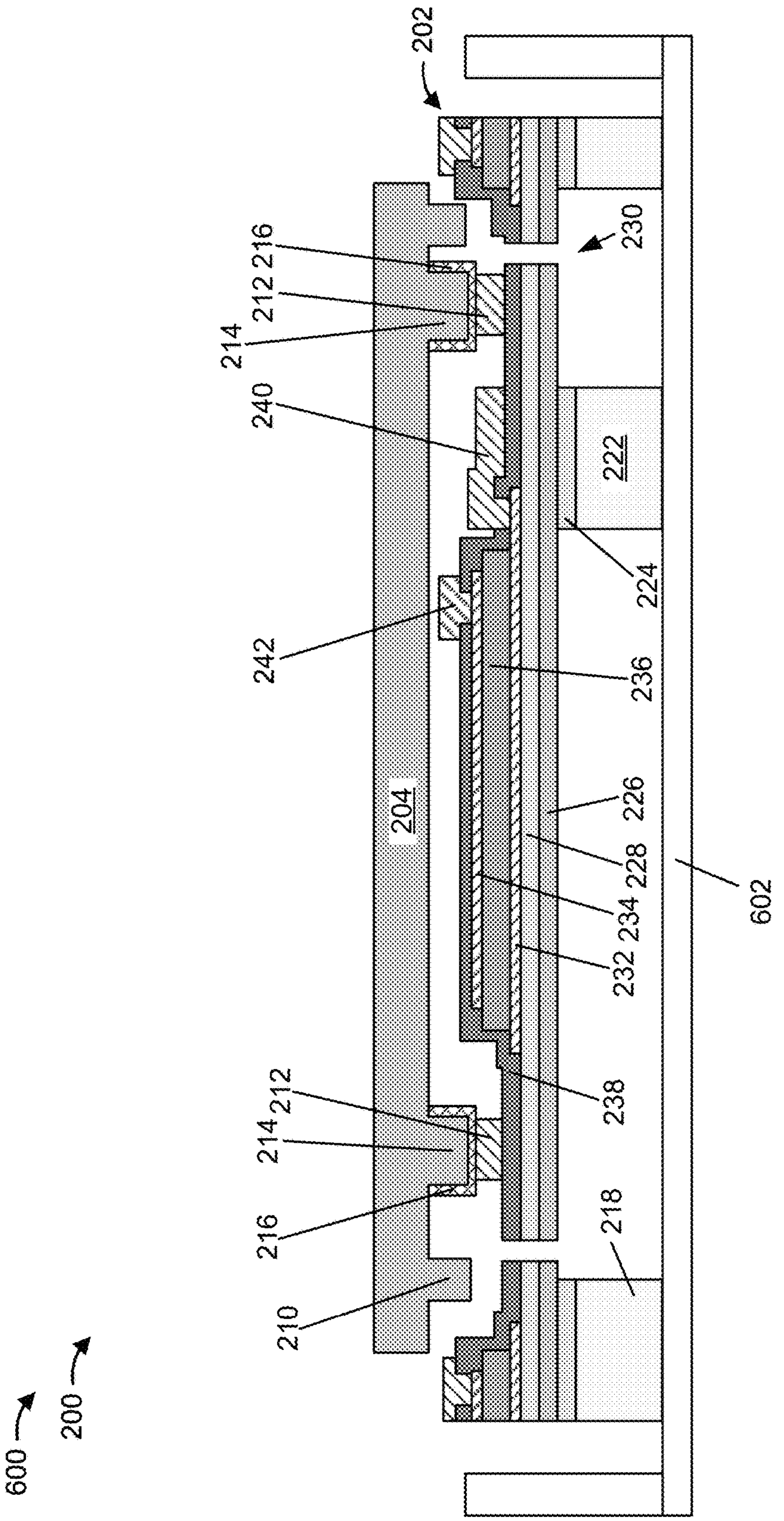

As shown in FIG. 6E, a wafer grinding operation may be performed to thin the valve vane 204 (e.g., to reduce the thickness of the valve vane 204). The valve vane 204 may be thinned such that the overall height of the piezoelectric valve 200 satisfies a height threshold. The height threshold may correspond to a design parameter for a particular package or application for the piezoelectric valve 200, among other examples. A planarization tool 110 (e.g., a grinding tool) may perform the wafer grinding operation to mechanically grind silicon material away from the valve vane 204. In some implementations, a thickness of the valve vane 204 after the wafer grinding operation may be included in a range of approximately 10 microns to approximately 300 microns. If the thickness of the valve vane 204 is less than approximately 10 microns, the valve vane 204 may not have sufficient rigidity or stiffness to prevent fluid from flowing through the valve port 208, whereas the valve vane 204 may have sufficient rigidity to prevent fluid from flowing through the valve port 208 if the thickness is at least approximately 10 microns. If the thickness of the valve vane 204 is greater than approximately 300 microns, the weight of the valve vane 204 may prevent the valve actuator 206 from lifting the valve vane 204, whereas the valve vane 204 valve actuator 206 may be able to sufficiently lift the valve vane 204 if the thickness is up to approximately 300 microns. However, other values for the thickness of the valve vane 204, and ranges other than approximately 10 microns to approximately 300 microns are within the scope of the present disclosure.

Figure 6F:
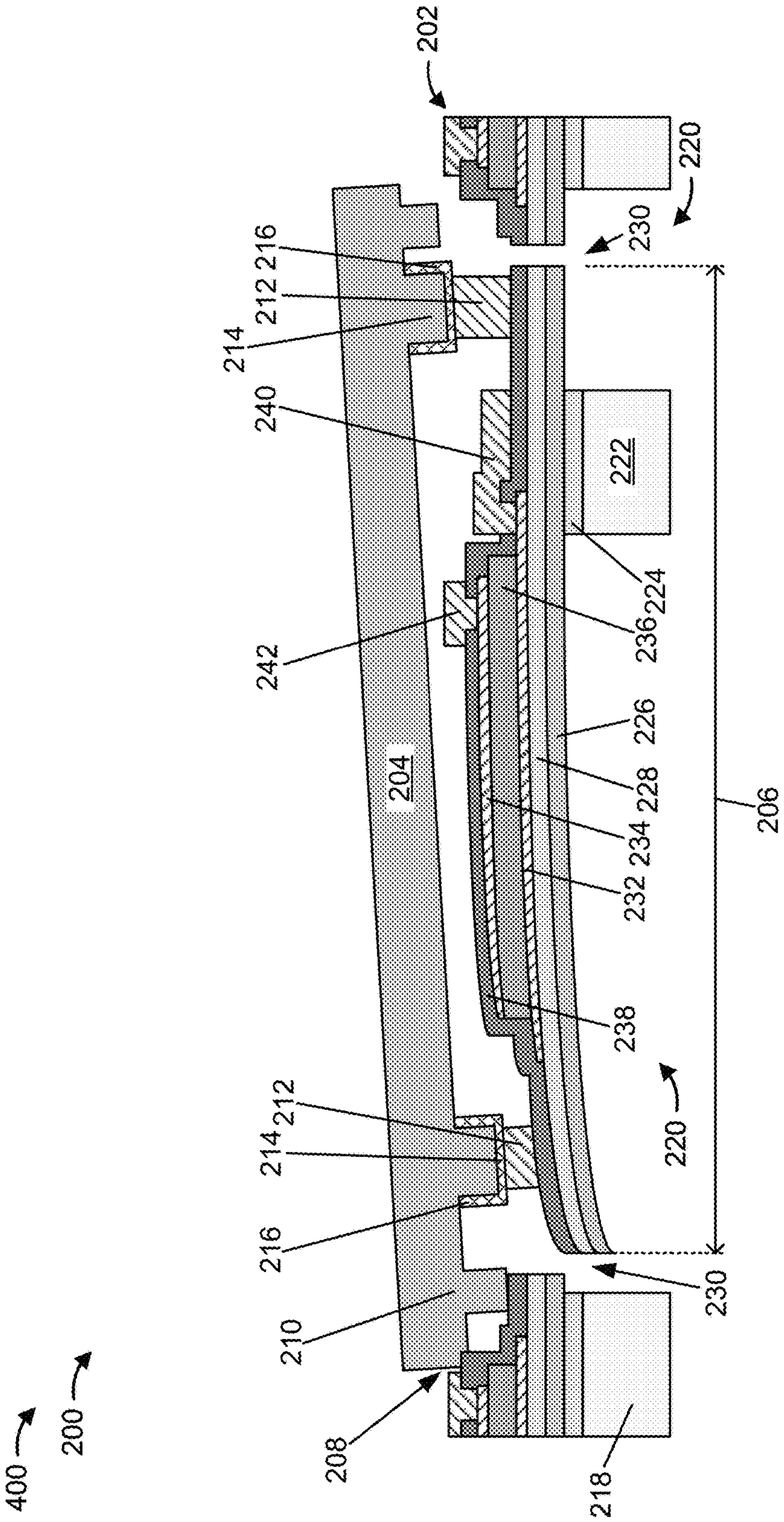

As shown in FIG. 6F, the piezoelectric valve 200 may be diced (e.g., from the SOI wafer 402) and packaged. In this way, the piezoelectric valve 200 may be manufactured such that the piezoelectric valve 200 is a normally closed piezoelectric valve. The piezoelectric valve 200 may be in the closed configuration 300 (e.g., the normally closed configuration) in which the valve vane 204 is biased against the valve body 202 without an electrical input applied to the valve actuator 206. The CTE mismatches between the isolation layer 228 and the bottom electrode 232, the CTE mismatches between the piezoelectric-based actuation layer 236 and the bottom electrode 232 and the top electrode 234, and/or the CTE mismatches between the IMD layer 238 and the top electrode 234 may result in bending of the valve actuator 206, which biases the valve vane 204 against the valve body 202.

As indicated above, FIGS. 6A-6F are provided as examples. Other examples may differ from what is described with regard to FIGS. 6A-6F.

Figure 7A:
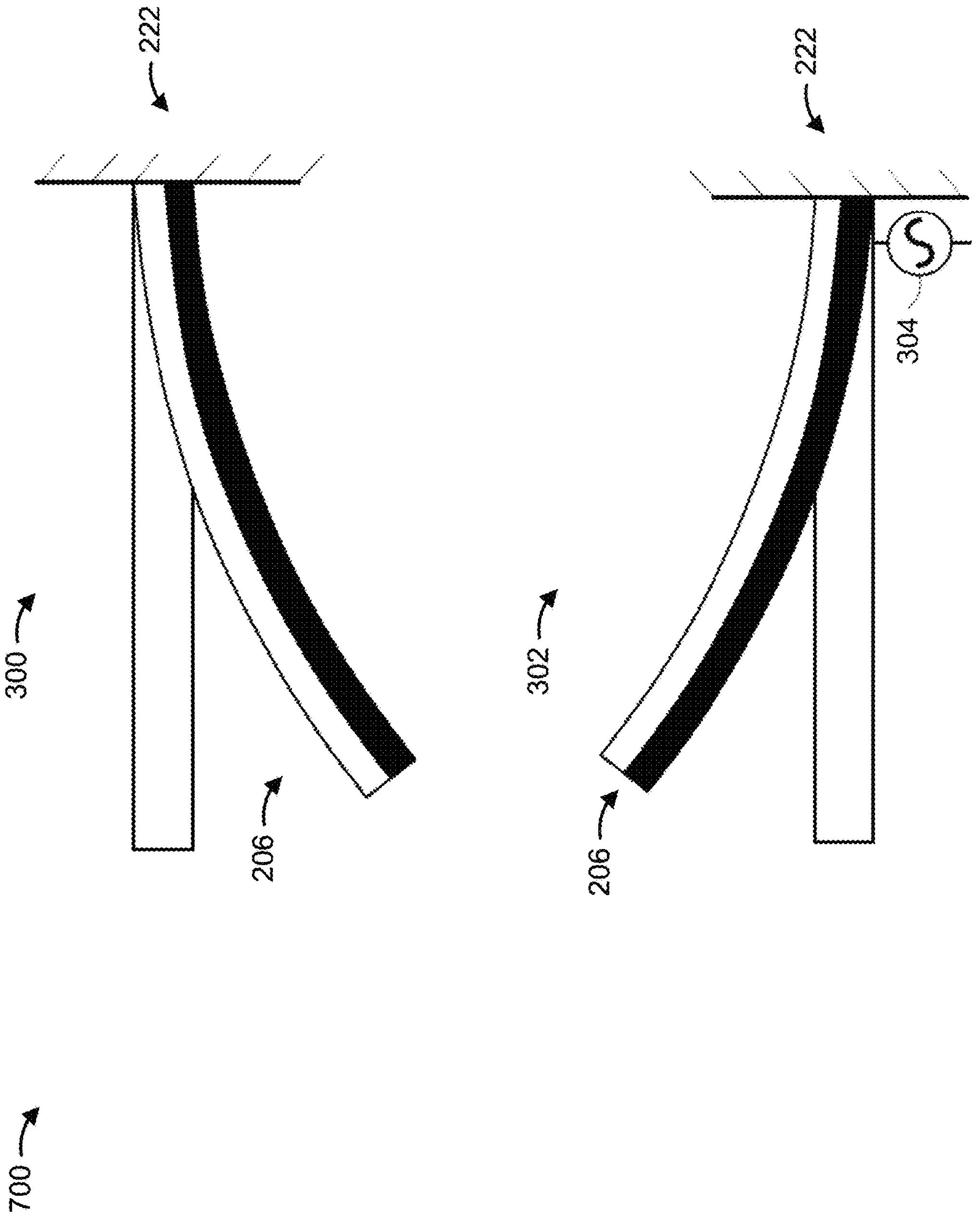
FIGS. 7A-7C are diagrams of example implementations of a valve actuator described herein.
Figure 7B:
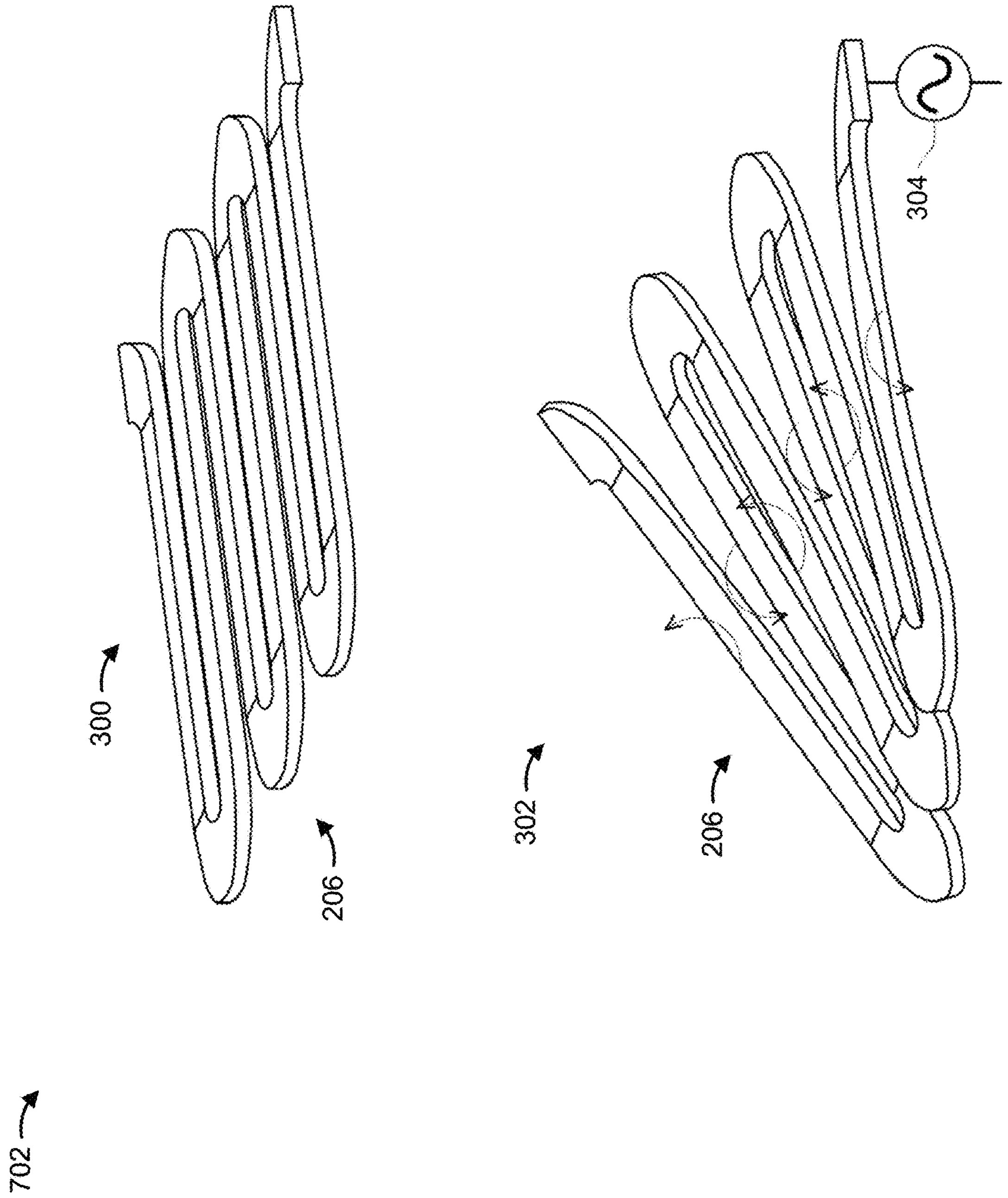
Figure 7C:
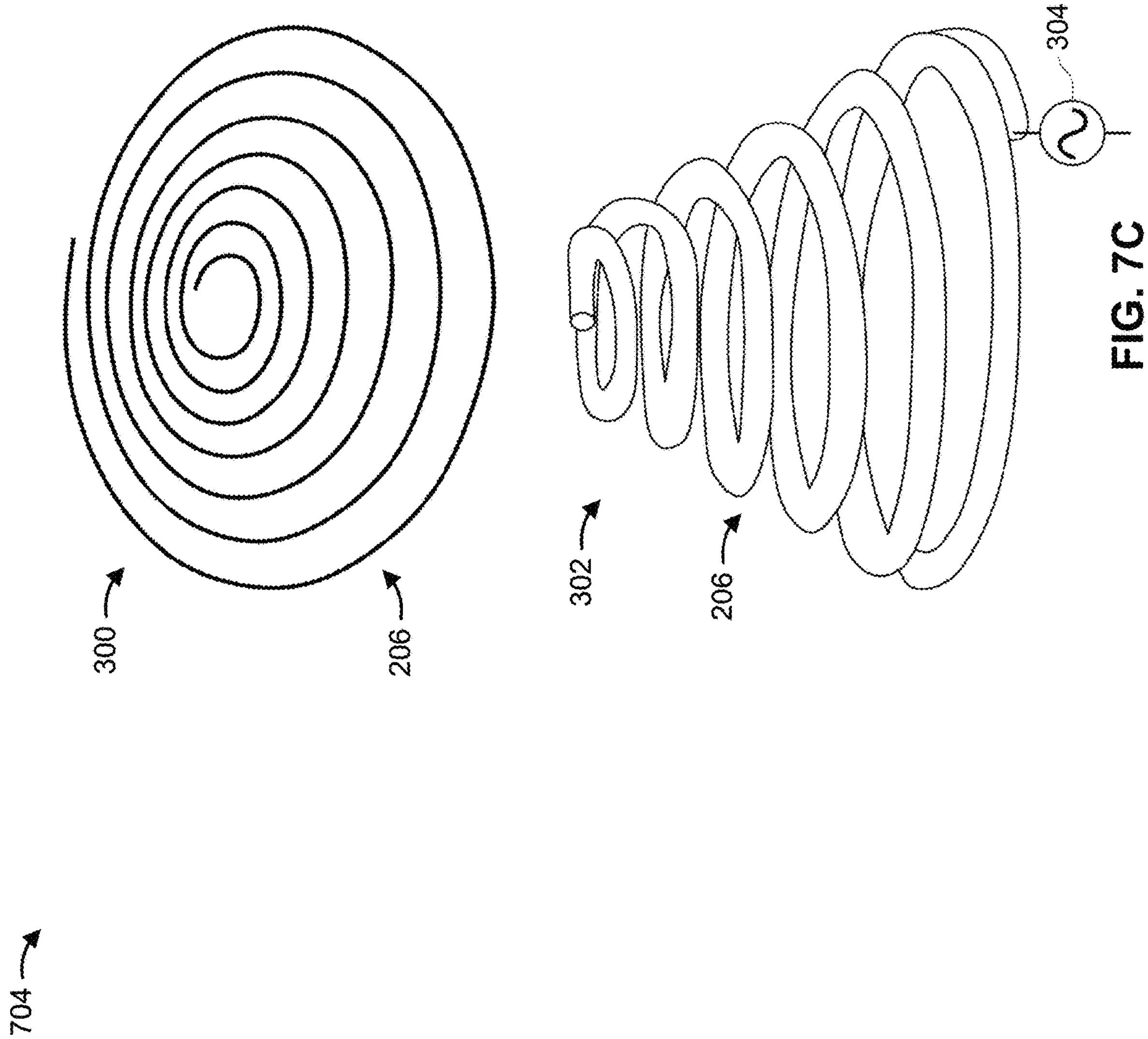

FIGS. 7A-7C are diagrams of example implementations of a valve actuator 206 described herein. The example implementations of the valve actuator 206 illustrated in FIGS. 7A-7C may be included in a piezoelectric valve, such as the piezoelectric valve 200, a piezoelectric valve 800 described in connection with FIGS. 8A and 8B, and/or another piezoelectric valve.

FIG. 7A illustrates an example implementation 700 in which a valve actuator 206 includes an actuation lever that is cantilevered by the fulcrum structure 222. As further shown in FIG. 7A, in a closed configuration 302, the valve actuator 206 may be deflected downward, and the valve actuator 206 may be deflected upward in the open configuration 302 when the electrical input is applied to the valve actuator 206.

FIG. 7B illustrates an example implementation 702 in which a valve actuator 206 includes a rotational actuation lever. As further shown in FIG. 7B, in a closed configuration 302, the valve actuator 206 may be approximately flat, and the valve actuator 206 may be partially rotated and deflected upward in the open configuration 302 when the electrical input is applied to the valve actuator 206.

FIG. 7C illustrates an example implementation 704 in which a valve actuator 206 includes an actuation spring. As further shown in FIG. 7C, in a closed configuration 302, the valve actuator 206 may be approximately flat, and the valve actuator 206 may be extended in the open configuration 302 when the electrical input is applied to the valve actuator 206.

As indicated above, FIGS. 7A-7C are provided as examples. Other examples may differ from what is described with regard to FIGS. 7A-7C.

Figure 8A:
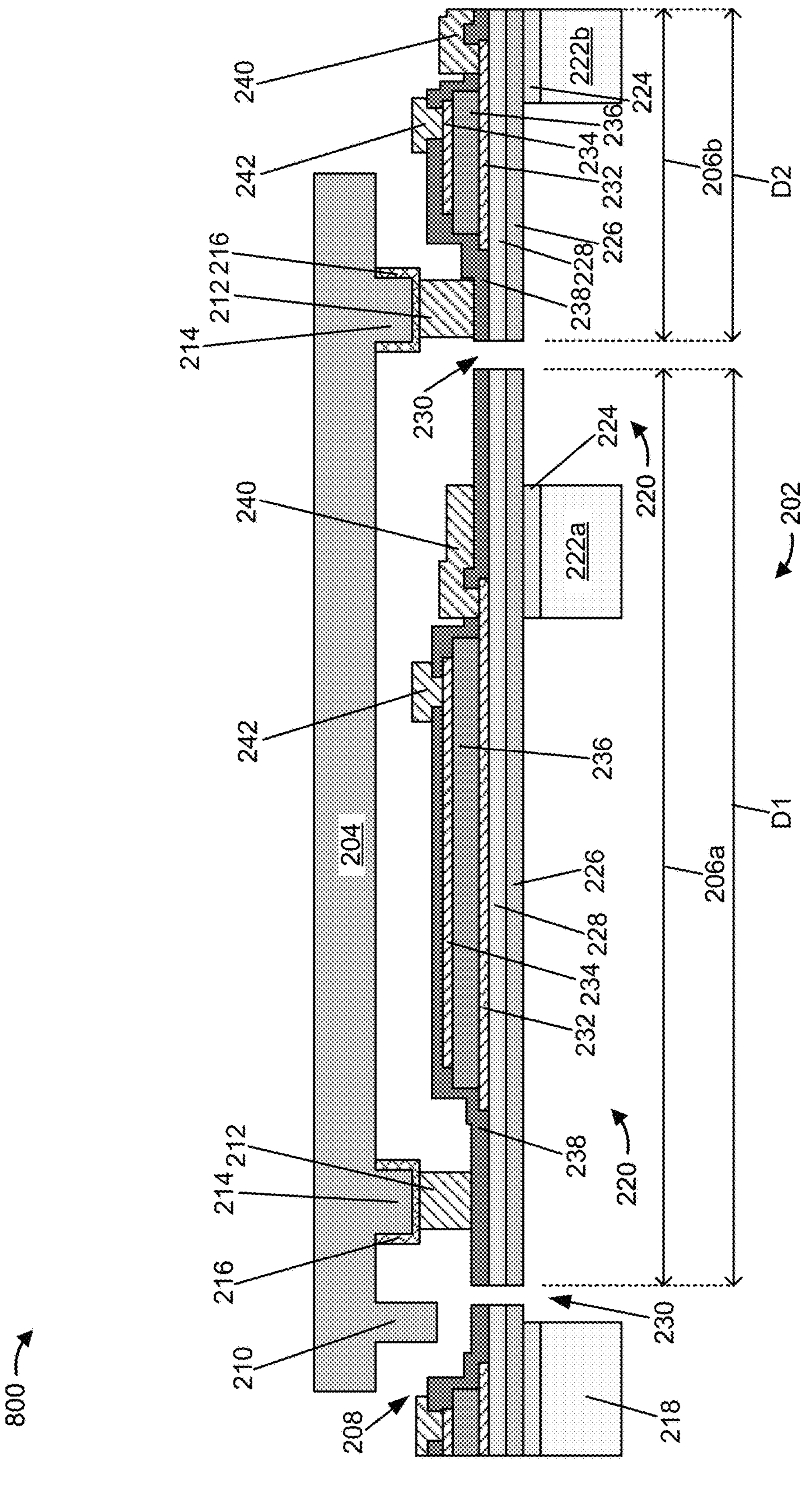
FIGS. 8A-8D are diagrams of an example piezoelectric valve described herein.
Figure 8B:
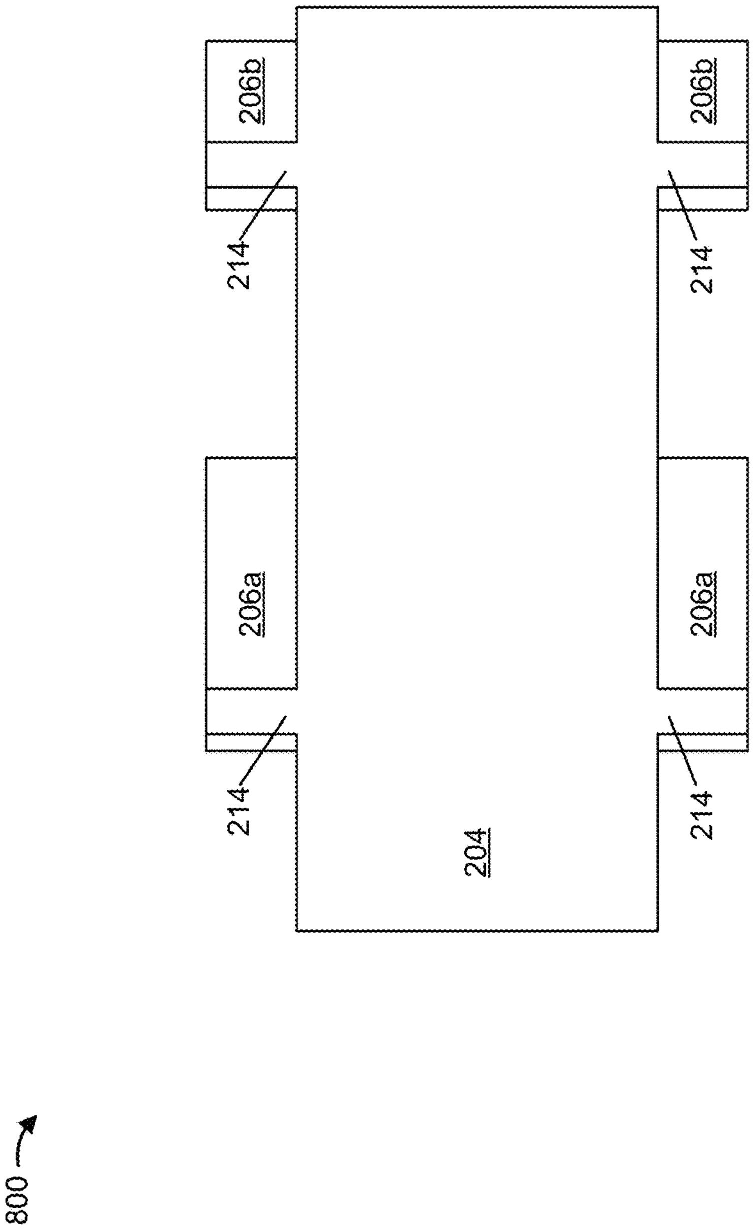
Figure 8C:
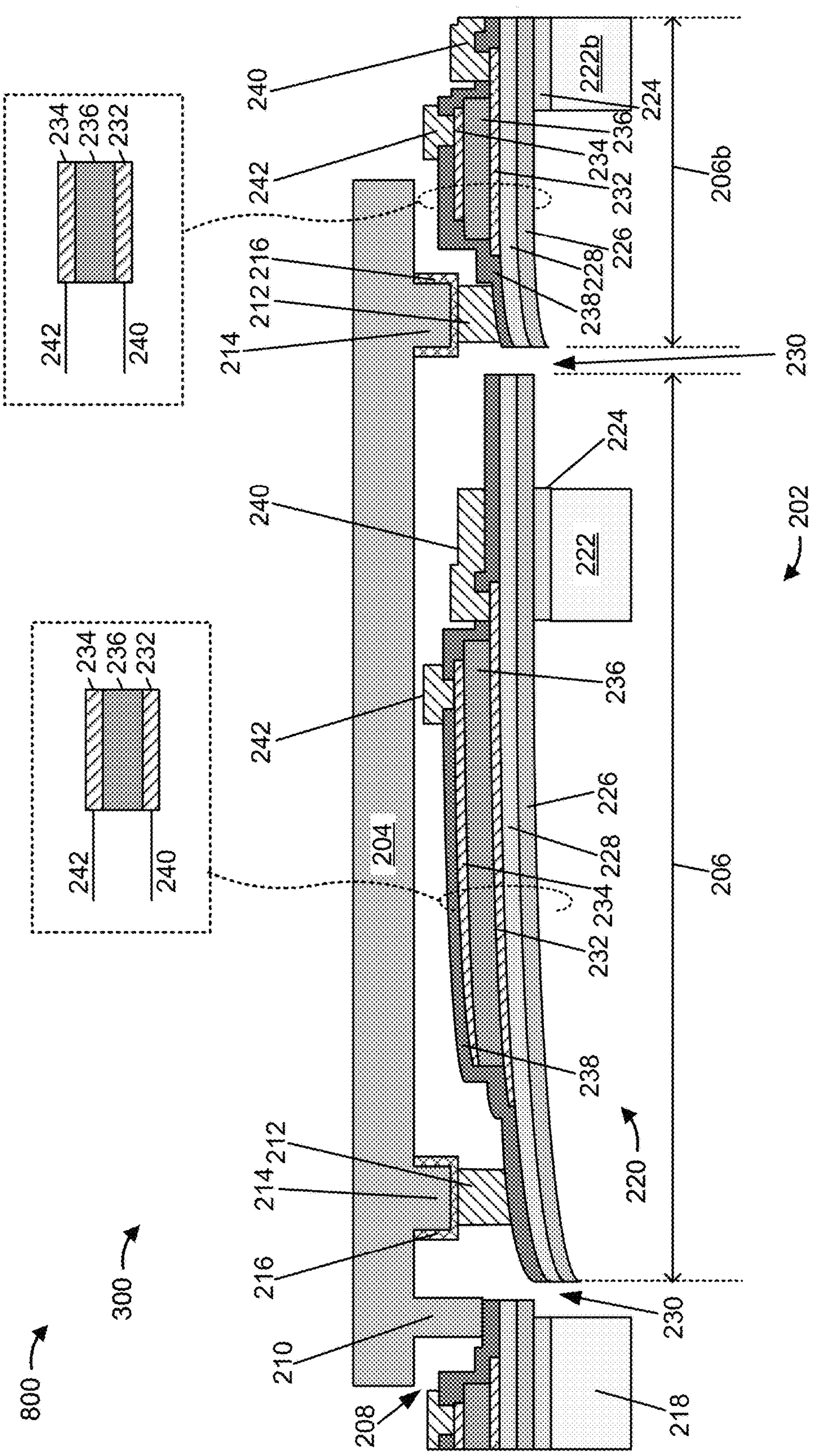
Figure 8D:
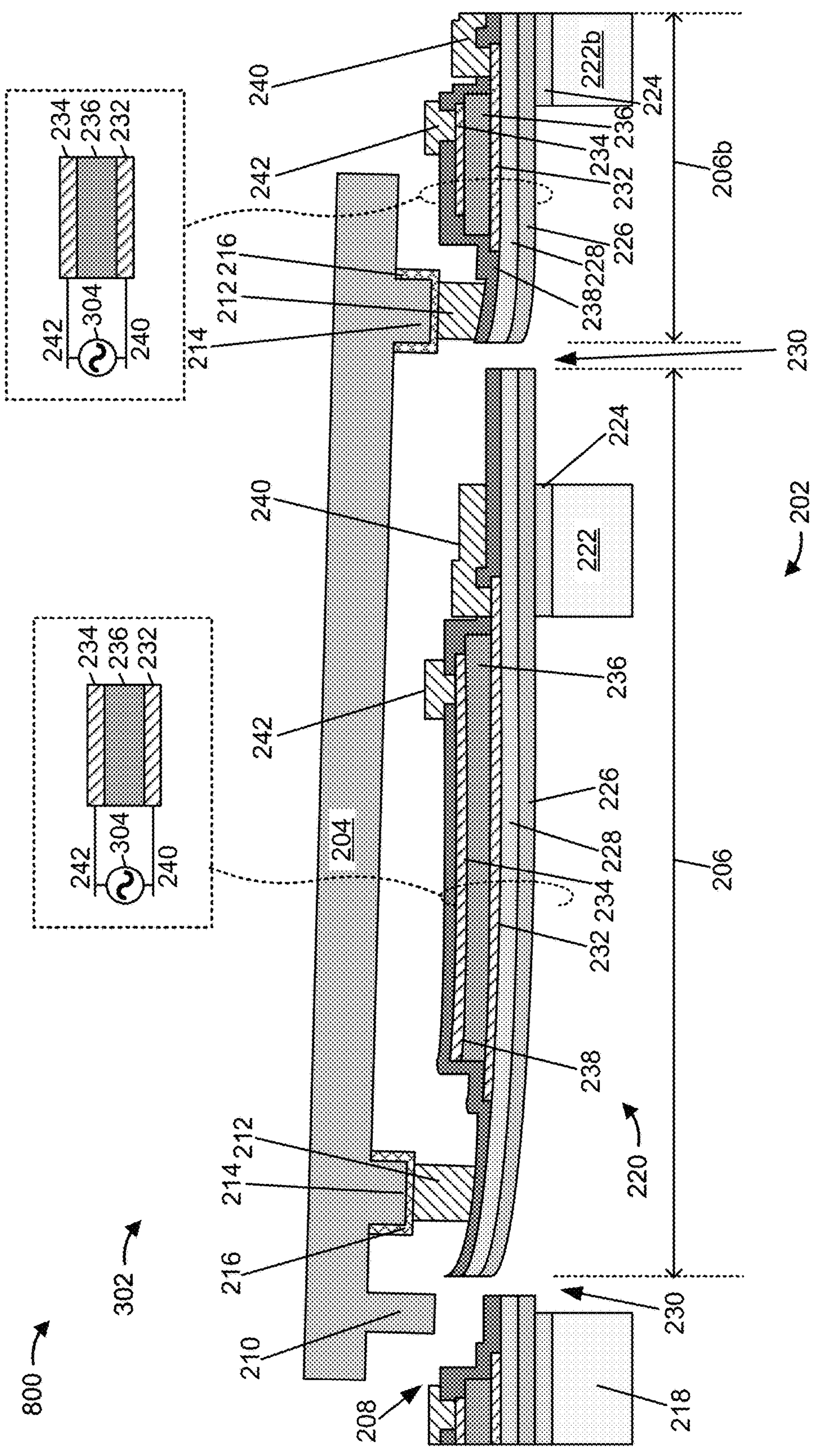

FIGS. 8A8D are diagrams of an example piezoelectric valve 800 described herein. FIG. 8A illustrates a cross-section view of the piezoelectric valve 800, and FIG. 8B illustrates a top-down view of the piezoelectric valve 800.

As shown in FIG. 8A, the piezoelectric valve 800 may include a similar combination and arrangement of components 202-242 as the piezoelectric valve 200. However, the piezoelectric valve 200 includes a plurality of valve actuators 206, including a valve actuator 206*a* and a valve actuator 206*b*. The valve actuator 206*a* and the valve actuator 206*b* may enable compound actuation of the valve vane 204, which enables precise movement of the valve vane 204 and/or may enable wider or greater opening of the valve port 208 (e.g., relative to a single valve actuator piezoelectric valve).

The valve actuators 206*a* and 206*b* may include a similar arrangement of layers and/or structures as the valve actuator 206 illustrated and described in connection with FIG. 2A. For example, the valve actuator 206*a* may include a portion of the buried oxide layer 224, a portion of the semiconductor layer 226, a portion of the isolation layer 228, a bottom electrode 232, a top electrode 234, a piezoelectric-based actuation layer 236 between the bottom electrode 232 and the top electrode 234, and a portion of the IMD layer 238. The valve actuator 206*b* may similarly include a portion of the buried oxide layer 224, a portion of the semiconductor layer 226, a portion of the isolation layer 228, a bottom electrode 232, a top electrode 234, a piezoelectric-based actuation layer 236 between the bottom electrode 232 and the top electrode 234, and a portion of the IMD layer 238. The valve actuators 206*a* and 206*b* may also include respective bottom contact structures 240 and respective top contact structures 242. Compressive film stresses in one or more layers of the valve actuator 206*a* (e.g., in the isolation layer 228, in the piezoelectric-based actuation layer 236, and/or in the IMD layer 238), and compressive film stresses in one or more layers of the valve actuator 206*b* (e.g., in the isolation layer 228, in the piezoelectric-based actuation layer 236, and/or in the IMD layer 238) may bias the valve vane 204 against the valve body 202 in a closed configuration 300, similar to the piezoelectric valve 200 shown in FIG. 3A. The valve actuator 206*a* may be supported and deflected relative to a fulcrum structure 222*a* in the substrate 218, and the valve actuator 206*b* may be supported and deflected relative to a fulcrum structure 222*b* in the substrate 218.

As further shown in FIG. 8A, the valve vane 204 may be bonded and/or otherwise attached to the valve actuator 206*a* at a first bonding pad 212 of the valve actuator 206*a*. The valve vane 204 may be bonded to the first bonding pad 212 at a first standoff pad 214 and a first bonding layer 216. The valve vane 204 may be bonded and/or otherwise attached to the valve actuator 206*b* at a second bonding pad 212 of the valve actuator 206*b*. The valve vane 204 may be bonded to the second bonding pad 212 at a second standoff pad 214 and a second bonding layer 216. Attaching the valve vane 204 to both of the valve actuators 206*a* and 206*b* enables independent movement of opposing ends of the valve vane 204, which enables the compound actuation of the valve vane 204. In some implementations, a length of the valve actuator 206*a* (corresponding to dimension D1 in FIG. 8A) is greater than a length of the valve actuator 206*b* (corresponding to dimension D2 in FIG. 8A). The greater length of the valve actuator 206*a* may enable the valve actuator 206*a* to lift the first end of the valve vane 204 at which the valve stopper 210 is located to a greater height than the second end of the valve vane 204 that is lifted by the valve actuator 206*b*. This may enable wider or greater opening of the valve port 208 (e.g., relative to a single valve actuator piezoelectric valve). In some implementations, the length of the valve actuator 206*a* (dimension D1) and the length of the valve actuator 206*b* (dimension D2) are approximately a same length. In other implementations, the length of the valve actuator 206*b* (dimension D2) is greater than the length of the valve actuator 206*a* (dimension D1).

FIG. 8B illustrates a top-down view of the piezoelectric valve 800. As shown in FIG. 8B, the valve vane 204 may include an approximate rectangular shape in the top-down view of the piezoelectric valve 800. In other implementations, the valve vane 204 may include another shape, such as an approximate square shape, an approximate circular shape, an approximate spiral shape, an approximate ring shape, an irregular shape, and/or another shape. The standoff pads 214 may extend laterally outward from sides of the valve vane 204 and over one or more valve actuators 206*a* and one or more valve actuators 206*b*. In some implementations, the piezoelectric valve 800 includes a plurality of valve actuators 206*a* and/or a plurality of valve actuators 206*b*. For example, the piezoelectric valve 800 may include a first plurality of valve actuators 206*a* that are coupled with respective first standoff pads 214 at a first end and on opposing sides of the valve vane 204, and a plurality of valve actuators 206*b* that are coupled with a plurality of second standoff pads 214 at a second end (opposing the first end) and on opposing sides of the valve vane 204. The valve actuators 206*a* and 206*b* may include elongated structures that extend approximately parallel with the valve vane 204.

The piezoelectric valve 800 may be formed using semiconductor processing techniques and processes described in connection with FIGS. 4A-4F, 5A-5D, and/or 6A-6F. During the operation to form the slits 230 through the IMD layer 238 (illustrated in FIG. 4F), the isolation layer 228, the semiconductor layer 226, and the buried oxide layer 224, additional slits 230 may be formed to define the valve actuator 206*a* and the valve actuator 206*b*. Moreover, during the operation to remove portions of the substrate 218 (illustrated in FIG. 6C), additional portions of the substrate 218 may be removed to define the fulcrum structures 222*a* and 222*b*, and to release the valve actuator 206*a* and the valve actuator 206*b*.

FIGS. 8C and 8D are diagrams of example configurations of the piezoelectric valve 800 described herein. FIG. 8C illustrates a closed configuration 300 and FIG. 8D illustrates an opened configuration 302.

As shown in FIG. 8C, in the closed configuration 800 the valve stopper 210 of the valve vane 204 is pressed against the valve body 202 such that the valve port 208 is closed. In the closed configuration 800, fluid (e.g., a gas, a liquid) is prevented from flowing through the valve port 208. The piezoelectric valve 800 may be manufactured such that the piezoelectric valve 800 is a normally closed piezoelectric valve. In these implementations, the closed configuration 300 is a normally closed configuration in which the valve vane 204 is biased against the valve body 202 without an electrical input applied to the valve actuators 206*a* and 206*b*. An electrical input may be applied to the valve actuators 206*a* and 206*b* (e.g., to the piezoelectric-based actuation layers 236 through the bottom electrodes 232 and/or through the top electrodes 234) to overcome the bias and to open the valve port 208 by moving the valve stopper 210 of the valve vane 204 away from the valve body 202.

As further shown in FIG. 8D, the opened configuration 302 may be achieved by applying an electrical input 304 to the piezoelectric-based actuation layers 236 through the bottom electrodes 232 and/or through the top electrodes 234. The electrical input 304 may include a voltage, an electrical current, and/or another type of electrical input. The electrical input 304 causes the piezoelectric-based actuation layers 236 to transition from compression to tension, which enables the valve actuators 206 to overcome the compressive film stress(es) in the valve actuators 206. In this way, the valve actuators 206 transition from downward deflection (e.g., deflection toward the backside cavities 220) to being deflected or bent upward, which lifts the valve stopper 210 away from the valve body 202 and opens the valve port 208.

As indicated above, FIGS. 8A-8D are provided as examples. Other examples may differ from what is described with regard to FIGS. 8A-8D.

Figure 9A:
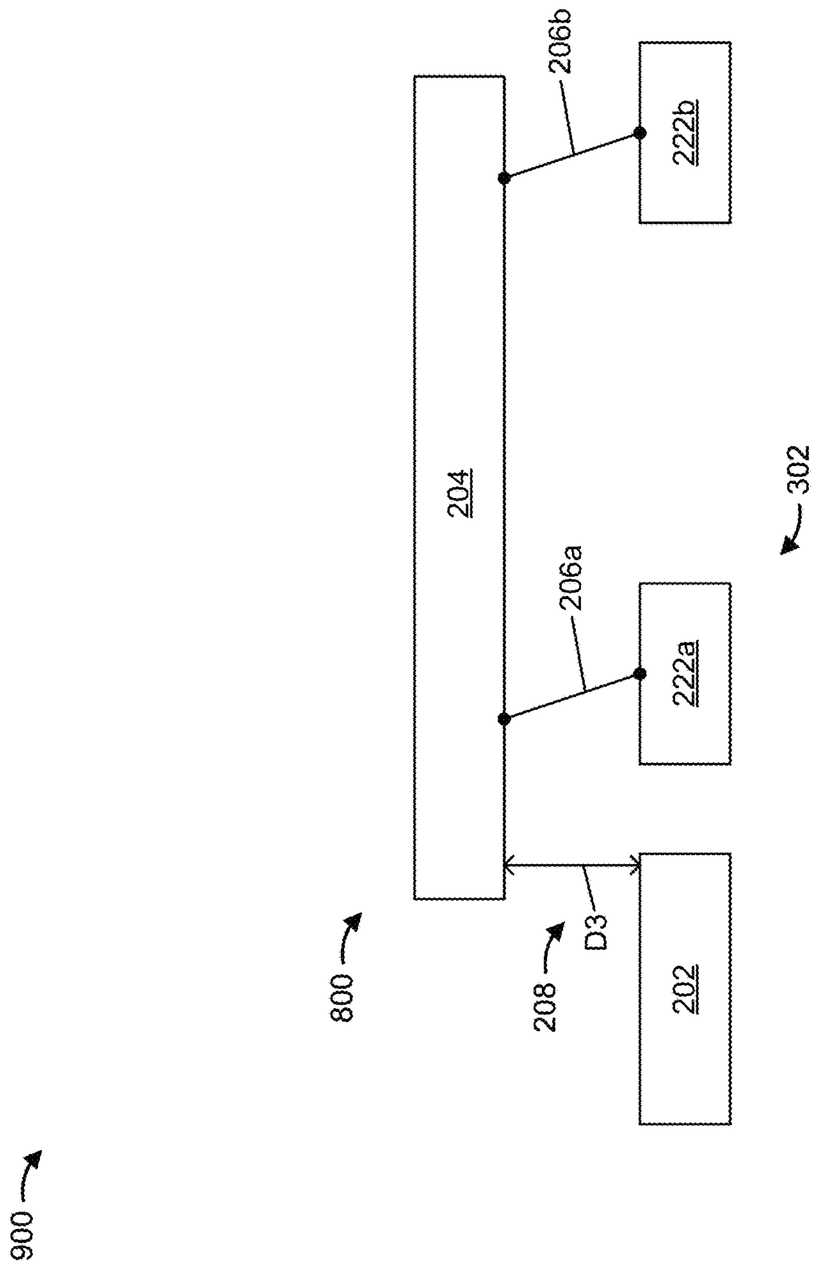
FIGS. 9A and 9B are diagrams of example implementations of actuation of a piezoelectric valve described herein.
Figure 9B:
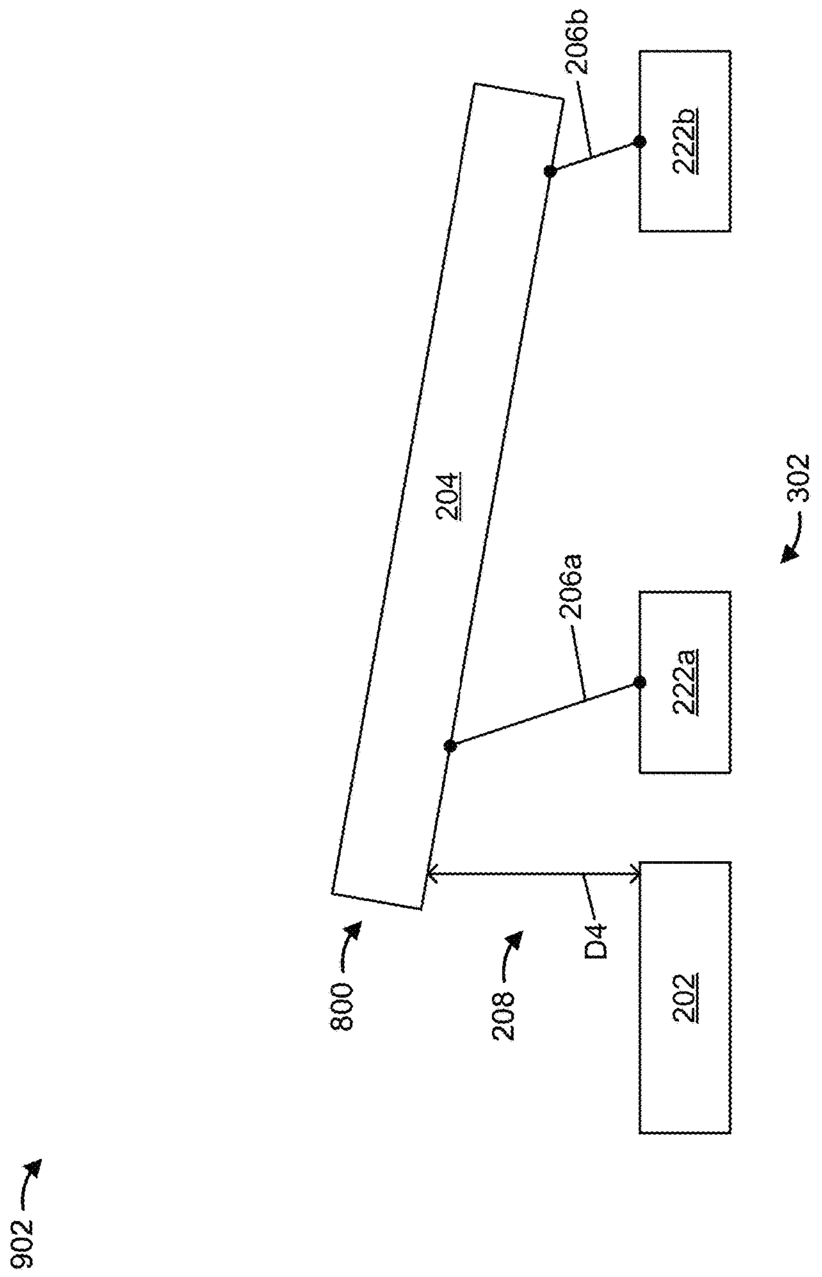

FIGS. 9A and 9B are diagrams of example implementations of actuation of the piezoelectric valve 800 described herein. As shown in an example implementation 900 in FIG. 9A, the valve vane 204 may be lifted away from the valve body 202 of the piezoelectric valve 800 in the open configuration 302 to open the valve port 208. The valve actuator 206*a* may actuate from the fulcrum structure 222*a* and the valve actuator 206*b* may actuate from the fulcrum structure 222*b*. In the example implementation 900 in FIG. 9A, the valve actuator 206*a* and the valve actuator 206*b* lift the valve vane 204 away from the valve body 202 by similar distances such that the valve port 208 is opened to a dimension D3.

As shown in an example implementation 902 in FIG. 9B, the valve vane 204 may be lifted away from the valve body 202 of the piezoelectric valve 800 in the open configuration 302 to open the valve port 208. The valve actuator 206*a* may actuate from the fulcrum structure 222*a* and the valve actuator 206*b* may actuate from the fulcrum structure 222*b*. In the example implementation 902 in FIG. 9B, the valve actuator 206*a* and the valve actuator 206*b* lift the valve vane 204 away from the valve body 202 by different distances. In particular, the valve actuator 206*a* may lift the valve vane 204 away from the valve body 202 by a greater distance than the valve actuator 206*b*. This enables the valve port 208 to be opened to a dimension D4, which is greater than the dimension D3. This enables the effective venting area to be greater for the piezoelectric valve 800. The valve actuator 206*a* may be formed to a greater length (dimension D1) than the length of the valve actuator 206*b* (dimension D2) to enable the valve actuator 206*a* to lift the valve vane 204 away from the valve body 202 by a greater distance than the valve actuator 206*b*.

As indicated above, FIGS. 9A and 9B are provided as examples. Other examples may differ from what is described with regard to FIGS. 9A and 9B.

Figure 10A:
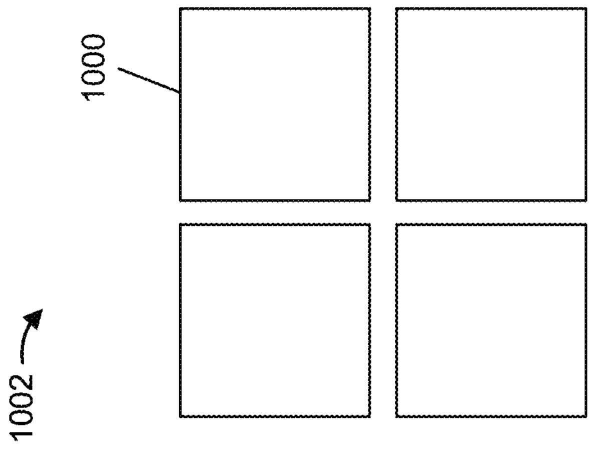
FIGS. 10A-10C are diagrams of example piezoelectric valve array configurations described herein.
Figure 10B:
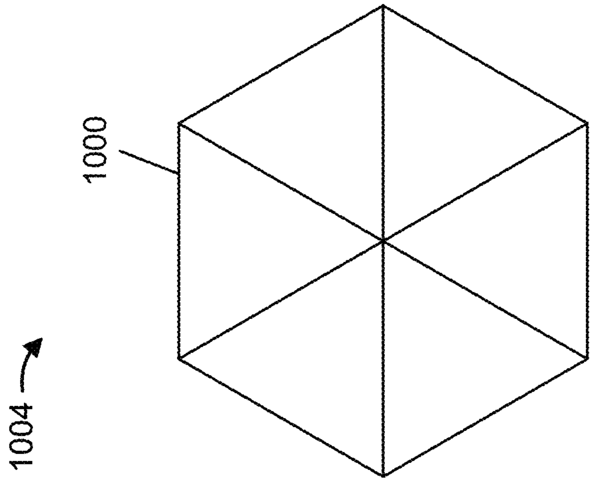
Figure 10C:
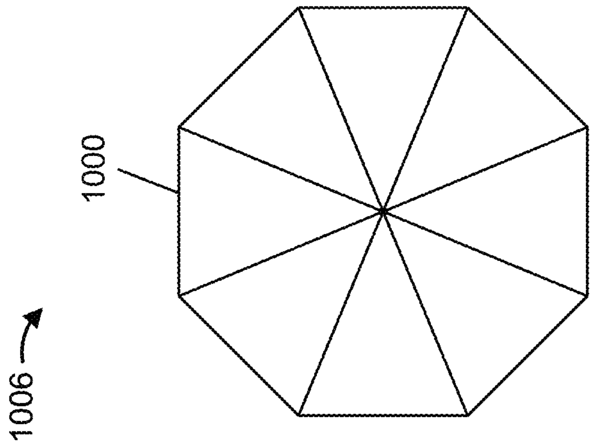

FIGS. 10A-10C are diagrams of example piezoelectric valve array configurations described herein. In some implementations, the piezoelectric valve array configurations described in connection with FIGS. 10A-10C may include a plurality of piezoelectric valves 1000. The piezoelectric valves 1002 may be implemented by piezoelectric valves 200, by piezoelectric valves 800, and/or by a combination of piezoelectric valves 200 and piezoelectric valves 800. In general, the piezoelectric valves 1000 may be arranged in a piezoelectric valve array to improve valve performance and/or to satisfy one or more performance parameters.

FIG. 10A illustrates an example piezoelectric valve array configuration 1002 that includes a plurality of piezoelectric valves 1000. The piezoelectric valves 1000 in the example piezoelectric valve array configuration 1002 may be approximately square shaped piezoelectric valves and may be arranged in a grid pattern.

FIG. 10B illustrates an example piezoelectric valve array configuration 1004 that includes a plurality of piezoelectric valves 1000. The piezoelectric valves 1000 in the example piezoelectric valve array configuration 1004 may be approximately triangular shaped piezoelectric valves and may be arranged in a hexagon pattern.

FIG. 10C illustrates an example piezoelectric valve array configuration 1006 that includes a plurality of piezoelectric valves 1000. The piezoelectric valves 1000 in the example piezoelectric valve array configuration 1006 may be approximately triangular shaped piezoelectric valves and may be arranged in an octagon pattern.

As indicated above, FIGS. 10A-10C are provided as examples. Other examples may differ from what is described with regard to FIGS. 10A-10C.

Figure 11:
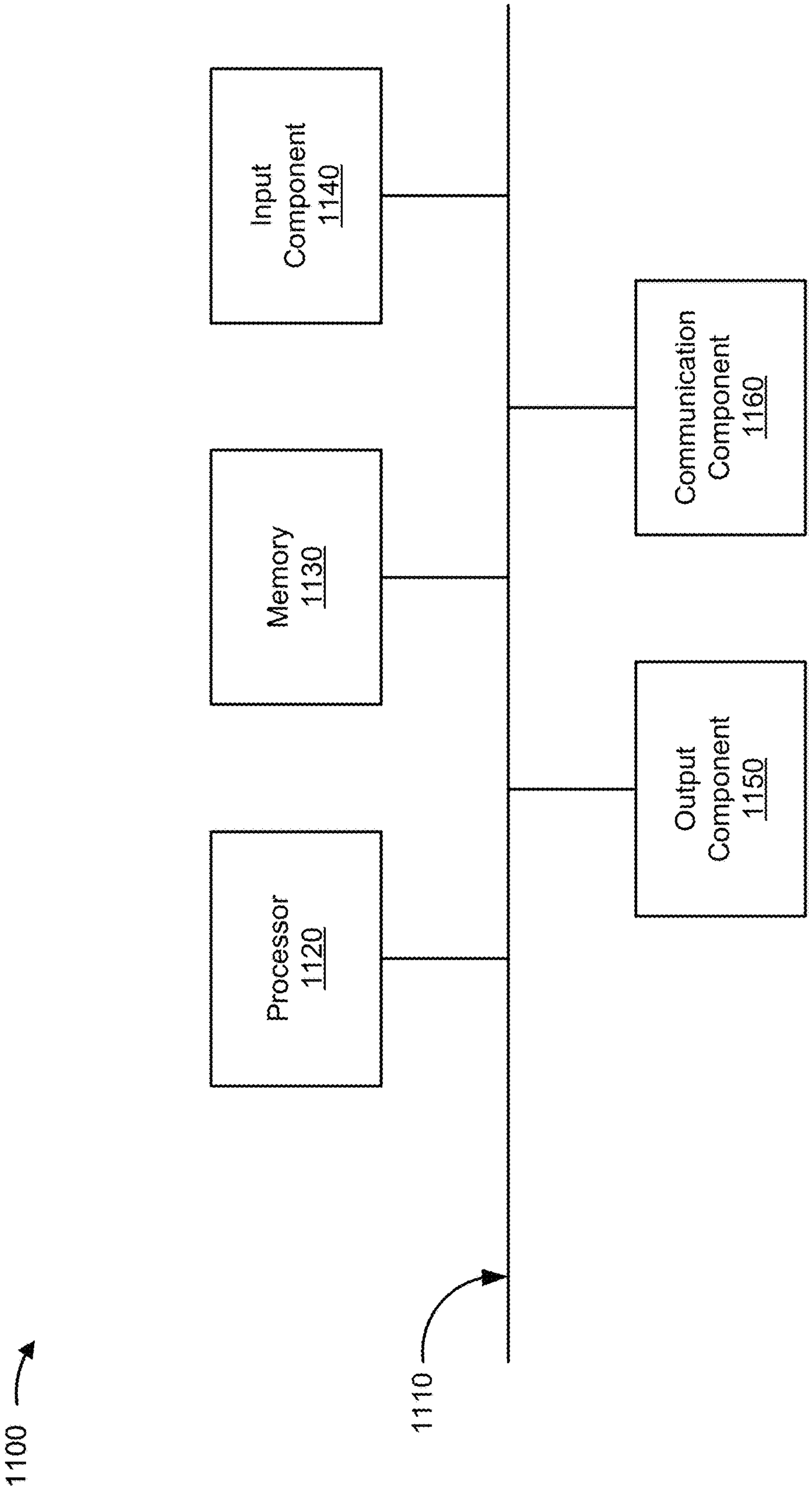
FIG. 11 is a diagram of example components of a device described herein.

FIG. 11 is a diagram of example components of a device 1100 described herein. In some implementations, one or more of the semiconductor processing tools 102-114 and/or the wafer/die transport tool 116 may include one or more devices 1100 and/or one or more components of the device 1100. As shown in FIG. 11, the device 1100 may include a bus 1110, a processor 1120, a memory 1130, an input component 1140, an output component 1150, and/or a communication component 1160.

The bus 1110 may include one or more components that enable wired and/or wireless communication among the components of the device 1100. The bus 1110 may couple together two or more components of FIG. 11, such as via operative coupling, communicative coupling, electronic coupling, and/or electric coupling. For example, the bus 1110 may include an electrical connection (e.g., a wire, a trace, and/or a lead) and/or a wireless bus. The processor 1120 may include a central processing unit, a graphics processing unit, a microprocessor, a controller, a microcontroller, a digital signal processor, a field-programmable gate array, an application-specific integrated circuit, and/or another type of processing component. The processor 1120 may be implemented in hardware, firmware, or a combination of hardware and software. In some implementations, the processor 1120 may include one or more processors capable of being programmed to perform one or more operations or processes described elsewhere herein.

The memory 1130 may include volatile and/or nonvolatile memory. For example, the memory 1130 may include random access memory (RAM), read only memory (ROM), a hard disk drive, and/or another type of memory (e.g., a flash memory, a magnetic memory, and/or an optical memory). The memory 1130 may include internal memory (e.g., RAM, ROM, or a hard disk drive) and/or removable memory (e.g., removable via a universal serial bus connection). The memory 1130 may be a non-transitory computer-readable medium. The memory 1130 may store information, one or more instructions, and/or software (e.g., one or more software applications) related to the operation of the device 1100. In some implementations, the memory 1130 may include one or more memories that are coupled (e.g., communicatively coupled) to one or more processors (e.g., processor 1120), such as via the bus 1110. Communicative coupling between a processor 1120 and a memory 1130 may enable the processor 1120 to read and/or process information stored in the memory 1130 and/or to store information in the memory 1130.

The input component 1140 may enable the device 1100 to receive input, such as user input and/or sensed input. For example, the input component 1140 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 1150 may enable the device 1100 to provide output, such as via a display, a speaker, and/or a light-emitting diode. The communication component 1160 may enable the device 1100 to communicate with other devices via a wired connection and/or a wireless connection. For example, the communication component 1160 may include a receiver, a transmitter, a transceiver, a modem, a network interface card, and/or an antenna.

The device 1100 may perform one or more operations or processes described herein. For example, a non-transitory computer-readable medium (e.g., memory 1130) may store a set of instructions (e.g., one or more instructions or code) for execution by the processor 1120. The processor 1120 may execute the set of instructions to perform one or more operations or processes described herein. In some implementations, execution of the set of instructions, by one or more processors 1120, causes the one or more processors 1120 and/or the device 1100 to perform one or more operations or processes described herein. In some implementations, hardwired circuitry may be used instead of or in combination with the instructions to perform one or more operations or processes described herein. Additionally, or alternatively, the processor 1120 may be configured to perform one or more operations or processes described herein. Thus, implementations described herein are not limited to any specific combination of hardware circuitry and software.

The number and arrangement of components shown in FIG. 11 are provided as an example. The device 1100 may include additional components, fewer components, different components, or differently arranged components than those shown in FIG. 11. Additionally, or alternatively, a set of components (e.g., one or more components) of the device 1100 may perform one or more functions described as being performed by another set of components of the device 1100.

Figure 12:
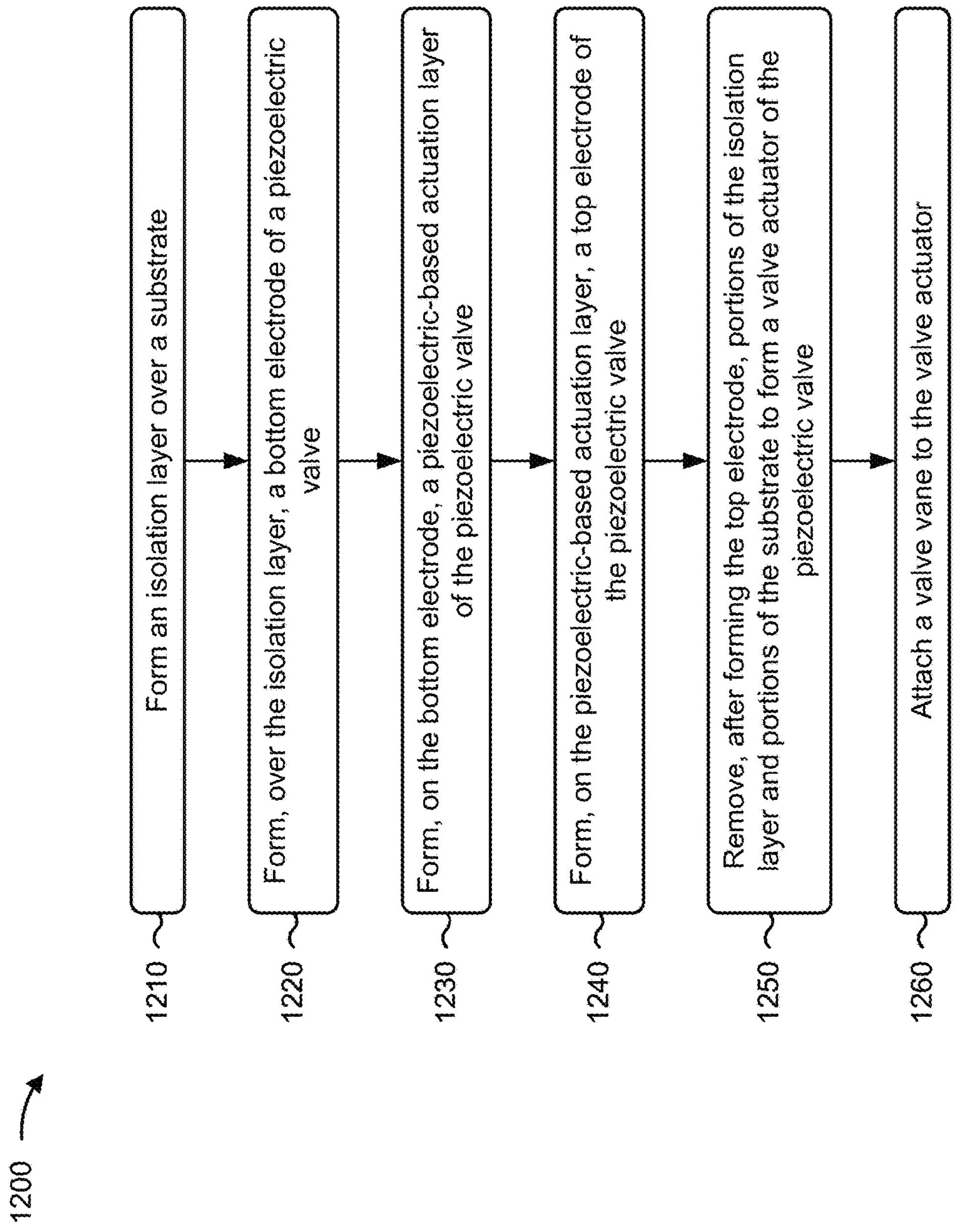
FIG. 12 is a flowchart of an example process associated with forming a piezoelectric valve.

FIG. 12 is a flowchart of an example process 1200 associated with forming a piezoelectric valve. In some implementations, one or more process blocks of FIG. 12 are performed using one or more semiconductor processing tools (e.g., one or more of the semiconductor processing tools 102-114). Additionally, or alternatively, one or more process blocks of FIG. 12 may be performed using one or more components of device 1100, such as processor 1120, memory 1130, input component 1140, output component 1150, and/or communication component 1160.

As shown in FIG. 12, process 1200 may include forming an isolation layer over a substrate (block 1210). For example, one or more of the semiconductor processing tools 102-114 may be used to form an isolation layer 228 over a substrate (e.g., a substrate 218, an SOI wafer 402), as described herein.

As further shown in FIG. 12, process 1200 may include forming, over the isolation layer, a bottom electrode of a piezoelectric valve (block 1220). For example, one or more of the semiconductor processing tools 102-114 may be used to form, over the isolation layer 228, a bottom electrode 232 of a piezoelectric valve (e.g., the piezoelectric valve 200, the piezoelectric valve 800), as described herein.

As further shown in FIG. 12, process 1200 may include forming, on the bottom electrode, a piezoelectric-based actuation layer of the piezoelectric valve (block 1230). For example, one or more of the semiconductor processing tools 102-114 may be used to form, on the bottom electrode 232, a piezoelectric-based actuation layer 236 of the piezoelectric valve, as described herein.

As further shown in FIG. 12, process 1200 may include forming, on the piezoelectric-based actuation layer, a top electrode of the piezoelectric valve (block 1240). For example, one or more of the semiconductor processing tools 102-114 may be used to form, on the piezoelectric-based actuation layer 236, a top electrode 234 of the piezoelectric valve, as described herein.

As further shown in FIG. 12, process 1200 may include removing, after forming the top electrode, portions of the isolation layer and portions of the substrate to form a valve actuator of the piezoelectric valve (block 1250). For example, one or more of the semiconductor processing tools 102-114 may be used to remove, after forming the top electrode 234, portions of the isolation layer 228 and portions of the substrate to form a valve actuator 206 of the piezoelectric valve, as described herein.

As further shown in FIG. 12, process 1200 may include attaching a valve vane to the valve actuator (block 1260). For example, one or more of the semiconductor processing tools 102-114 may be used to attach a valve vane 204 to the valve actuator 206, as described herein.

Process 1200 may include additional implementations, such as any single implementation or any combination of implementations described below and/or in connection with one or more other processes described elsewhere herein.

In a first implementation, a CTE mismatch between the piezoelectric-based actuation layer 236 and the bottom electrode 232 and the top electrode 234 results in bending of the valve actuator 206 after removal of the portions of the isolation layer 228 and the portions of the substrate to form the valve actuator 206.

In a second implementation, alone or in combination with the first implementation, the bending of the valve actuator 206 biases the valve vane 204 against a valve body 202 of the piezoelectric valve.

In a third implementation, alone or in combination with one or more of the first and second implementations, attaching the valve vane 204 to the valve actuator 206 includes bonding standoff pads 214 of the valve vane 204 with bonding pads 212 on the valve actuator 206.

In a fourth implementation, alone or in combination with one or more of the first through third implementations, process 1200 includes forming bonding layers 216 on the standoff pads 214, where bonding the standoff pads 214 of the valve vane 204 with the bonding pads 212 on the valve actuator 206 includes bonding the standoff pads 214 of the valve vane 204 with the bonding pads 212 on the valve actuator 206 using the bonding layers 216.

In a fifth implementation, alone or in combination with one or more of the first through fourth implementations, process 1200 includes attaching the valve vane 204 to another valve actuator 206*b* of the piezoelectric valve.

In a sixth implementation, alone or in combination with one or more of the first through fifth implementations, process 1200 includes removing, after attaching the valve vane 204 to the valve body 202, portions of a backside of the substrate to form a valve cavity (e.g., a backside cavity 220) of the piezoelectric valve.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

FIGS. 13A-13J illustrate an example implementation 1300 of forming the piezoelectric valve 800 described herein. In some implementations, one or more of the semiconductor processing operations described in connection with FIGS. 13A-13J are performed using one or more of the semiconductor devices 102-114. In some implementations, one or more of the semiconductor processing operations described in connection with FIGS. 13A-13J are performed by another semiconductor processing tool.

Figure 13A:
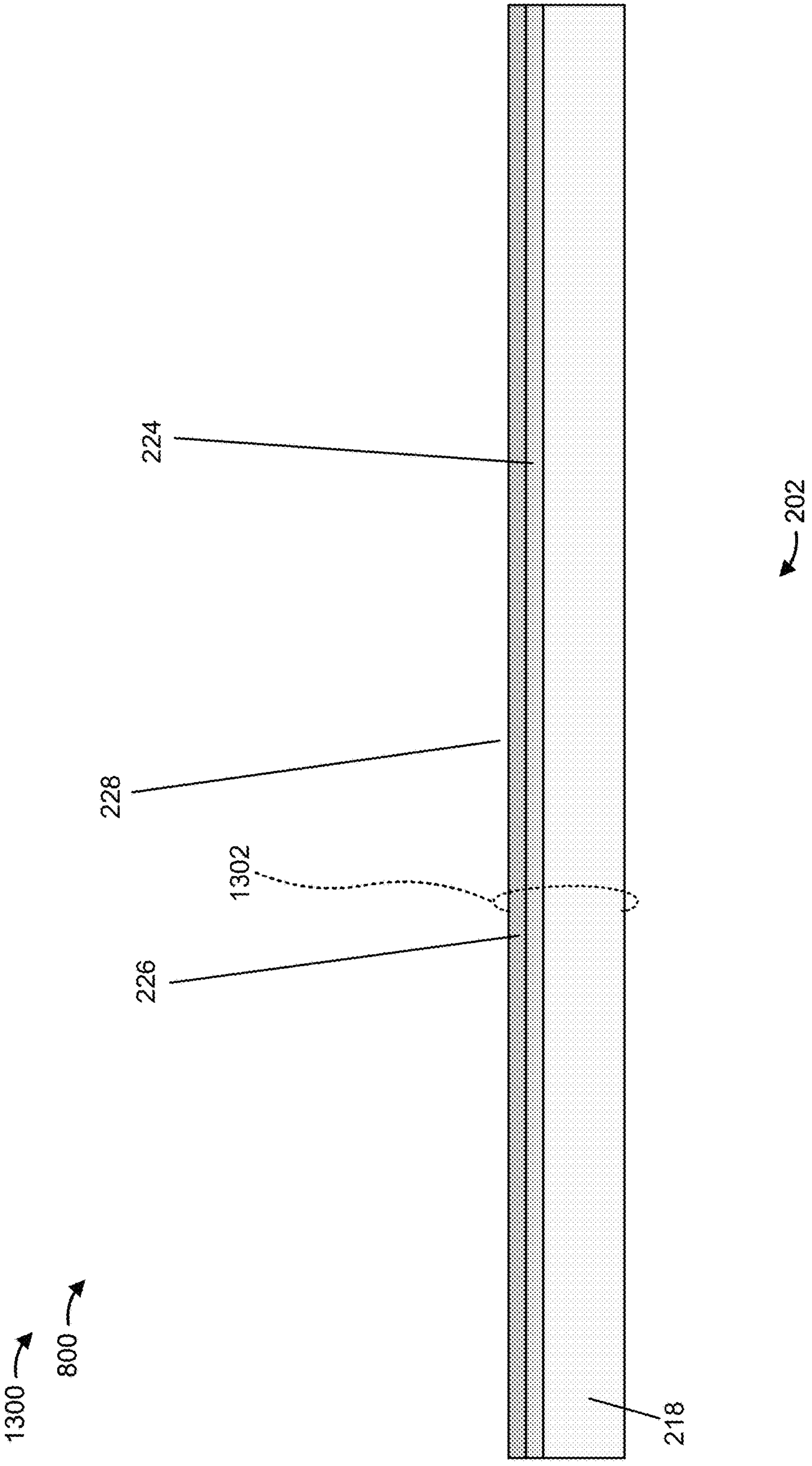
FIGS. 13A-13J illustrate an example implementation of forming a piezoelectric valve described herein.

Turning to FIG. 13A, an SOI wafer 1302 may be provided. The SOI wafer 1302 may include the substrate 218, the buried oxide layer 224, and the semiconductor layer 226.

Figure 13B:
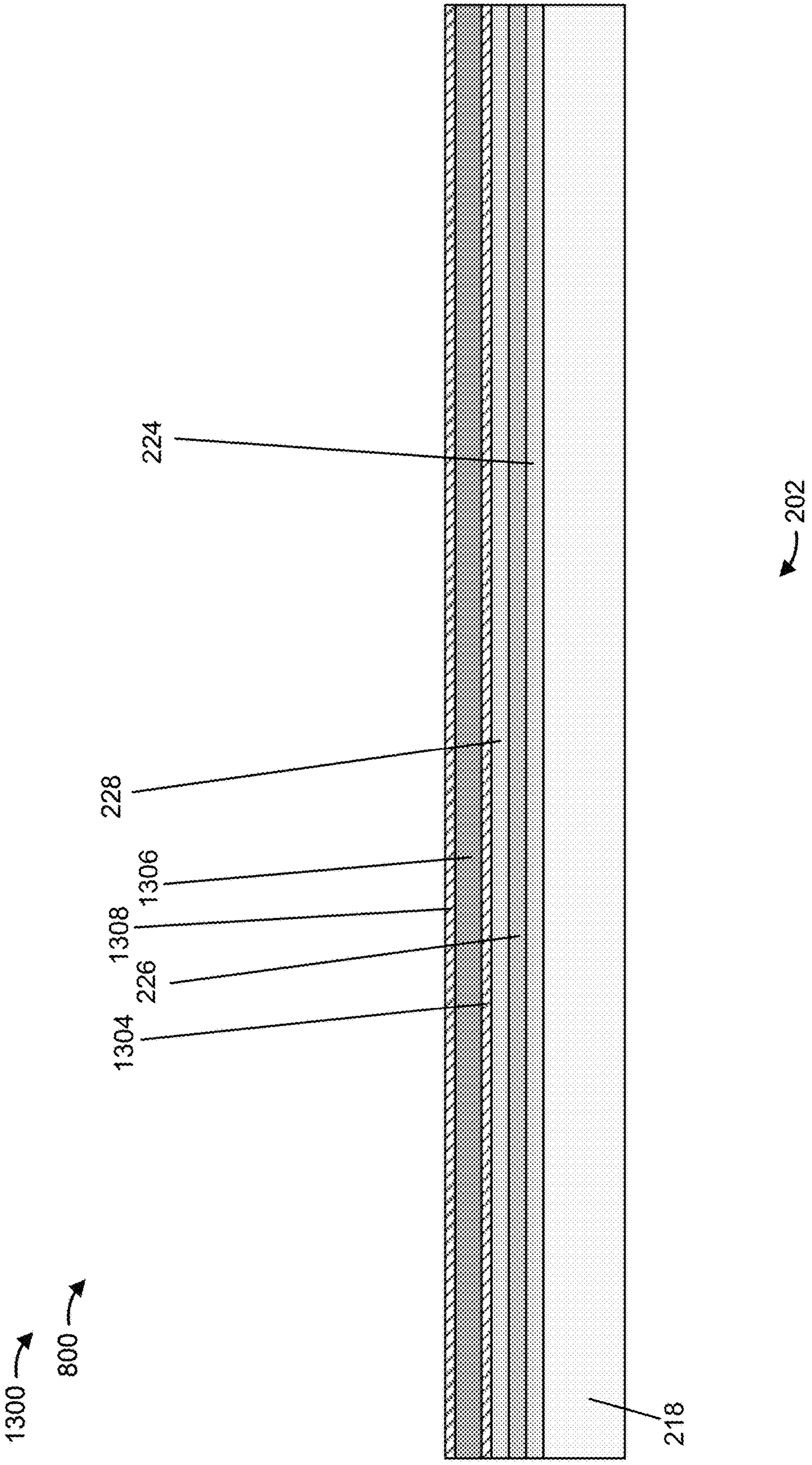

As shown in FIG. 13B, one or more layers may be formed over and/or on the SOI wafer 1302. For example, the isolation layer 228 may be formed over and/or on the semiconductor layer 226 of the SOI wafer 1302. As another example, a conductive layer 1304 may be formed over and/or on the isolation layer 228. As another example, a piezoelectric layer 1306 may be formed over and/or on the conductive layer 1304. As another example, a conductive layer 1308 may be formed over and/or on the piezoelectric layer 1306.

Figure 13C:
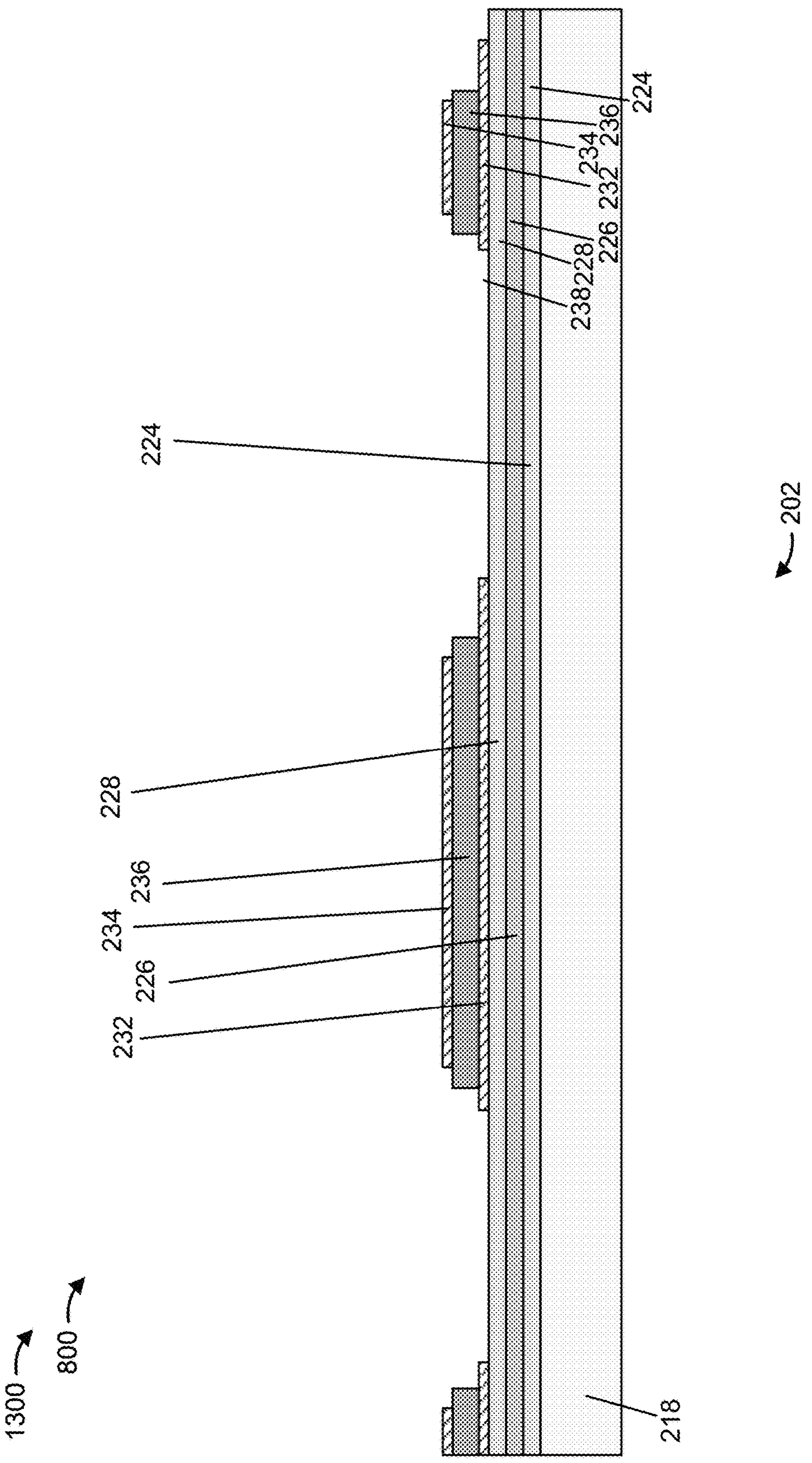

As shown in FIG. 13C, the conductive layer 1304, the piezoelectric layer 1306, and the conductive layer 1308 may be etched to form the bottom electrodes 232, the top electrodes 234, and the piezoelectric-based actuation layers 236.

Figure 13D:
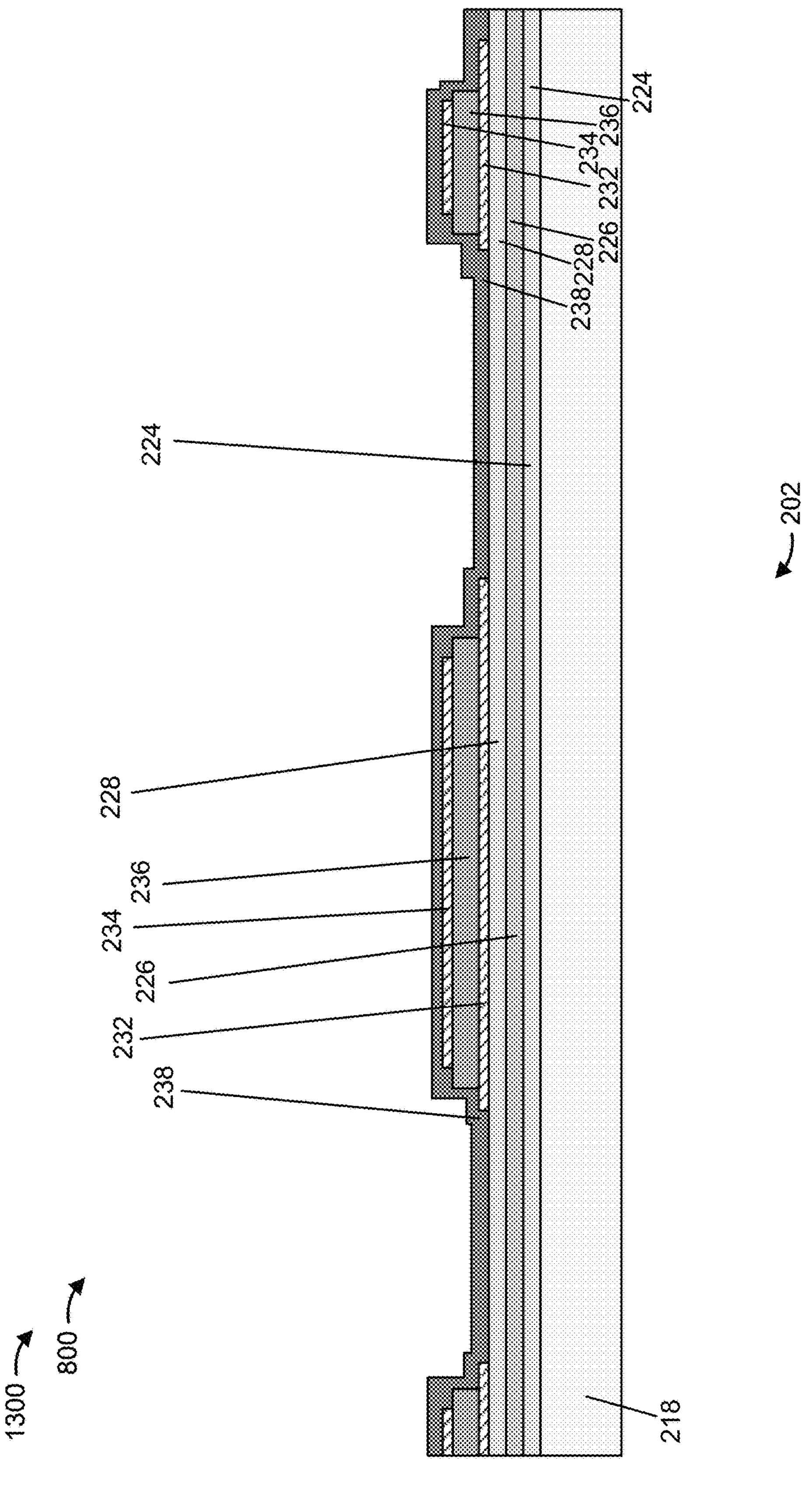

As shown in FIG. 13D, the IMD layer 238 may be formed on the valve body 202. For example, the IMD layer 238 may be deposited on portions of the isolation layer 228, portions of the bottom electrodes 232, portions of the top electrodes 234, and/or portions of the piezoelectric-based actuation layers 236.

Figure 13E:
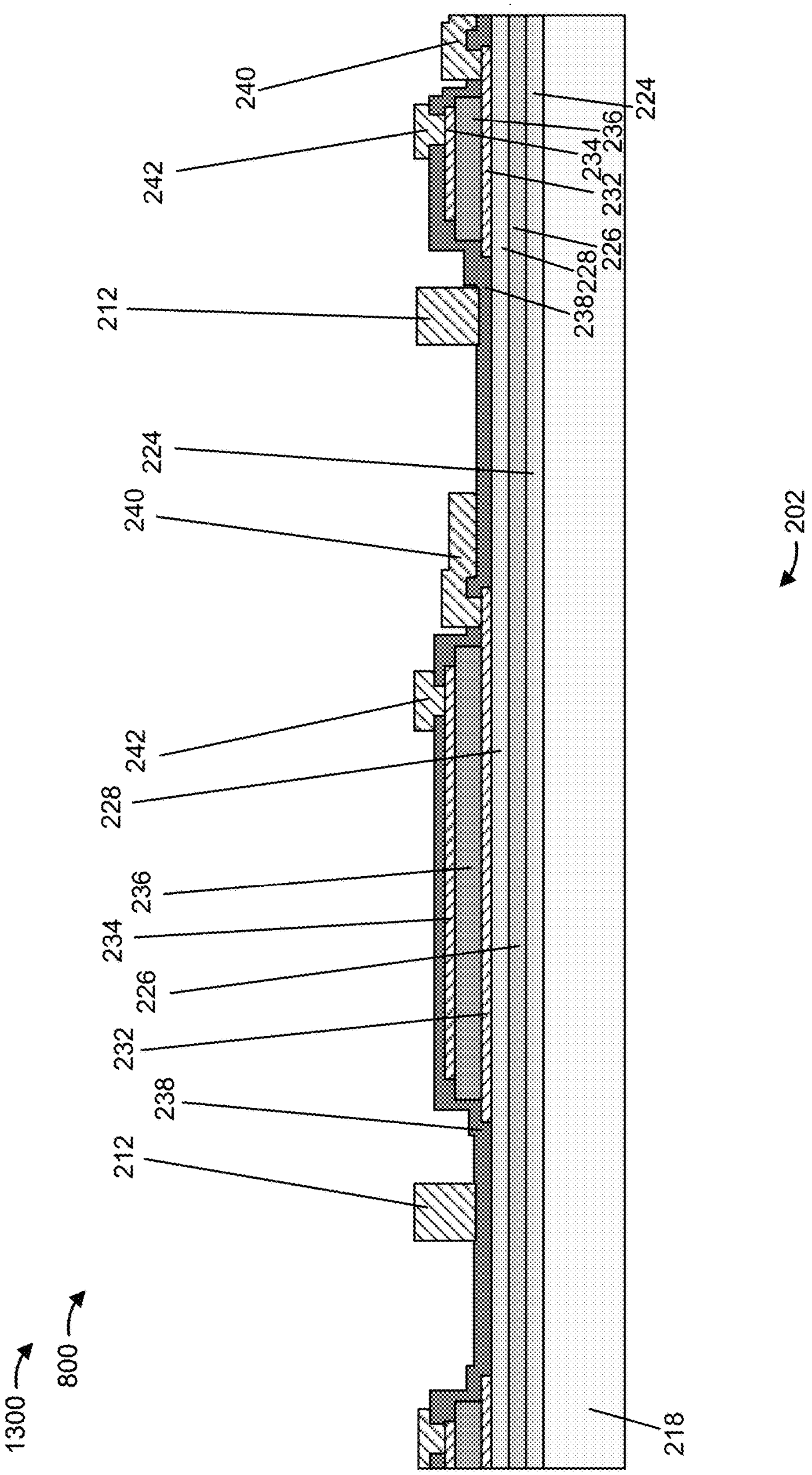

As shown in FIG. 13E, the bonding pads 212, the bottom contact structures 240, and the top contact structures 242 may be formed on the valve body 202. For example, the bonding pads may be formed on the IMD layer 238. As another example, a bottom contact structure 240 may be formed on a bottom electrode 232 (e.g., such that the bottom electrode 232 and the bottom contact structure 240 are physically coupled and/or electrically coupled) and on the IMD layer 238. As another example, a top contact structure 242 may be formed on a top electrode 234 (e.g., such that the top electrode 234 and the top contact structure 242 are physically coupled and/or electrically coupled) and on the IMD layer 238.

Figure 13F:
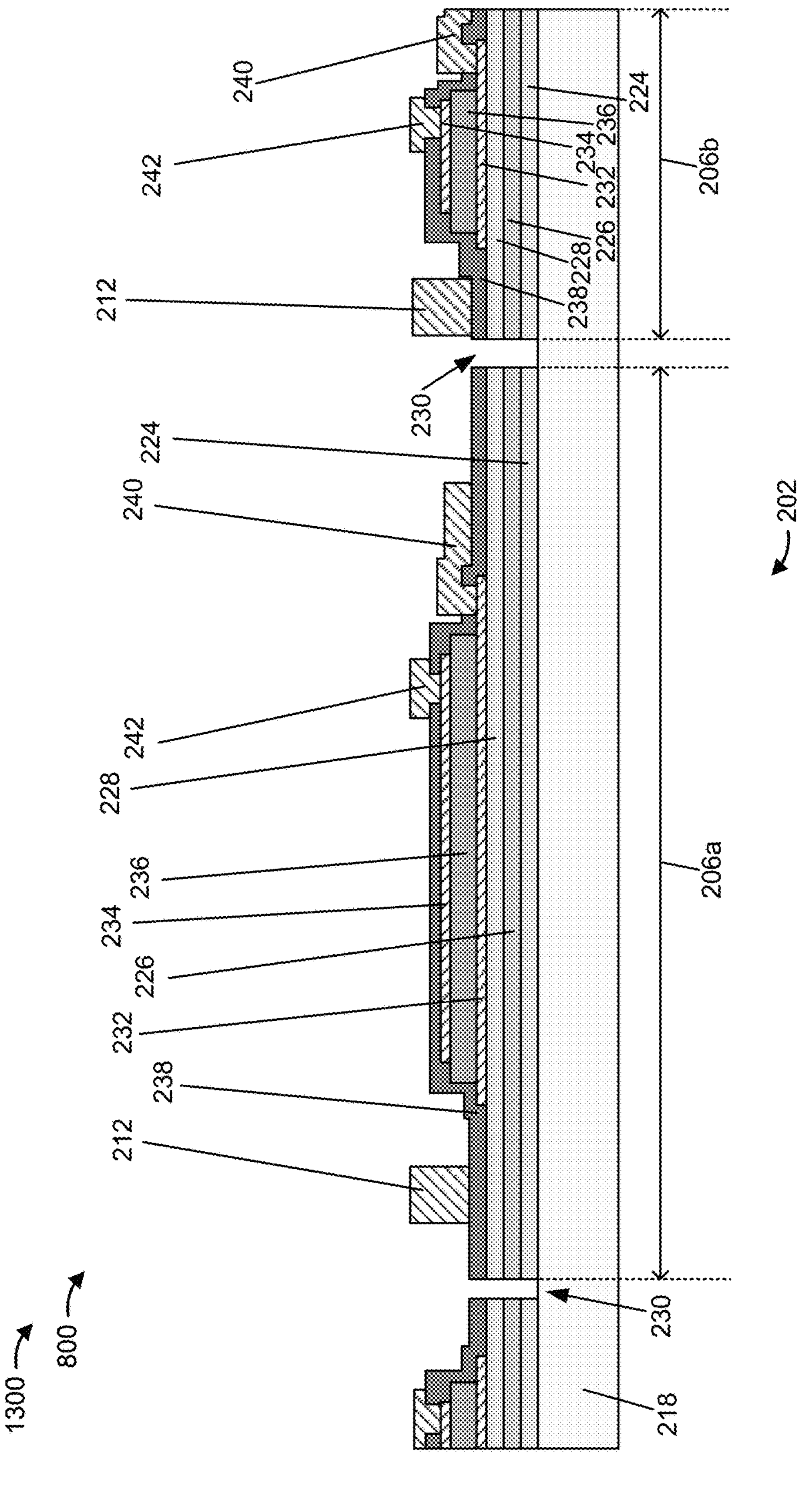

As shown in FIG. 13F, portions of the IMD layer 238, portions of the isolation layer 228, portions of the semiconductor layer 226, and/or portions of the buried oxide layer 224 may be removed to define the valve actuators 206*a* and 206*b* of the valve body 202.

Figure 13G:
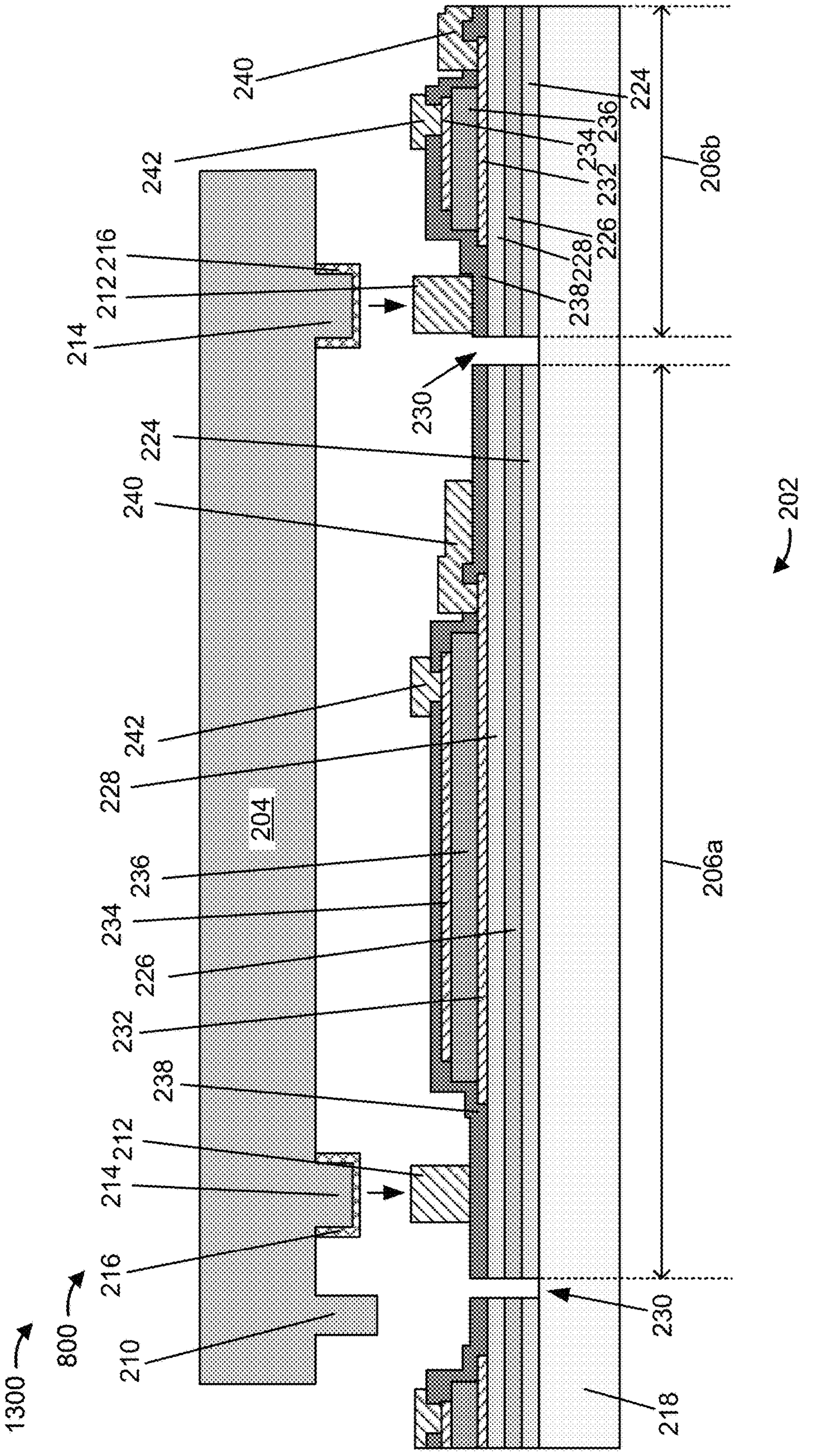
Figure 13H:
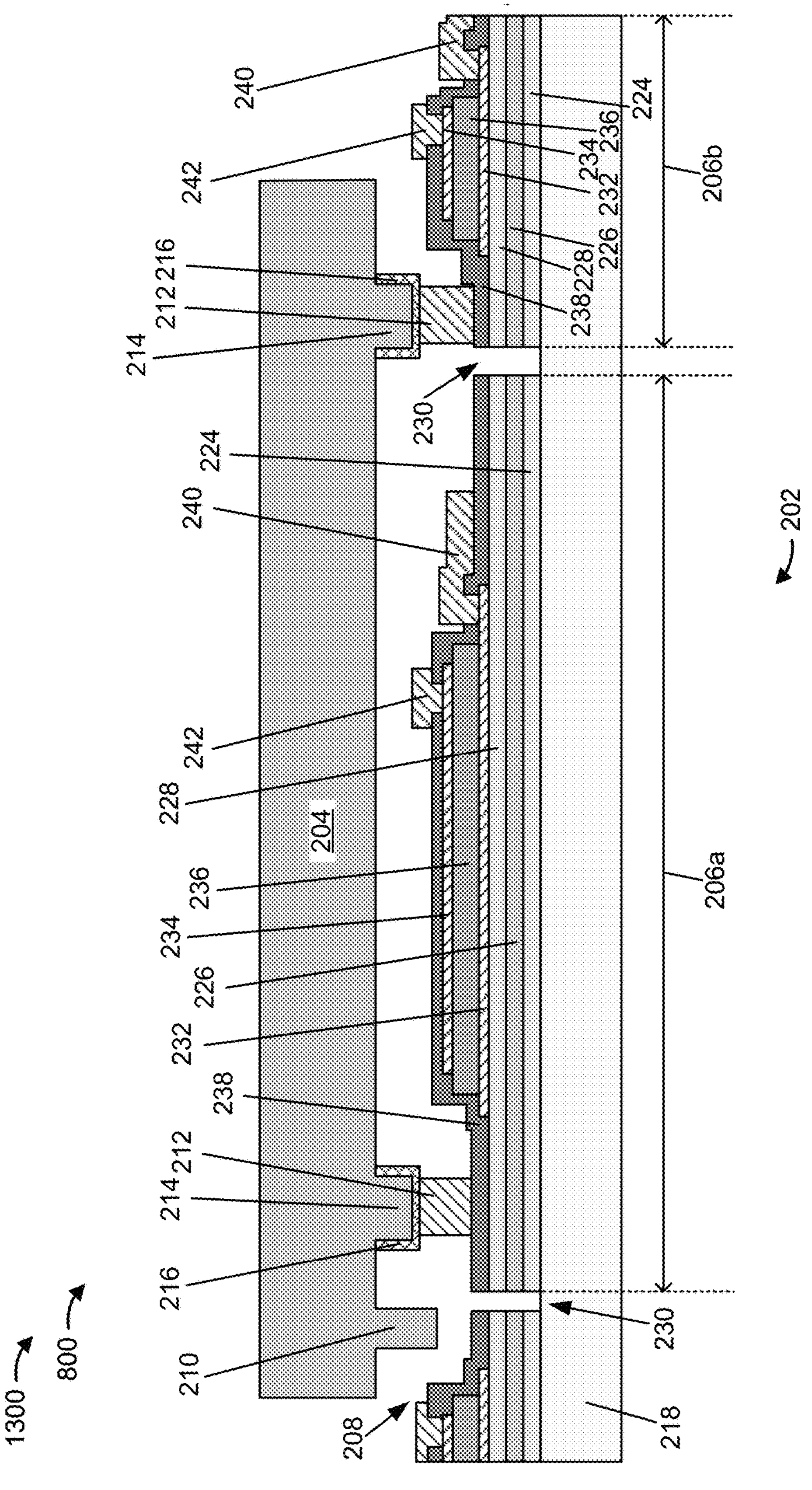

As shown in FIGS. 13G and 13H, the valve vane 204 may be attached to the valve body 202. The valve vane 204 may be formed using processing techniques described in connection with FIGS. 5A-5D. The valve vane 204 may be bonded to the valve body 202. The valve vane 204 and the valve body 202 may be bonded at the bonding pads 212 on the valve body 202 and at the standoff pads 214 on the valve vane 204. The bonding layer 216 on the standoff pads 214 may facilitate and/or promote bonding of the bonding pads 212 and the standoff pads 214.

Figure 13I:
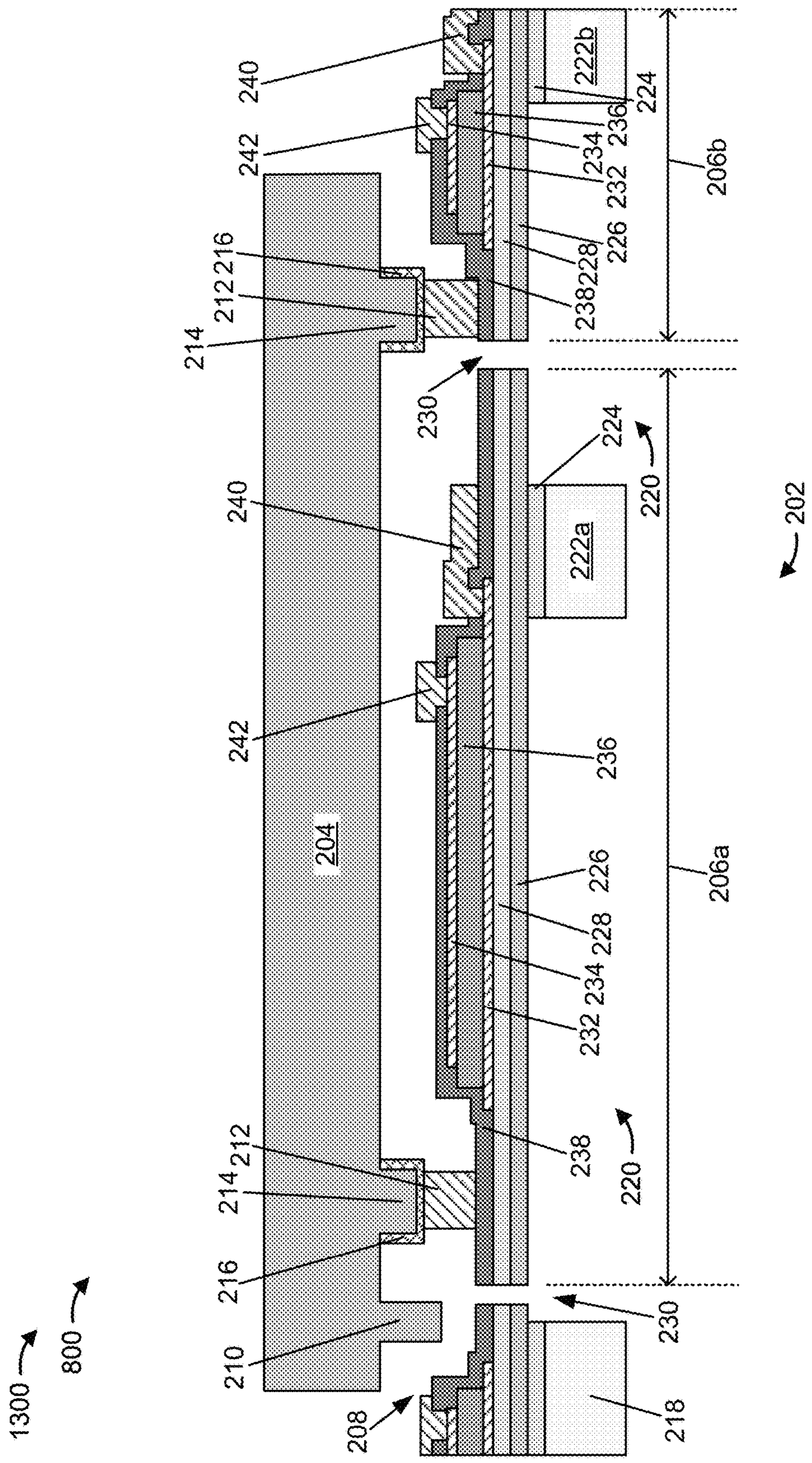

As shown in FIG. 13I, portions of the substrate 218 and the buried oxide layer 226 may be removed to form the backside cavities 220 and the fulcrum structures 222*a* and 222*b* in the substrate 218. The portions of the substrate 218 and the portions of the buried oxide layer 226 may be removed from the backside of the substrate 218, which releases the valve actuators 206_a_ and 206_b_ from the substrate 218. Prior to removing the portions of the substrate 218 and the portions of the buried oxide layer 226, a wafer grinding operation may be performed to thin the substrate 218 (e.g., to reduce the thickness of the substrate 218). The substrate 218 may be thinned to reduce the processing time and/or etchant consumption of the etch operation to remove the portions of the substrate 218. A planarization tool 110 (e.g., a grinding tool) may perform a wafer grinding operation to mechanically grind silicon material away from the substrate 218.

Figure 13J:
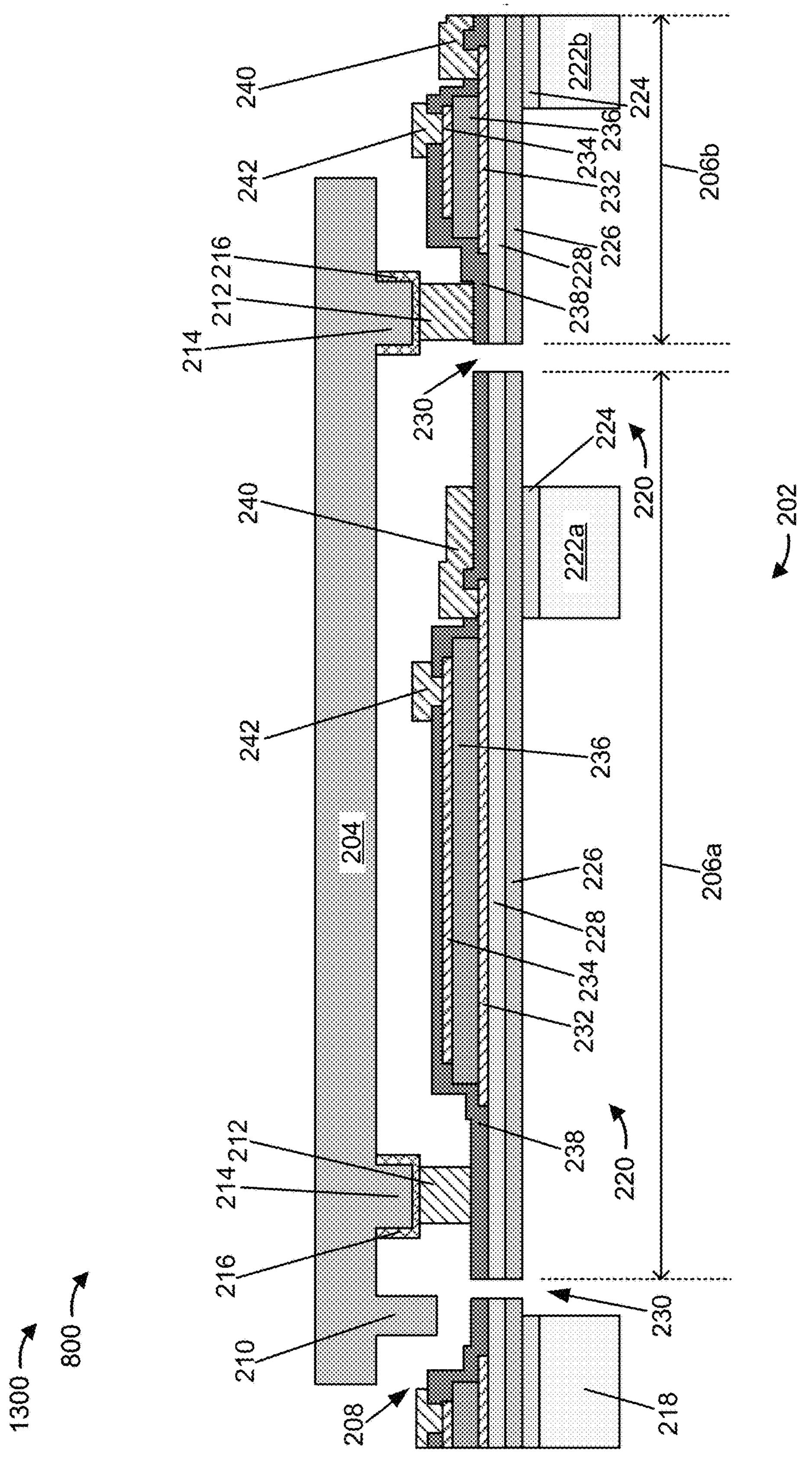

As shown in FIG. 13J, a wafer grinding operation may be performed to thin the valve vane 204 (e.g., to reduce the thickness of the valve vane 204). The valve vane 204 may be thinned such that the overall height of the piezoelectric valve 800 satisfies a height threshold. The piezoelectric valve 800 may be diced (e.g., from the SOI wafer 1302) and packaged.

As indicated above, FIGS. 13A-13J are provided as examples. Other examples may differ from what is described with regard to FIGS. 13A-13J.

In this way, a piezoelectric valve may be formed using semiconductor processing techniques such that the piezoelectric valve is biased in a normally closed configuration. Actuation of the piezoelectric valve may be achieved through the use of a piezoelectric-based actuation layer of the piezoelectric valve. The piezoelectric valve may be implemented in various use cases, such as a dispensing valve for precise drug delivery, a relief valve to reduce the occlusion effect in speaker-based devices (e.g., in-ear headphones), a pressure control valve, and/or another type of valve that is configured for microfluidic control, among other examples. The normally closed configuration of the piezoelectric valve enables the piezoelectric valve to operate as a normally closed valve with reduced power consumption.

As described in greater detail above, some implementations described herein provide a piezoelectric valve. The piezoelectric valve includes a valve body that includes a fulcrum structure. The piezoelectric valve includes a valve vane coupled with the valve body at a first standoff pad and at a second standoff pad of the valve vane. The first standoff pad and the second standoff pad are located on opposing sides of a fulcrum structure of the valve body. A compressive film stress in one or more layers of the valve body biases the valve vane against the valve body in a normally closed configuration.

As described in greater detail above, some implementations described herein provide a method. The method includes forming an isolation layer over a substrate. The method includes forming, over the isolation layer, a bottom electrode of a piezoelectric valve. The method includes forming, on the bottom electrode, a piezoelectric-based actuation layer of the piezoelectric valve. The method includes forming, on the piezoelectric-based actuation layer, a top electrode of the piezoelectric valve. The method includes removing, after forming the top electrode, portions of the isolation layer and portions of the substrate to form a valve actuator of the piezoelectric valve. The method includes attaching a valve vane to the valve actuator.

As described in greater detail above, some implementations described herein provide a piezoelectric valve. The piezoelectric valve includes a valve vane. The piezoelectric valve includes a valve body, comprising a first valve actuator coupled with the valve body at a first end of the valve body, and a second valve actuator coupled with the valve body at a second end of the valve body opposing the first end, where compressive film stresses in one or more first layers of the first valve actuator, and compressive film stresses in one or more second layers of the second valve actuator, bias the valve vane against the valve body.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- forming an isolation layer over a substrate;
- forming, over the isolation layer, a bottom electrode of a piezoelectric valve;
- forming, on the bottom electrode, a piezoelectric-based actuation layer of the piezoelectric valve;
- forming, on the piezoelectric-based actuation layer, a top electrode of the piezoelectric valve;
- forming an intermetal dielectric (IMD) layer to be in contact with the top electrode and at least one of the isolation layer, the bottom electrode, or the piezoelectric-based actuation layer;
- removing, after forming the IMD layer, portions of the isolation layer and portions of the substrate to form a valve actuator of the piezoelectric valve; and
- attaching a valve vane to the valve actuator.

2. The method of claim 1, wherein a coefficient of thermal expansion (CTE) mismatch between the piezoelectric-based actuation layer and the bottom electrode and the top electrode results in bending of the valve actuator after removal of the portions of the isolation layer and the portions of the substrate to form the valve actuator.

3. The method of claim 2, wherein the bending of the valve actuator biases the valve vane being against a valve body of the piezoelectric valve.

4. The method of claim 1, wherein attaching the valve vane to the valve actuator comprises:
- bonding standoff pads of the valve vane with bonding pads on the valve actuator.

5. The method of claim 4, further comprising:
- forming bonding pads on the standoff pads,
- wherein bonding the standoff pads of the valve vane with the bonding pads on the valve actuator comprises:
  - bonding the standoff pads of the valve vane with the bonding pads on the valve actuator using the bonding pads.

6. The method of claim 1, further comprising:
- attaching the valve vane to another valve actuator of the piezoelectric valve.

7. The method of claim 6, further comprising:
- removing, after attaching the valve vane, portions of a backside of the substrate to form a valve cavity of the piezoelectric valve.

8. A method, comprising:
forming an isolation layer over a substrate;
forming, over the isolation layer, a bottom electrode of a piezoelectric valve;
forming, on the bottom electrode, a piezoelectric-based actuation layer of the piezoelectric valve;
forming, on the piezoelectric-based actuation layer, a top electrode of the piezoelectric valve;
forming an intermetal dielectric (IMD) layer to be in contact with the top electrode and at least one of the isolation layer, the bottom electrode, or the piezoelectric-based actuation layer;
removing, after forming the IMD layer, portions of the isolation layer and portions of the substrate to form a valve actuator of the piezoelectric valve; and
attaching, after forming the IMD layer, a valve vane to the valve actuator.

9. The method of claim 8, further comprising:
forming a semiconductor layer over the substrate,
wherein the isolation layer is further formed over the semiconductor layer.

10. The method of claim 8, further comprising:
forming, in the substrate, at least one of a fulcrum structure or an oxide layer.

11. The method of claim 10, wherein the fulcrum structure and the oxide layer are formed in the substrate.

12. The method of claim 10, wherein the oxide layer resides above the fulcrum structure, and wherein a top surface of the oxide layer is coplanar with a top surface of the substrate.

13. The method of claim 8, further comprising:
forming a contact structure to be in contact with the IMD layer and the top electrode.

14. The method of claim 8, further comprising:
forming a contact structure to be in contact with the IMD layer and the bottom electrode.

15. The method of claim 8, further comprises:
forming slits through the isolation layer and around the top electrode, the bottom electrode, and the piezoelectric-based actuation layer,
wherein the valve vane is attached to the piezoelectric valve between the slits and each of the top electrode, the bottom electrode, and the piezoelectric-based actuation layer.

16. The method of claim 8, wherein attaching the valve vane comprises:
attaching standoff pads, of the valve vane, to the valve actuator.

* * * * *